(12) United States Patent
Chen et al.

(10) Patent No.: US 7,666,526 B2
(45) Date of Patent: Feb. 23, 2010

(54) NON-VOLATILE RESISTANCE-SWITCHING OXIDE THIN FILM DEVICES

(75) Inventors: I-Wei Chen, Swarthmore, PA (US); Yudi Wang, Drexel Hill, PA (US); Soo Gil Kim, Drexel Hill, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 469 days.

(21) Appl. No.: 11/740,309

(22) Filed: Apr. 26, 2007

(65) Prior Publication Data

US 2007/0269683 A1 Nov. 22, 2007

Related U.S. Application Data

(63) Continuation-in-part of application No. 11/291,945, filed on Nov. 30, 2005.

(51) Int. Cl.
*B32B 9/00* (2006.01)
*C01F 7/00* (2006.01)
*C01G 25/02* (2006.01)
*C04B 35/00* (2006.01)

(52) U.S. Cl. .................. 428/697; 428/689; 428/699; 428/701; 428/702; 423/594.1; 423/594.12; 423/594.3; 423/600; 501/102; 501/134

(58) Field of Classification Search ............. 428/689, 428/698, 699, 701, 702; 423/594.1, 594.12, 423/594.3, 600; 501/102, 134
See application file for complete search history.

(56) References Cited

U.S. PATENT DOCUMENTS

| | | | |
|---|---|---|---|
| 3,810,001 A | 5/1974 | Ernst | |
| 3,886,577 A | 5/1975 | Buckley | |
| 4,151,123 A * | 4/1979 | McCann, III | ............ 502/303 |
| 4,173,722 A | 11/1979 | Detering | |
| 4,630,188 A | 12/1986 | Daggett | |
| 4,695,798 A | 9/1987 | Brandes | |
| 4,701,708 A | 10/1987 | Hardy et al. | |
| 4,766,380 A | 8/1988 | Den Boef et al. | |
| 4,780,673 A | 10/1988 | Hill | |
| 4,789,831 A | 12/1988 | Mayo, Jr. | |
| 4,876,507 A | 10/1989 | Van Vaals | |
| 5,153,515 A | 10/1992 | Leigh et al. | |
| 5,298,235 A * | 3/1994 | Worrell et al. | ............ 429/33 |
| 5,696,392 A * | 12/1997 | Char et al. | ............ 257/190 |
| 5,986,301 A | 11/1999 | Fukushima et al. | |
| 6,473,332 B1 | 10/2002 | Ignatiev et al. | |
| 6,717,199 B2 | 4/2004 | Laibowitz et al. | |

(Continued)

OTHER PUBLICATIONS

Seo, S. et al., "Reproducible resistance switching in polycrystalline NiO films," Applied Physics Letters 85 (23), 5655-5657 (2004).

(Continued)

*Primary Examiner*—Gwendolyn Blackwell
(74) *Attorney, Agent, or Firm*—Woodcock Washburn, LLP

(57) ABSTRACT

Non-volatile resistance-switching oxide films, and devices therewith, are disclosed. One embodiment of a suitable device is composed of a SRO-CZO thin film having a thickness of from about 6 to about 30 nm, and composed of from about 3 to about 10 molar % of a $SrRuO_3$ conducting oxide dopant and from about 90 to about 97 molar % of a $CaZrO_3$ insulating oxide material.

27 Claims, 48 Drawing Sheets

U.S. PATENT DOCUMENTS

| | | | |
|---|---|---|---|
| 6,762,481 | B2 | 7/2004 | Liu et al. |
| 7,071,008 | B2 | 7/2006 | Rinerson et al. |
| 2005/0151156 | A1 | 7/2005 | Wu et al. |
| 2006/0288928 | A1* | 12/2006 | Eom et al. ............... 117/89 |

OTHER PUBLICATIONS

Shinnar, M., et al., "The application of spinors to pulse synthesis and analysis," J. of Magnetic Resonance in Medicine, 1989, 12, 93-98.

Shinnar, M., et al., "The synthesis of soft pulses with a specific frequency response," J. of Magnetic Resonance in Medicine, 1989, 12, 88-92.

*CRC Handbook of Chemistry and Physics.*, 83$^{rd}$ Ed., Lide, D.R. (Ed.), CRC Press, 2002, 12-130.

Watanabe, Y., et al., "Current-driven insulator-conductor transition and nonvolatile memory in chromium-doped SrTiO3 single crystals," Applied Physics Letts., 2001, 78(23), 3738-3740.

Schmehl, A., et al., "Transport properties of LaTiO$_{3+x}$ films and heterostructures," Applied Physics Letts., 2003, 82(18), 3077-3079.

Beck, A., et al., "Reproducible switching effect in thin oxide films for memory applications," Applied Physics Letts., 2000, 77(1), 139-141.

Liu, S.Q., et al., "Electric-pulse-induced reversible resistance change effect in magnetoresistive films," Applied Physics Letts., 2000, 76(19), 2749-2751.

Simmons, J.G., et al., "New condition and reversible memory phenomena in thin insulating films," Proc. Roy. Soc. A, London, 1967, 301, 77-102.

J. F. Gibbons and W. E. Beadle, "Switching Properties of Thin Nio Films," Solid-State Electronics 7 (11), 785-797 (1964).

J. C. Bruyere and Chakrave.Bk, "Switching and Negative Resistance in Thin Films of Nickel Oxide," Applied Physics Letters 16 (1), 40-& (1970).

F. Argall, "Switching Phenomena in Titanium Oxide Thin Films," Solid-State Electronics 11 (5), 535-541 (1968).

W. R. Hiatt and T. W. Hickmott, "Bistable Switching in Niobium Oxide Diodes," Applied Physics Letters 6 (6), 106-& (1965).

K. L. Chopra, "Avalanche-Induced Negative Resistance in Thin Oxide Films," Journal of Applied Physics 36 (1), 184-& (1965).

J. Y. Ouyang, C. W. Chu, C. R. Szmanda et al., "Programmable polymer thin film and non-volatile memory device," Nature Materials 3(12), 918-922 (2004).

Y. Yang, J. Ouyang, L. P. Ma et al., "Electrical switching and bistability in organic/polymeric thin films and memory devices," Advanced Functional Materials 16 (8), 1001-1014 (2006).

S. Kubatkin, A. Danilov, M. Hjort et al., "Single-electron transistor of a single organic molecule with access to several redox states," Nature 425 (6959), 698-701 (2003).

A. S. Blum, J. G. Kushmerick, D. P. Long et al., "Molecularly inherent voltage-controlled conductance switching," Nature Materials 4 (2), 167-172 (2005).

S. Karg, G. I. Meijer, D. Widmer et al., "Electrical-stress-induced conductivity increase in SrTiO3 films," Applied Physics Letters 89 (7) (2006).

I.G. Lee Baek, M.S. Seo, S. Lee, M.J. Seo, D.H. Suh, D.-S. Park, J.C. Park, S.O. Kim, H.S. Yoo, I.K. Chung, U.-In. Moon, J.T., "Highly scalable nonvolatile resistive, memory using simple binary oxide driven by asymmetric unipolar voltage pulses," IEDM Tech. Digest (2004).

S. Seo, M. J. Lee, D. H. Seo et al., "Conductivity switching characteristics and reset currents in NiO films," Applied Physics Letters 86 (9) (2005), 093509-1 to 093509-3.

B. J. Choi, D. S. Jeong, S. K. Kim et al., "Resistive switching mechanism of TiO2 thin films grown by atomic-layer deposition," Journal of Applied Physics 98 (3) (2005), 033715-1 to 033715-10.

C. Rossel, G. I. Meijer, D. Bremaud et al., "Electrical current distribution across a metal-insulator-metal structure during bistable switching," Journal of Applied Physics 90 (6), 2892-2898 (2001).

R. Fors, S. I. Khartsev, and A. M. Grishin, "Giant resistance switching in metal-insulator-manganite junctions: Evidence for Mott transition," Physical Review B 71 (4) (2005), 045305-1 to 045305-10.

A. Sawa, T. Fujii, M. Kawasaki et al., "Hysteretic current-voltage characteristics and resistance switching at a rectifying Ti/Pr0.7Ca0.3Mn03 interface," Applied Physics Letters 85 (18), 4073-4075 (2004).

A. Baikalov, Y. Q. Wang, B. Shen et al., "Field-driven hysteretic and reversible resistive switch at the Ag-Pr0.7Ca0.3MnO3 interface," Applied Physics Letters 83 (5), 957-959 (2003).

S. Seo, M. J. Lee, D. H. Seo et al., "Reproducible resistance switching in polycrystalline NiO films," Applied Physics Letters 85 (23), 5655-5657 (2004).

S. H. Kim, I. S. Byun, I. R. Hwang et al., "Electrical properties of ZrO2 and YSZ films deposited by pulsed laser deposition," Journal of the Korean Physical Society 47, S247-S250 (2005).

K. W. Jeong, Y. H. Do, K. S. Yoon et al., "Resistive switching characteristics of unique binary-oxide MgOx Films," Journal of the Korean Physical Society 48 (6), 1501-1504 (2006).

\* cited by examiner

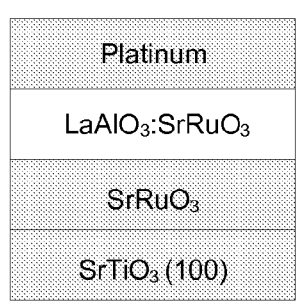
FIG. 1(a)
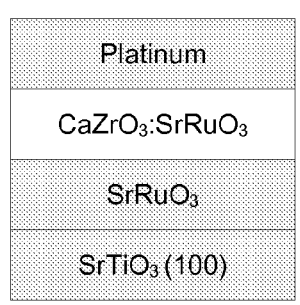
FIG. 1(b)
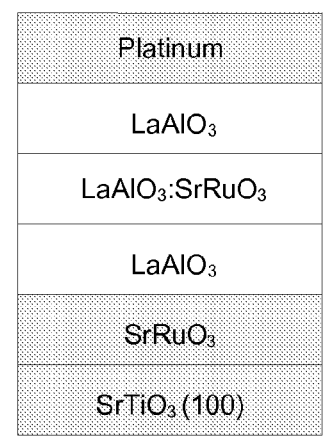
FIG. 1(c)
FIGURE 1

(a) LNO-LAO system    (b) SRO-CZO system

NON-VOLATILE RESISTANCE-SWITCHING OXIDE THIN FILM DEVICES

CROSS-REFERENCE TO RELATED APPLICATIONS

This application is a continuation-in-part of U.S. Ser. No. 11/291,945, "Resistance-Switching Oxide Thin Film Devices", filed on Nov. 30, 2005, the entirety of which is incorporated by reference herein.

STATEMENT OF GOVERNMENT INTERESTS

The invention was made with U.S. Government support. The Government may have certain rights in the invention under National Science Foundation (NSF) Grant Nos. DMR03-03458 and DMR05-20020.

FIELD OF THE INVENTION

The invention generally relates to semiconductor devices, and more particularly to resistance-switching oxide semiconductor devices. The present invention also generally relates to resistance-switching oxide compositions and methods for making same.

BACKGROUND OF THE INVENTION

Materials exhibiting reversible resistance switching are attractive for many of today's semiconductor devices, including non-volatile random-access memory devices. However, previous efforts in the art to reversibly vary electrical performance have exhibited numerous drawbacks. For example, some capacitance-switching semiconductor devices, such as doped Schottky-junction diodes, require relatively large amounts of electrical power (voltage) to switch to, and maintain, a particular capacitance state. Still further, such a device completely loses its capacitance state when the power is withdrawn. Current leakage, and associated heat-build up, are also especially problematic with these switchable semiconductor devices. Thus, high power consumption, current leakage and poor retention characteristics make these devices unsuitable for many practical applications.

Other efforts in the art have taught that several different resistance-switching technologies can be triggered by voltage. This phenomenon has sometimes been called an EPIR (Electrical Pulse Induced Resistance) switching effect. EPIR semiconductor devices are disclosed in U.S. Pat. No. 3,886,577 (Buckley). In the Buckley devices, a sufficiently high voltage (50 V) is applied to a semiconductor thin film in which an approximately 10 micron portion, or filament, of the film may be set to a low resistivity state. Filament size is highly dependant on the amount of current flowing through the device. The device may then be reset to a high resistance state by the action of a second high current pulse (150 mA). However, the set voltage is strongly affected by the number of switching cycles performed. Thus, these devices generally exhibit high power consumption and poor cycle fatigue performance.

Recent efforts in the art have investigated ferroelectric and magnetoresistive materials for non-volatile memory applications. These materials, however, suffer from cycle fatigue and retention problems. Moreover, many magnetoresistive oxide devices require magnetic switching fields and have low operating temperatures.

Some thin film materials in the perovskite family, especially in colossal magnetoresistive (CMR) thin films, have exhibited reversible resistance changes upon application of an electrical stimuli in a magnetic field. It has been recently found that some transition metal oxides in the perovskite family exhibit resistance-switching under a voltage trigger in the absence of a magnetic field. Indeed, the recent observation of the electrical pulse induced resistance (EPIR) change effect in perovskite oxide thin films at room temperature and in the absence of a magnetic field has drawn much attention. See, e.g., "*Electric-Pulse Induced Reversible Resistance Change Effect in Magnetoresistive Films*," S. Q. Liu, N. J. Wu, A. Ignatiev, *Applied Physics Letters, Vol. 76, No. 23* (2000). In these previous efforts, a $Pr_{1-x}Ca_xMnO_3$ (PCMO) oxide film placed between two electrodes served as an EPIR device. The resistance states of such simple structured semiconductor devices were switchable by the application of a voltage trigger. The trigger could directly increase or decrease the resistance of the thin film sample depending on voltage polarity. Such voltage triggering phenomenon can be useful in a variety of device applications, including non-volatile memory devices such as resistance random access memory (RRAM) devices.

These early devices, however, required relatively high voltage triggers and the EPIR effect was found to be cycle dependant. The EPIR effect, measured as the ratio between the resistance states, was found to decrease as the number of triggering events increased. Thus, the high power requirements and lack of resistance state stability plagued these early EPIR compositions and devices. Although the basic mechanism responsible for the EPIR effect is still under investigation, there exists a need in the art to develop improved resistance-switching semiconductor devices for potential application in different technology areas.

Thus, there is a need in the art for resistance-switching semiconductor devices having low power consumption. Still further, there is a need in the art for such semiconductor devices having low voltage leakage and high retention of the respective low and high resistance states. There is also a need in the art for resistance-switching semiconductor devices having improved cycle fatigue performance.

One basic phenomenon of interest concerns a two-terminal device, which has two stable states—one with a lower resistance $R_L$, the other with a higher $R_H$—that can be switched back and forth by applying a voltage pulse or a current pulse. These two states can be used for digital memory; for example, the higher resistance state may be called the "On-state", and the lower resistance state may be called the "Off-state". The voltage used to switch the off-state to the on-state may be called the "Set-voltage", and the one to switch the on-state to the off-state the "Reset-voltage."

In nearly all the cases reported in the past with various oxide thin film configurations, the as-fabricated device has a very high resistance value (even higher than the $R_H$ later used for the on-state.) Previous devices do not show any resistance switching phenomenon until a "forming" process is first performed. The forming process places the device under a high voltage (larger in magnitude than the set- and reset-voltage) for a certain duration, sometimes in a high vacuum environment. In doing so, it may cause ion (or metal) migration from electrode into the insulator oxide or formation of ionic vacancies in the oxide, creating localized states that facilitate electron (or hole) movement. Apparently the mechanism of forming is still under debate. The nature and density of the paths of localized conduction (called "filament" in the literature) created by the forming process, however, are difficult to control. Moreover, there is a scalability problem in such device in that the resistance of the formed device does not show a clear dependence on the area in the normal way (namely, the resistance being inversely proportional to the device area). For filamentary conduction, it appears that the resistance switching property will be lost when the device (cell) area is smaller than the characteristic area of either the localized conducting path or the average area between such paths. The value of such a limiting size is currently unknown.

Several switching mechanisms have been proposed over the years for the oxide thin film devices. These include electron trapping and release by injected Au (from electrode) inside $SiO_2$, formation and rupture of a conducting filament in NiO, $TiO_2$, Cr—$SrZrO_3$ (SZO) and $CeO_2$, Schottky barrier modification through interface-trapped charges in $Pr_{0.7}Ca_{0.3}MO_3$ (PCMO) with Ti top electrode, and field-induced electrochemical migration of ions (oxygen vacancy) between PCMO and Ag top electrode interface. The latter two may be regarded as an interface phenomenon, which does not depend on the film thickness as long as the thickness of the interface layer is very small. More commonly, the filamentary mechanism for switching has received much support; its origin is thought to be due to forming. For example, conduction is thought to be switched on by metallic Ni formation in NiO, by local point defects around multi-valent Ti ions in $TiO_2$, by free carrier release due to $Cr^{3+}$ to $Cr^{4+}$ underneath the anode, and by valence-shifted $CeO_x$ domains inside the insulating $CeO_2$ matrix. Just as forming, this filamentary mechanism for switching is not reliable for long-term operation and may not be reproducible from device to device. It is also likely that the interface phenomenon mentioned above may involve filaments formed locally across the interface. (The as-fabricated device is in the high-resistance state.)

According to the literature, although there is usually a characteristic set- (reset-) voltage in a given device, there is not a clear connection between this voltage and the material system. In particular, in some systems set/reset switching is possible without changing the polarity of the voltage, as in $Nb_2O_5$, $ZrO_2$, $TiO_2$, NiO and MgO, which we call unipolar, whereas in other systems switching requires alternate positive and negative biases, as in Cr (V)-SZO, PCMO and $CeO_2$, which we call bipolar. It is not clear why some of these oxides are unipolar and others are bipolar. It is also not clear why the switching voltage is low in some systems while high in others. Whether a resistance memory is unipolar or bipolar will impact the circuit design. For practical applications, a relatively low set-reset-voltage close to 1 V is desired, since this is the typical operating voltage in an integrated circuit.

Although the current invention is not limited to perovskite, the inventors have found many compositions of perovskite provide good resistance switching films for non-volatile memory devices. Perovskite material systems have traditionally been used for capacitors, dielectrics, piezoelectrics, pyroelectric, and other related applications. In such applications, it is advantageous to have very low conductivity, i.e., very high resistivity, to minimize dielectric loss and/or leakage of stored charge. Perovskite compositions for such applications generally avoid conducting dopants. In those circumstances where dopants are used, a relatively small amount (typically less than about 2 atomic percent) is used to compensate for valence mismatch in the insulator matrix, for example a small amount of $Nb^{5+}$ can be used to compensate for the small amount of $Ti^{3+}$ in $BaTiO_3$. Perovskite material systems may also be used for conductors, electrodes, and other related applications. In these applications, however, very high conductivity, i.e., very low resistivity, is desired to minimize ohmic loss and power consumption. Therefore, the preferred compositions generally include a very high amount of conducting components (typically greater than about 70 atomic percent). Prior efforts in the art have thus taught either very highly-doped or minimally-doped perovskite materials systems for various technological applications. Here, the inventors have surprisingly found a significant and reproducible resistance-switching phenomenon upon mid-range doping of some perovskite material systems.

SUMMARY OF THE INVENTION

Resistance-switching oxide films, according to the certain preferred aspects of the present invention, include at least about 60 atomic percent of an insulator oxide matrix having a conducting material dopant in an amount up to about 40 atomic percent. The matrix and dopant are preferably in solid solution. The insulator oxide matrix may include MgO, while the dopant may include Ti, V, Cr, Mn, Fe, Co, Ni, Cu, TiO, VO, MnO, FeO, CoO, NiO, CuO, or combinations thereof.

More preferably, at least one of the insulator oxide matrix and the conducting material matrix may have a perovskite crystal structure. As used herein, perovskite crystal structures may also include perovskite-like crystal structures. In this regard, the preferred insulator oxide matrix may include $LaAlO_3$, $CaZrO_3$, $SrZrO_3$, $BaZrO_3$, $CaHfO_3$, $SrHfO_3$, $BaHfO_3$, $LaScO_3$, $GdScO_3$, $DyScO_3$, or combinations thereof. Preferred conducting material dopants include $SrRuO_3$, $CaRuO_3$, $BaRuO_3$, $SrMoO_3$, $CaMoO_3$, $BaMoO_3$, $SrIrO_3$, $CaIrO_3$, $BaIrO_3$, $SrVO_3$, $CaVO_3$, $SrNbO_3$, $CaNbO_3$, $SrCrO_3$, $SrFeO_3$, $CaFeO_3$, $LaTiO_3$, $LaNiO_3$, $LaCuO_3$, $LaRhO_3$, $(La,Sr)TiO_3$, $(La,Sr)FeO_3$, $(La,Sr)MnO_3$, or combinations thereof.

Certain presently preferred embodiments of the present invention include semiconductor devices having at least one resistance-switching oxide film as described herein. In accordance with an embodiment of the present invention, the device may include a substrate, a first electrically conductive layer disposed on the substrate, at least one resistance-switching oxide film, as described herein, disposed on the first conductive layer, and a second electrically conductive layer disposed on the oxide film. According to certain preferred aspects of the present invention, the first electrically conductive layer may serve as the device substrate. The first electrically conductive layer and resistance-switching oxide layer may also be deposited to maintain epitaxial registry with a single crystal semiconductor substrate.

In another aspect, the present invention also provides for thin films, comprising one or more oxide layers each comprising a conducting oxide dopant and an insulating oxide material, the total thickness of the one or more oxide layers being at least about 6 nm, the one or more oxide layers being selected from the following table:

| Oxide Layer Type, Thickness (nm) | Conducting Oxide Dopant | Molar % Conducting Oxide Dopant | Insulating Oxide Material | Molar % Insulating Oxide Material |
| --- | --- | --- | --- | --- |
| SRO-CZO, up to about 30 nm | $SrRuO_3$ | from about 3 to about 10 molar % | $CaZrO_3$ | from about 90 to about 97 molar % |

-continued

| Oxide Layer Type, Thickness (nm) | Conducting Oxide Dopant | Molar % Conducting Oxide Dopant | Insulating Oxide Material | Molar % Insulating Oxide Material |
|---|---|---|---|---|
| LNO-CZO, up to about 40 nm | LaNiO₃ | from about 10 to about 40 molar % | CaZrO₃ | from about 60 to about 90 molar % |
| SRO-LAO, up to about 40 nm | SrRuO₃ | from about 6 to about 13 molar % | LaAlO₃ | from about 87 to about 94 molar % |
| LNO-LAO, up to about 40 nm. | LaNiO₃ | from about 6 to about 13 molar % | LaAlO₃ | from about 87 to about 94 molar %. |

The present invention also provides switchable-resistance thin film devices, comprising: at least one first electrode; one or more resistance-switching oxide layers, the total thickness of the one or more resistance-switching oxide layers being at least about 6 nm, at least one of the resistance-switching oxide layers situated adjacent to the first electrode, wherein each of the resistance switching oxide layers comprise a conducting oxide dopant and an insulating oxide material selected from the following table:

| Resistance-Switching Oxide Layer Type, Thickness (nm) | Conducting Oxide Dopant | Molar % Conducting Oxide Dopant | Insulating Oxide Material | Molar % Insulating Oxide Material |
|---|---|---|---|---|
| SRO-CZO up to about 30 nm | SrRuO₃ | from about 3 to about 10 molar % | CaZrO₃ | from about 90 to about 97 molar % |
| LNO-CZO up to about 40 nm | LaNiO₃ | from about 10 to about 40 molar % | CaZrO₃ | from about 60 to about 90 molar % |
| SRO-LAO up to about 40 nm | SrRuO₃ | from about 6 to about 13 molar % | LaAlO₃ | from about 87 to about 94 molar % |
| LNO-LAO up to about 40 nm. | LaNiO₃ | from about 6 to about 13 molar % | LaAlO₃ | from about 87 to about 94 molar % | and at least one second electrode situated adjacent to at least one of the resistance-switching oxide layers, wherein at least a portion of each of the resistance-switching oxide layers is situated between at least a portion of the first electrode and at least a portion of the second electrode.

Also provided by the present invention are switchable-resistance thin film devices, comprising: one or more resistance-switching oxide layers each comprising a conducting oxide dopant and an insulating oxide material, the total thickness of the one or more resistance-switching oxide layers being at least about 6 nm, wherein each of the resistance-switching oxide layers is selected from the following table:

| Resistance-Switching Oxide Layer Type, Thickness (nm) | Conducting Oxide Dopant | Molar % Conducting Oxide Dopant | Insulating Oxide Material | Molar % Insulating Oxide Material |
|---|---|---|---|---|
| SRO-CZO, up to about 30 nm | SrRuO₃ | from about 3 to about 10 molar % | CaZrO₃ | from about 90 to about 97 molar % |
| LNO-CZO, up to about 40 nm | LaNiO₃ | from about 10 to about 40 molar % | CaZrO₃ | from about 60 to about 90 molar % |
| SRO-LAO, up to about 40 nm | SrRuO₃ | from about 6 to about 13 molar % | LaAlO₃ | from about 87 to about 94 molar % |
| LNO-LAO, up to about 40 nm. | LaNiO₃ | from about 6 to about 13 molar % | LaAlO₃ | from about 94 molar % | at least one isolation layer situated adjacent to at least a portion of one of the resistance-switching oxide layers, the at least one isolation layer being selected from the following table:

| Isolation Layer Type, Thickness (nm) | Conducting Oxide Dopant | Molar % Conducting Oxide Dopant | Insulating Oxide Material | Molar % Insulating Oxide Material |
|---|---|---|---|---|
| SRO-CZO, up to about 10 nm | $SrRuO_3$ | from 0 to about 7 molar % | $CaZrO_3$ | from about 93 to 100 molar % |
| LNO-CZO, up to about 10 nm | $LaNiO_3$ | from 0 to about 25 molar % | $CaZrO_3$ | from about 75 to 100 molar % |
| SRO-LAO, up to about 10 nm | $SrRuO_3$ | from 0 to about 10 molar % | $LaAlO_3$ | from about 90 to 100 molar % |
| LNO-LAO, up to about 10 nm. | $LaNiO_3$ | from 0 to about 10 molar % | $LaAlO_3$ | from about 90 to 100 molar % |

; and at least one first electrode being situated adjacent to at least one isolation layer, and at least one second electrode being situated adjacent to at least one resistance-switching oxide layer, to a second isolation layer, or both.

BRIEF DESCRIPTION OF THE DRAWINGS

Various aspects of the present invention will become more apparent in reference to the accompanying drawings in which:

FIG. 1(a)-1(c) depict various embodiments of semiconductor devices according to certain preferred aspects of the present invention.

FIG. 34a Top electrode area effect on switching properties in 12.5% LNO-LAO.

FIG. 34b Top electrode area effect on switching properties in 4.5% and 5.5% SRO-CZO.

DETAILED DESCRIPTION OF ILLUSTRATIVE EMBODIMENTS

Figure 2:
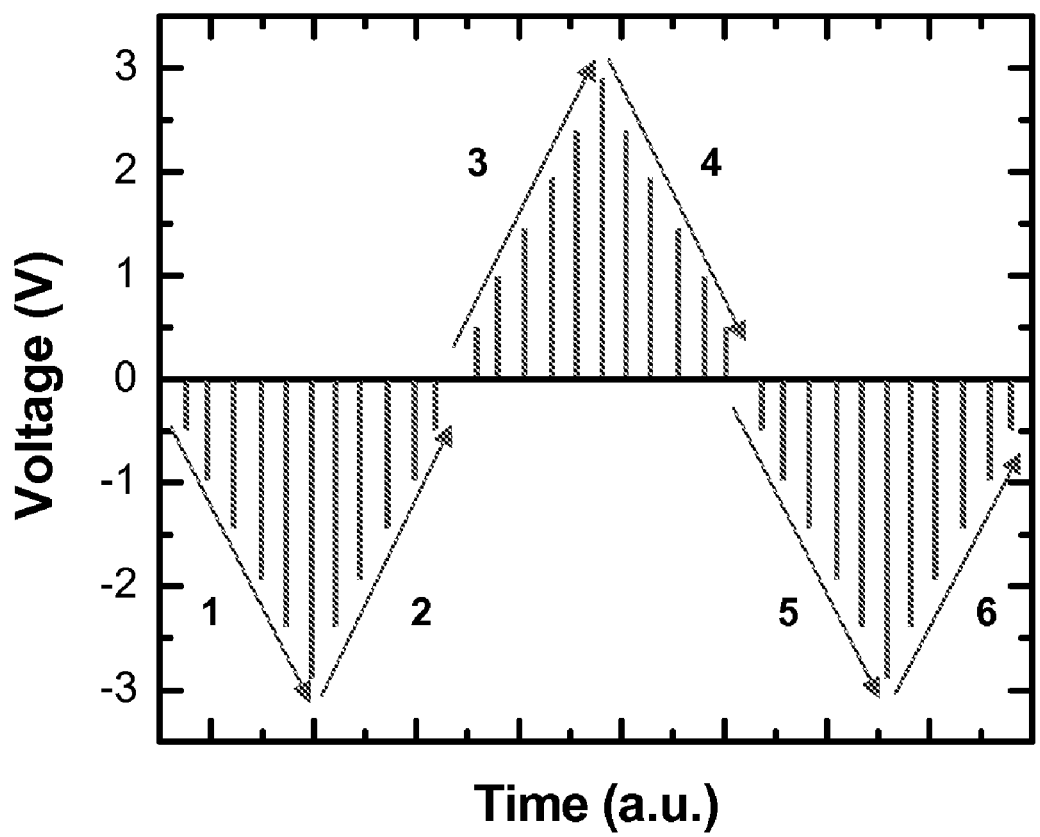
FIG. 2 illustrates the voltage cycle applied at room temperature to certain preferred embodiments of the present invention.

The present invention relates to two-point resistance-switching oxide layers, semiconductor devices incorporating same, and methods for making such oxide layers and devices. Resistance-switching oxide layers, and devices incorporating same, are suitable for various non-volatile memory applications. Under a resistance-switching regime, when an appropriate voltage pulse is applied, the resistance of the oxide layer can be increased and remain so until application of another appropriate voltage pulse, typically of the opposite polarity, which returns the resistance to the low value. Devices incorporating such resistance-switching oxide layers should be switchable at a modest voltage, preferably below about 3 V.

Resistance-switching oxide films, according to the certain preferred aspects of the present invention, include at least about 60 atomic percent of an insulator oxide matrix having a conducting material dopant in an amount up to about 40 atomic percent. The matrix (solvent) and dopant (solute) are preferably in solid solution, without appreciable precipitate formation or phase separation. The insulator oxide matrix may include MgO or ZnO. The insulator oxide may also include at least one binary oxide, including but not limited to:

(a) $X_2O_3$ where X is Al, Ga, In, Sc, Y, Gd, Tb, Dy, Ho, Er, Tm, Yb, or Lu;
(b) $X_1O_2$ where $X_1$ is Si, Ge, Sn, Zr or Hf, and
(c) $X_2O_5$ where X is Nb or Ta.

Dopants may include various metals and/or their respective oxides such as Ti, V, Cr, Mn, Fe, Co, Ni, Cu, TiO, VO, MnO, FeO, CoO, NiO, CuO, $Cu_2O$ or combinations thereof. Dopants may also include Pt, Pd, Au, Ag, Ir, Rh, Os, Ru, Re, W, Mo, Ta, Nb, Hf, Zr, Al, or combinations thereof. Dopants may further include $VO_2$, $CrO_2$, $NbO_2$, $MoO_2$, $RuO_2$, $RhO_2$, $WO_2$, $OsO_2$, $IrO_2$, $PtO_2$, or combinations thereof.

More preferably, at least one of the insulator oxide matrix and the conducting material matrix may have a perovskite, or perovskite-like, crystal structure. In this regard, the preferred insulator oxide matrix may include $CaZrO_3$, $SrZrO_3$, $BaZrO_3$, or combinations thereof. The insulator oxide matrix may also include at least one of:

(a) $X_1HfO_3$, where $X_1$ is Ca, Sr, or Ba;
(b) $X_1AlO_3$, where $X_1$ is La, Ce, Pr, Nd, Pm, Sm, Eu, Gd, Tb, Dy, Ho, Er, Tm, Yb, Lu, or Y;
(c) $X_1ScO_3$, where $X_1$ is La, Ce, Pr, Nd, Pm, Sm, Eu, Gd, Tb, Dy, Ho, Er, Tm, Yb, Lu, or Y; and
(d) $Ba(X_1)_{1/3}(X_2)_{2/3}O_3$, where $X_1$ is Mg or Zn, and $X_2$ is Nb or Ta.

Preferred conducting oxide dopants include perovskite structures including, but not limited to, $SrRuO_3$, $CaRuO_3$, $BaRuO_3$, $SrMoO_3$, $CaMoO_3$, $BaMoO_3$, $SrIrO_3$, $CaIrO_3$, $BaIrO_3$, $SrVO_3$, $CaVO_3$, $SrNbO_3$, $CaNbO_3$, $SrCrO_3$, $SrFeO_3$, $CaFeO_3$, $LaTiO_3$, $LaNiO_3$, $LaCuO_3$, $LaRhO_3$, $(La,Sr)TiO_3$, $(La,Sr)MnO_3$, $(La,Sr)FeO_3$, or combinations thereof. Dopants may also include at least one of:

(a) $A_1X_1O_3$, where $A_1$ is Ca, Sr, or Ba; and $X_1$ is V, Cr, Mn, Fe, Co, Nb, Mo, Ru, Rh, Ta, W, Re, Os, or Ir;

(b) $A_1X_1O_3$ where $A_1$ is La, Ce, Pr, Nd, Pm, Sm, Eu, Gd, Tb, Dy, Ho, Er, Tm, Yb, Lu, or Y; and $X_1$ is Ti, V, Co, Ni, Cu, Nb, Mo, Ru, Rh, or Ir; and (c) $(A_1, A_2)X_1O_3$ where $A_1$ is La, Ce, Pr, Nd, Pm, Sm, Eu, Gd, Tb, Dy, Ho, Er, Tm, Yb, Lu, or Y; $A_2$ is Ca, Sr, or Ba; and $X_1$ is Ti, V, Cr, Mn, Fe, Co, Ni, Cu, Nb, Mo, Ru, Rh, Ta, W, Re, Os, or Ir.

Certain presently preferred embodiments of the present invention also include semiconductor devices having at least one resistance-switching oxide layer as described herein. In accordance with an embodiment of the present invention, the device may include a substrate, a first conductive layer disposed on the substrate, at least one resistance-switching oxide layer as described herein, and a second electrically conductive layer disposed on the oxide layer. The first and second electrically conductive layers may respectively serve as bottom and top electrodes. In this regard, at least one of the electrodes may also comprise Pt, Pd, Ni, Au, Ag, Cu, Ir, Rh, Co, Os, Ru, Fe, Re, Mn, W, Mo, Cr, Ta, Nb, V, Hf, Zr, Ti, Al, doped Si, metal silicides, TiN, ZrN, HfN, TiC, $TiB_2$, or combinations thereof. Electrodes may also comprise $CrO_2$, $MoO_2$, $RuO_2$, $RhO_2$, $WO_2$, $OsO_2$, $IrO_2$, $PtO_2$, or combinations thereof. In certain preferred embodiments, the first electrically conductive layer may also serve as the device substrate.

The various layers may be deposited by any number of sputtering and/or deposition techniques including, but not limited to, direct-current (DC) sputtering, radio-frequency (RF) sputtering, pulsed laser deposition (PLD), physical vapor deposition (PVD), atomic layer deposition (ALD), chemical vapor deposition (CVD), and ion-assisted deposition (IAD). The electrically conductive layer may be preferably deposited using a shadow mask technique in conjunction with RF sputtering. In accordance with certain preferred aspects of the present invention, the first electrically conductive layer and resistance-switching oxide layer may be deposited to maintain epitaxial registry, i.e., lattice matching, with a single crystal substrate. As seen in FIG. 1(a), the device may have a $SrTiO_3$ (STO) single crystal substrate in the 100 orientation, $SrRuO_3$ (SRO) as the first electrically conductive layer/bottom electrode, and platinum as the second electrically conductive layer/top electrode. The device may further include a resistance-switching oxide layer having $LaAlO_3$ (LAO) as the insulator oxide matrix and $SrRuO_3$ as the conducting material dopant. Preferably, $SrRuO_3$ is present in an amount of about 6 to about 13 atomic percent. FIG. 1(b) shows an alternate embodiment of the present invention wherein the resistance-switching oxide layer comprises a $CaZrO_3$ (CZO) insulator matrix doped with $SrRuO_3$.

At least one isolation layer may be included to alter the low voltage performance of the semiconductor device. FIG. 1(c) depicts yet another embodiment of the present invention having a $LaAlO_3$ isolation layer disposed between the resistance-switching layer and the respective top and bottom electrodes. Here again, $LaAlO_3$ is shown as the insulator oxide matrix and $SrRuO_3$ as the conducting dopant. In accordance with certain preferred aspects of the present invention, at least one of the isolation layers may be composed of the same insulator oxide utilized in the resistance-switching layer. Room temperature resistance-switching characteristics, depicted as I-V and R-V plots, of certain preferred embodiments of the present invention were determined utilizing a full cycle of positive and negative voltage pulse ranges as shown in FIG. 2.

Figure 3:
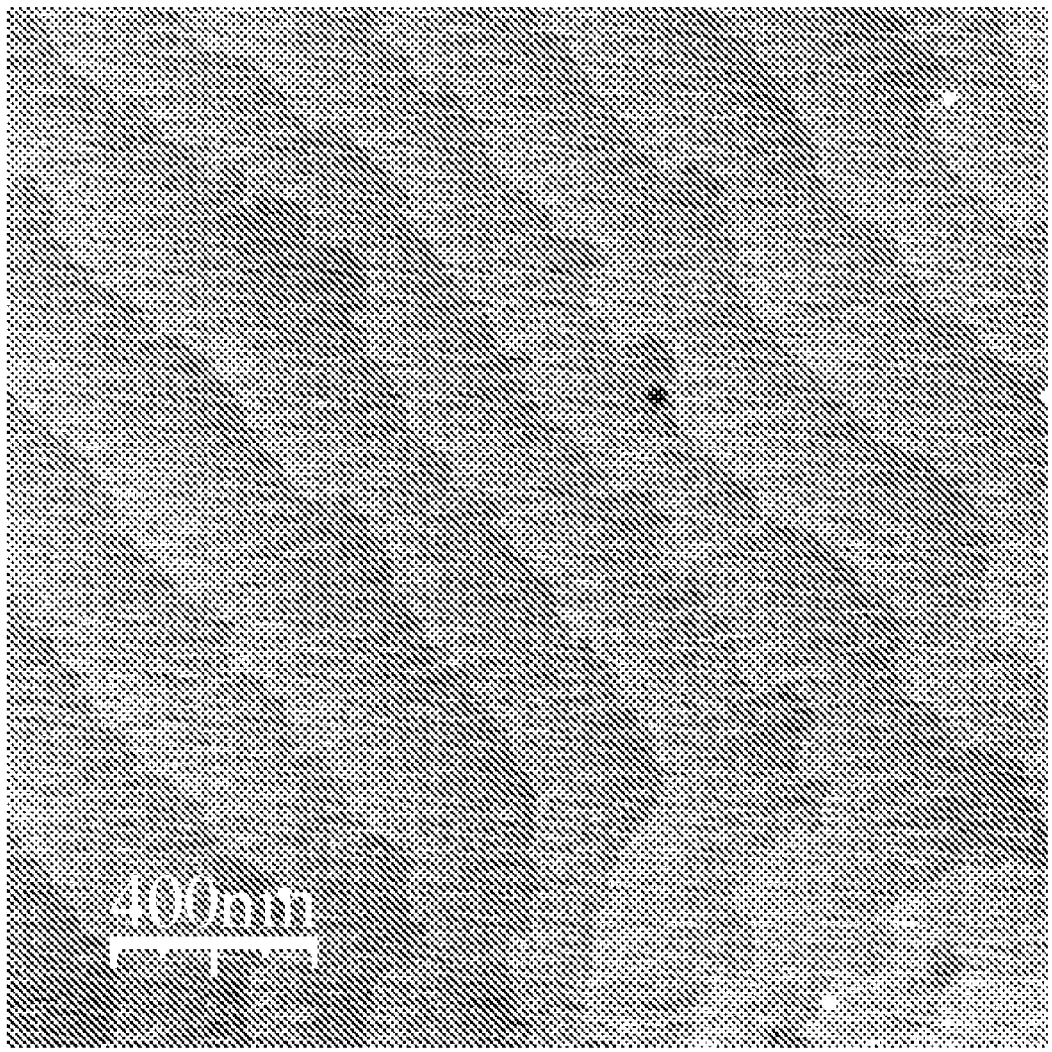
FIG. 3 shows the surface topography of a $SrRuO_3$ (SRO) first conductive layer deposited under preferred pulsed laser deposition (PLD) conditions.
Figure 4:
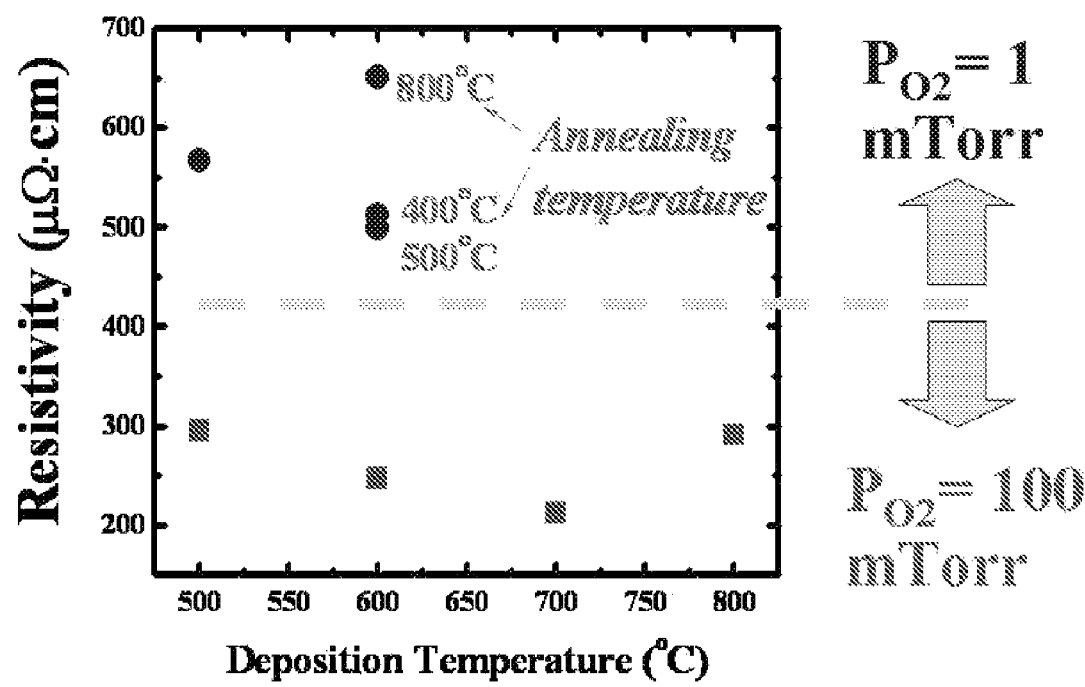
FIG. 4 illustrates the low resistivity of a $SrRuO_3$ (SRO) first conductive layer on a $SiTiO_3$ (STO) substrate layer deposited under preferred PLD conditions.
Figure 5:
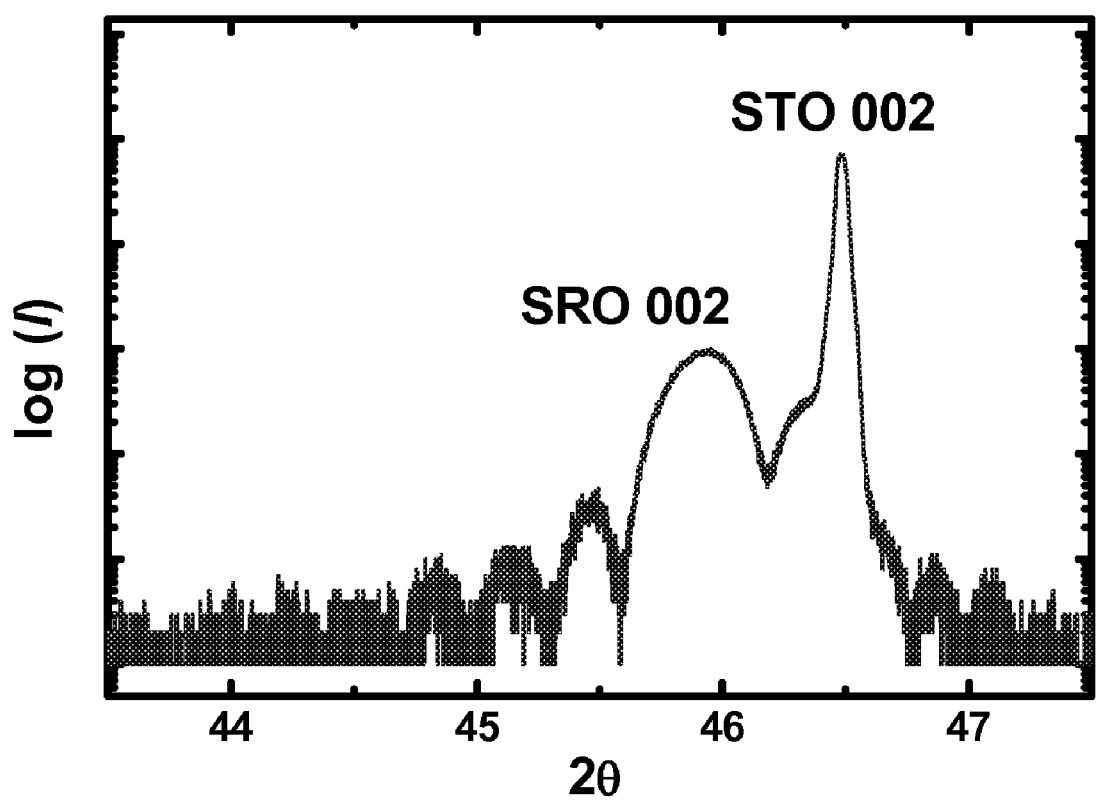
FIG. 5 is an X-ray diffraction spectrograph of a $SrRuO_3$ (SRO) first conductive layer deposited under preferred PLD conditions.

FIG. 3 shows the surface topography of a $SrRuO_3$ first conductive layer deposited under preferred PLD conditions. Smooth high quality layers were deposited at 700° C., 200 mJ, 2 Hz and $PO_2$ of 100 mTorr using a PLD method. As shown in FIG. 4, step-flow layers deposited under high oxygen partial pressure conditions generally exhibited preferably low initial resistivity. Post-deposition, these films were annealed in-situ at 500° C. at a $PO_2$ of 300 Torr for about 1 hour. FIG. 5 shows an X-ray diffraction spectrograph of a $SrRuO_3$ (SRO) strain relaxed film as disposed on an $SiTiO_3$ (STO) substrate.

Figure 6:
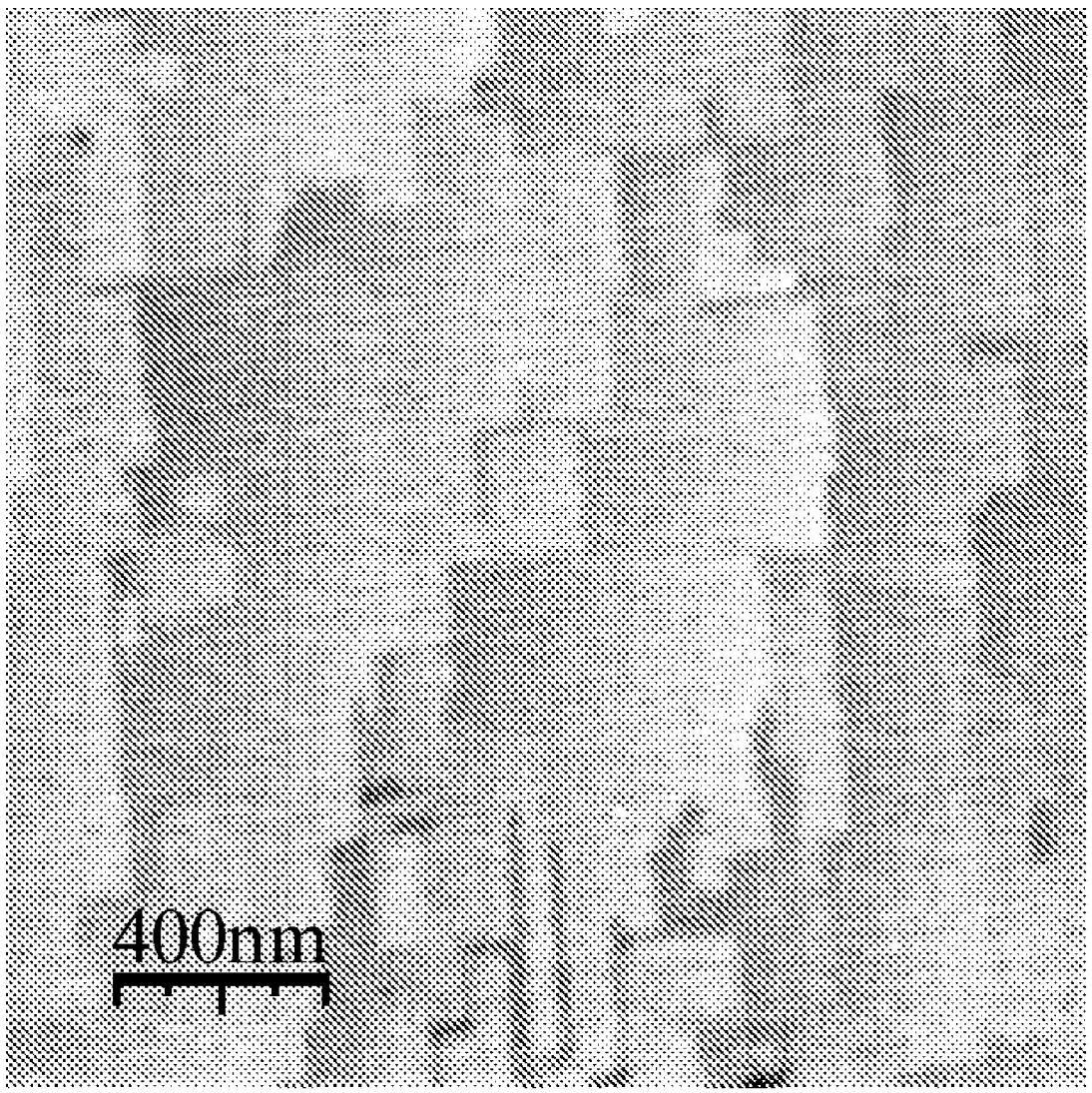
FIG. 6 shows the surface topography of a $LaAlO_3$:$SrRuO_3$ (LAO:SRO) layer using preferred PLD techniques at 500° C. and $PO_2$=1 mTorr.
Figure 7:
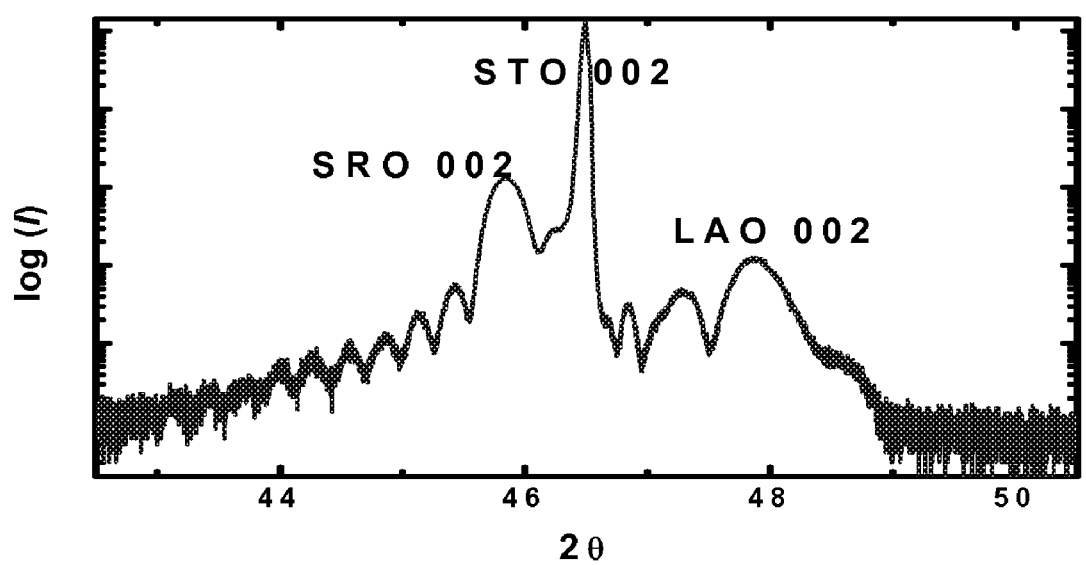
FIG. 7 shows an X-ray diffraction spectrograph of a preferable strain-relaxed $LaAlO_3$:$SrRuO_3$ (LAO:SRO) film as disposed on a $SrTiO_3$ (STO) substrate.
Figure 8:
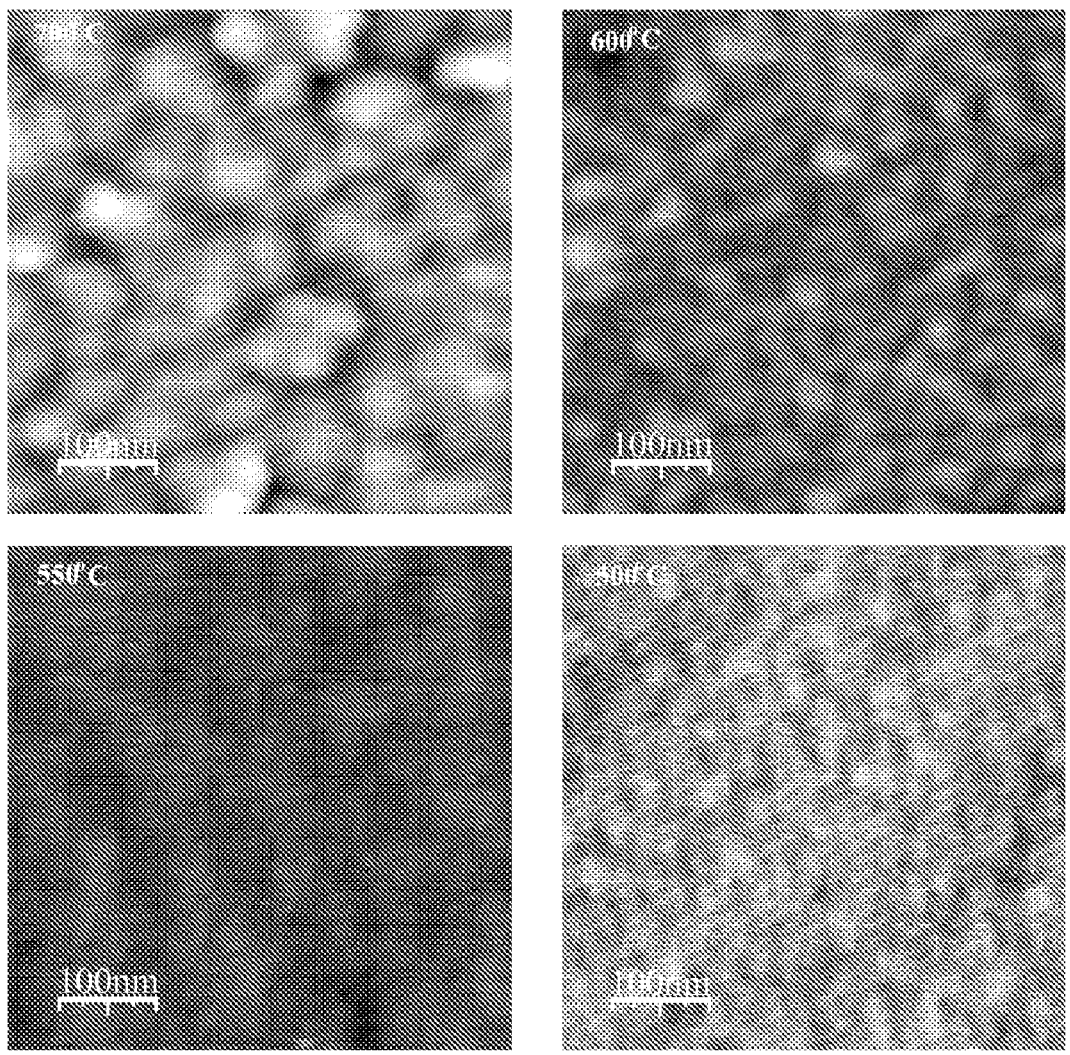
FIG. 8 depicts the surface topographies of $LaAlO_3$:$SrRuO_3$ (LAO:SRO) layers deposited at various temperatures.
Figure 9:
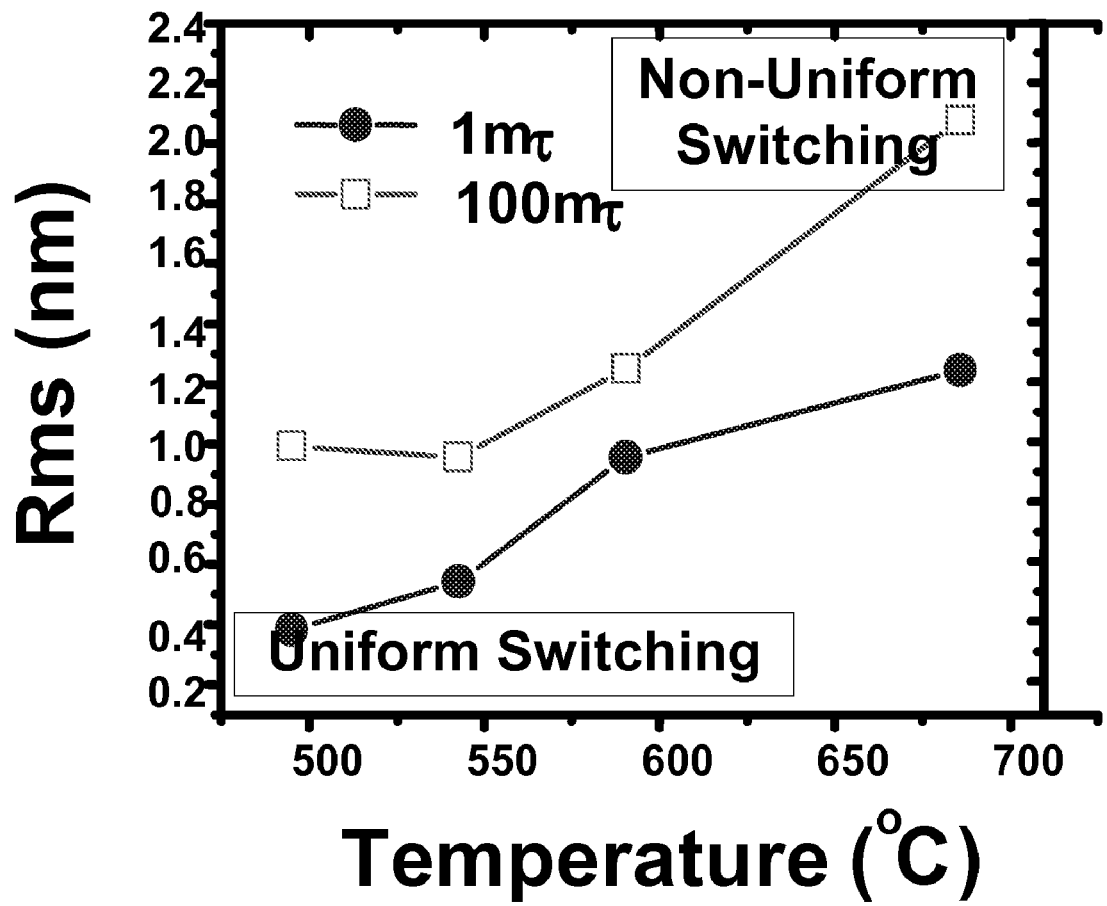
FIG. 9 shows the effect of PLD deposition conditions on resistance-switching of a $LaAlO_3$:$SrRuO_3$ (LAO:SRO) layer. Generally, higher PLD deposition temperatures resulted in greater surface roughness. Still further, greater oxygen partial pressure also resulted in greater surface roughness. Films with greater surface roughness showed generally non-uniform resistance-switching.

FIG. 6 shows the surface topography of a $LaAlO_3$:$SrRuO_3$ (LAO:SRO) layer deposited using preferred PLD techniques at 500° C. and $PO_2$ of about 1 mTorr. Per layer growth rates were about 0.0083 nm/laser-shot for LAO as compared to about 0.0084 nm/laser-shot for SRO. FIG. 7 shows an X-ray diffraction spectrograph of a preferable strain-relaxed LAO:SRO film as disposed on an STO substrate. FIG. 8 depicts the varied surface topographies of LAO:SRO layers deposited at the preferred partial pressure but assorted temperatures. Generally, at a $PO_2$ of about 1 mTorr, higher PLD deposition temperatures resulted in greater surface roughness. FIG. 9 shows the effect of PLD conditions on resistance-switching of LAO:SRO layers. Those films deposited at higher temperatures, higher partial oxygen pressure, or both, commonly resulted in greater surface roughness. Films with greater surface roughness generally showed poor resistance-switching performance.

Figure 10:
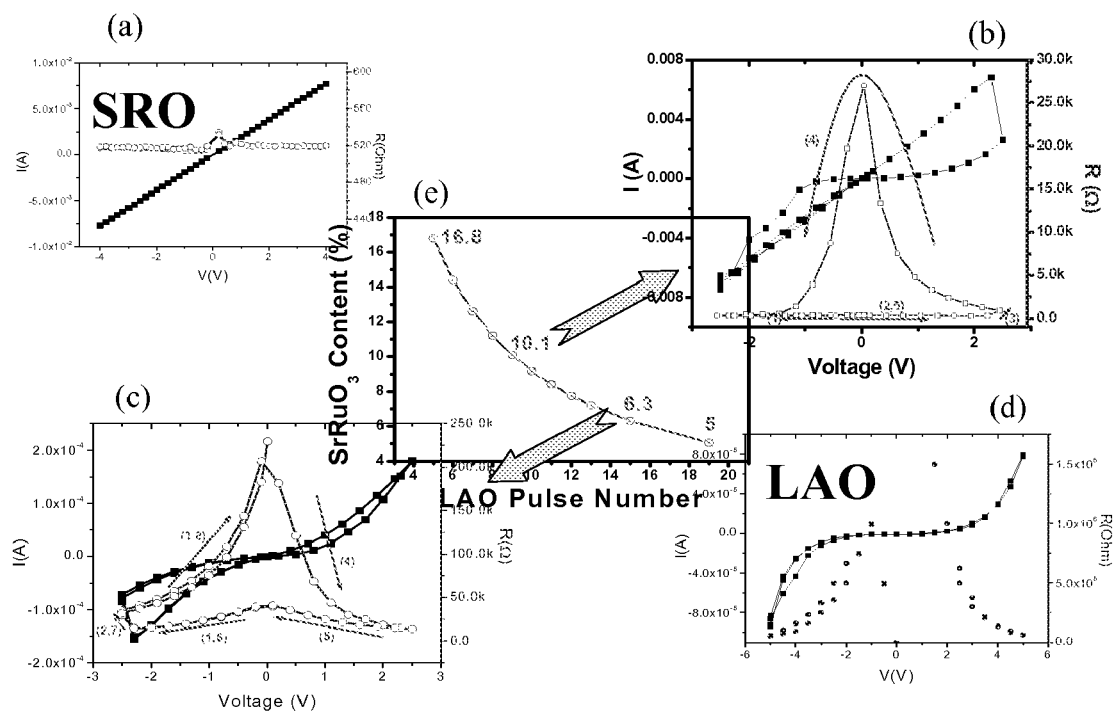
FIG. 10 depicts the resistance-switching performance of $LaAlO_3$:$SrRuO_3$ (LAO:SRO) films. Preferred resistance-switching performance may be obtained with about 6 to about 13 atomic percent $SrRuO_3$.
Figure 11:
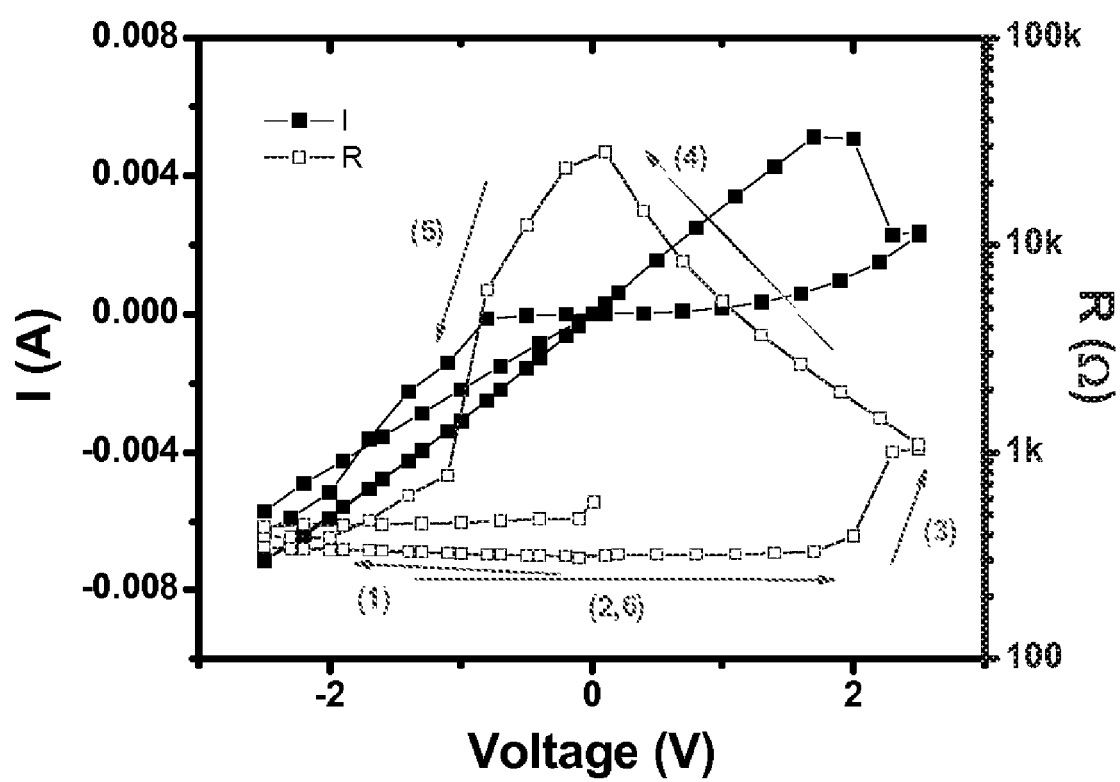
FIG. 11 shows the I-V (R-V) plot for a preferred semiconductor device having a $LaAlO_3$:$SrRuO_3$ resistance-switching layer with about 10 atomic percent $SrRuO_3$.
Figure 12:
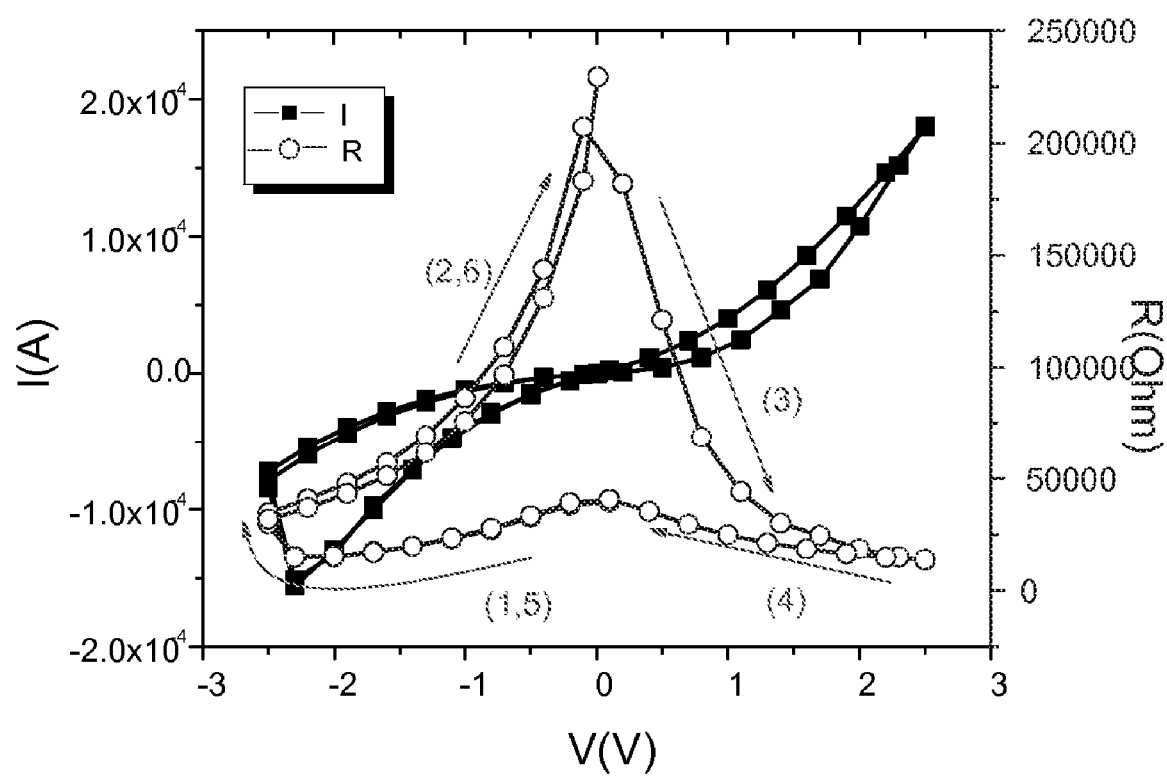
FIG. 12 shows the I-V (R-V) plot for a preferred semiconductor device having a $LaAlO_3$:$SrRuO_3$ resistance-switching layer with about 6 atomic percent $SrRuO_3$.
Figure 13:
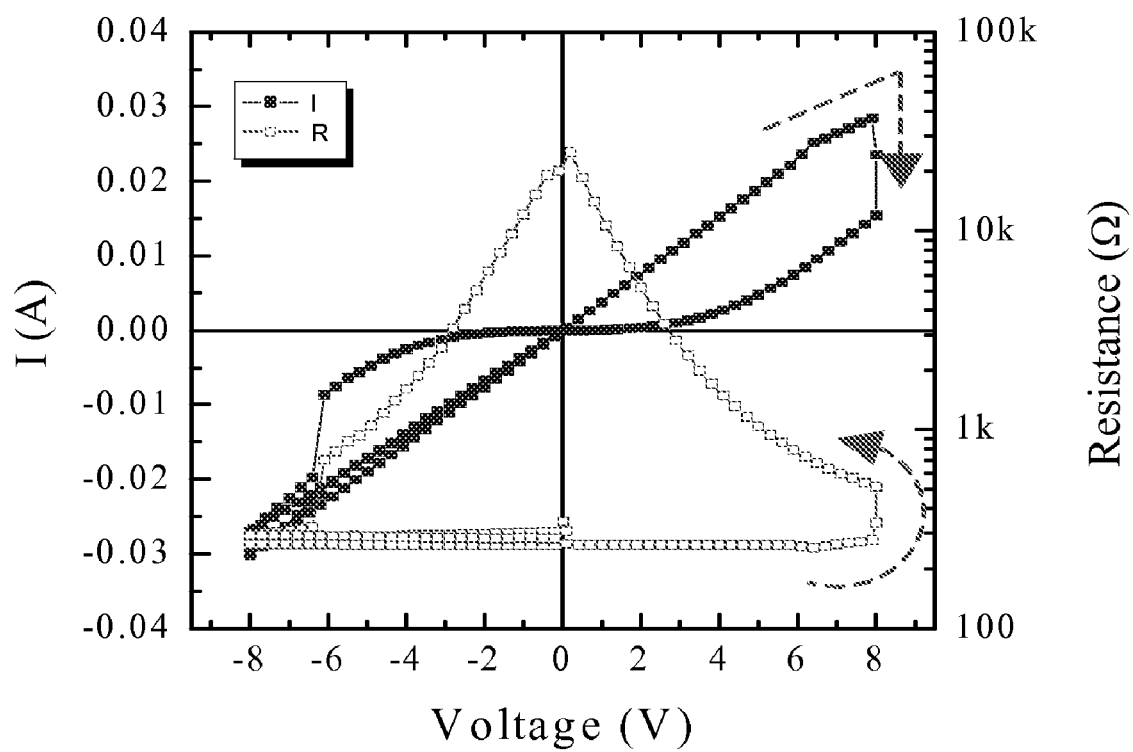
FIG. 13 shows the I-V (R-V) plot for a preferred semiconductor device having a $CaZrO_3$:$SrRuO_3$ resistance-switching layer with about 10 atomic percent $SrRuO_3$.

FIG. 10 depicts the resistance-switching performance of $LaAlO_3$:$SrRuO_3$ (LAO:SRO) films, measured between a $SrRuO_3$ first conductive layer/bottom electrode and a Pt second conductive layer/top electrode. The LAO:SRO general electrical characteristic may be adjusted from insulating to conducting by changing the SRO content from about 2 to about 17 atomic percent. Preferred resistance-switching performance could be obtained with about 6 to about 13 atomic percent SRO. Indeed, FIGS. 10(b) and 10(c) show exemplary resistance-switching characteristics of the present invention at $SrRuO_3$ contents of about 10 atomic percent and about 6 atomic percent, respectively. FIGS. 10(a) and 10(d) comparatively show the general electrical characteristics of respective typical un-doped SRO and LAO films. FIG. 11 shows the I-V (R-V) plot for a preferred semiconductor device having a $LaAlO_3$:$SrRuO_3$ resistance-switching layer with about 10 atomic percent $SrRuO_3$, similarly measured between a $SrRuO_3$ first conductive layer/bottom electrode and a Pt second conductive layer/top electrode. At this $SrRuO_3$ content, the device shows a preferred hysteric resistance response to applied voltage. It should be noted that the baseline resistance, of about 300Ω, for the $SrRuO_3$ first conductive layer (bottom electrode) is relatively high but does not adversely affect the overall resistance-switching performance of the device. FIG. 12 shows the I-V plot for a preferred semiconductor device having a $LaAlO_3$:$SrRuO_3$ resistance-switching layer with about 6 atomic percent $SrRuO_3$, also measured between a $SrRuO_3$ first conductive layer/bottom electrode and a Pt second conductive layer/top electrode. Although the device exhibits a higher initial resistance, it also exhibits a hysteresis response to the applied voltage cycle. FIG. 13 shows a similar hysteresis effect for a preferred semiconductor device having a $CaZrO_3$:$SrRuO_3$ resistance-switching layer with about 10 atomic percent $SrRuO_3$, again measured between a $SrRuO_3$ first conductive layer/bottom electrode and a Pt second conductive layer/top electrode.

As shown in FIGS. 10-13, the applied voltage cycle results in high initial current indicating a relatively low resistance. For a $LaAlO_3$:$SrRuO_3$ (LAO:SRO) resistance-switching layer, an abrupt change in slope then occurs at a large positive voltage indicating a switch to high resistance. For a $CaZrO_3$:

SrRuO$_3$ (CZO:SRO) resistance-switching layer, this change also appears to occur at large positive voltage. This characteristic switching from low to high resistance indicates that the switching does not involve a filamentary mechanism in which an initially high resistance state transitions to a low resistance state after preferred conducting paths (filaments) are formed at a threshold voltage. Indeed, characteristic filament formation necessarily results in transition from high to low resistance rather than vice-versa.

In accordance with the present invention, the low or high resistance state persists as the magnitude of the voltage continues to increase in the same bias. The resistance state then switches when an appropriately large voltage is applied having an opposite bias. In this regard, a LAO:SRO oxide layer switches to a low resistance state, evidenced as high current on the I-V plot, as the reverse voltage reaches a large negative magnitude. Accordingly, a CZO:SRO oxide layer also switches to a low resistance state when the reverse voltage reaches a large negative magnitude. It is noted that the I-V and R-V response curves are similar among the various insulator matrix compositions and dopant concentrations, thus each showing some degree of current hysteresis and preferred resistance response. Still further, the hysteresis response is largely independent of starting voltage bias. Each insulator: dopant system will thus exhibit the same respective I-V and R-V response regardless of whether the initial voltage bias is positive or negative. Aspects of the current invention include compositional and deposition variations which result in devices having relatively low initial resistance wherein switching-to-high-resistance occurs at negative voltage of appropriate magnitude and switching-to-low-resistance occurs at a positive voltage of appropriate magnitude, when the resistance is measured between a SrRuO$_3$ first conductive layer/bottom electrode and a Pt second conductive layer/top electrode. And again, these devices would also have the same respective I-V and R-V responses whether the initial voltage is positive or negative.

Devices according to certain preferred aspects of the present invention may be particularly suited for random access memory (RAM) applications. For example, simple two-point resistance devices may be produced to read and write binary information. Thus, a first pulse would set the device to a first resistance state, i.e., a "0" state. The application of a second pulse, of opposite polarity would set the device to a second resistance state, i.e., a "1" state. In this manner, information can be "written" to the device upon the application of a voltage having the appropriate magnitude and polarity. The device may be "read" by applying a voltage pulse of lesser magnitude than the write pulse.

Figure 14:
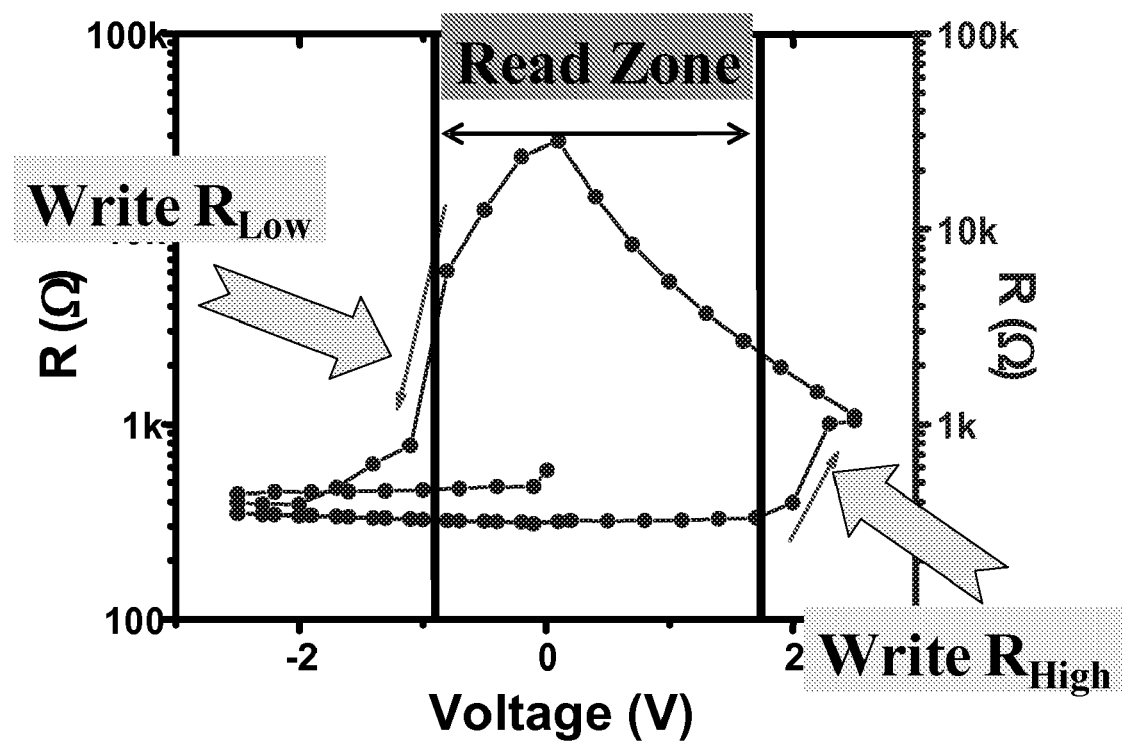
FIG. 14 shows that certain preferred semiconductor devices according to certain preferred aspects of the present invention have a lower initial resistance and switch to higher resistance at about 2 V, and switched back to low resistance at opposite bias at about −1 V. The semiconductor device comprised a $LaAlO_3$:$SrRuO_3$ resistance-switching layer with about 11 atomic percent $SrRuO_3$
Figure 15:
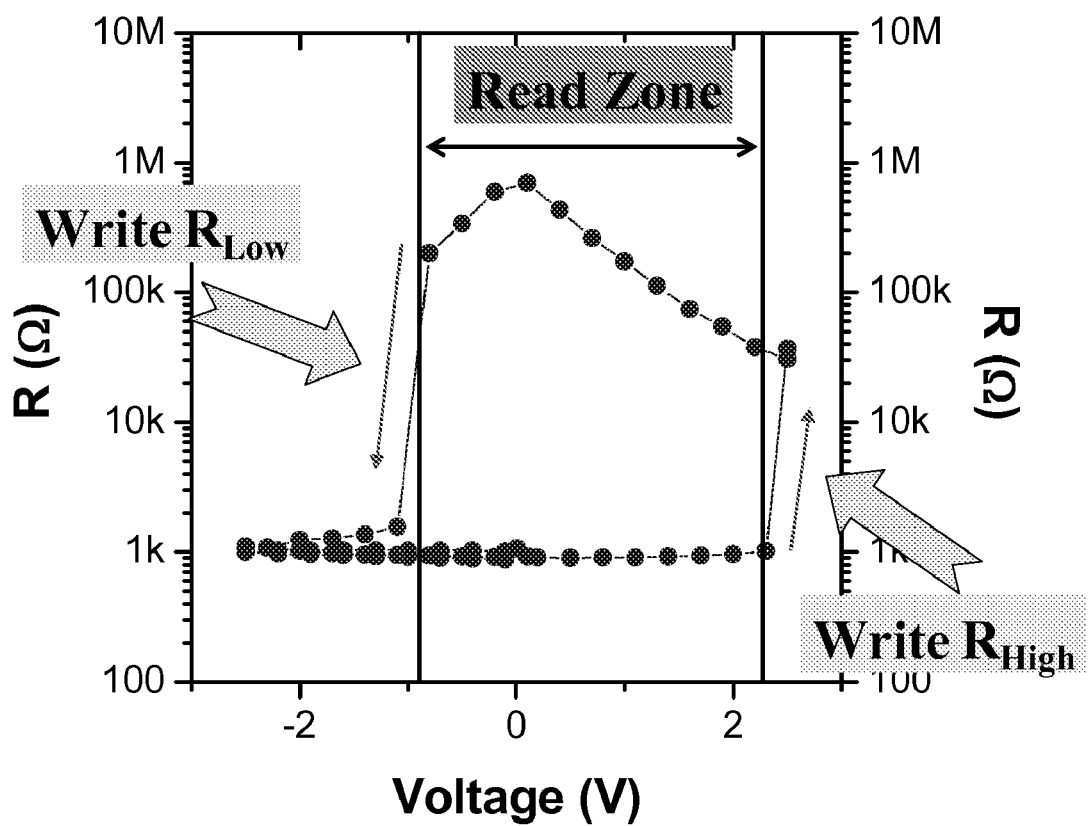
FIG. 15 shows that certain preferred semiconductor devices according to certain preferred aspects of the present invention have a lower initial resistance and switch to higher resistance at about 2 V, and switch back to low resistance at opposite bias at about −1 V. The semiconductor device comprised a $CaZrO_3$:$SrRuO_3$ resistance-switching layer with about 10 atomic percent $SrRuO_3$

FIG. 14 shows that semiconductor devices according to certain preferred aspects of the present invention having a low initial resistance and switch to higher resistance (write "1" state) at about 2 V, and switch back to low resistance (write "0" state) at an opposite bias of about −1 V. The device may be read at any intermediate voltage, for example 0.5 V. Thus, these devices have modest power consumption and would be particularly suited for micro-sized, or nano-sized, electronic devices. This device included a LaAlO$_3$:SrRuO$_3$ resistance-switching layer with about 11 atomic percent SrRuO$_3$, a SrRuO$_3$ first conductive layer/bottom electrode and a Pt second conductive layer/top electrode. The resistance layer was deposited using a PLD method at about 700° C. and PO$_2$ of about 1 mTorr. Surface roughness was measured to be about 0.4 nm. Platinum was deposited as the second conductive layer/top electrode. FIG. 15 depicts the R-V for another device according to certain preferred aspects of the present invention. This device comprised a CaZrO$_3$:SrRuO$_3$ resistance-switching layer with about 10 atomic percent SrRuO$_3$. The resistance-switching layer was deposited on a SrRuO$_3$ first conductive layer/bottom electrode using a PLD method at 600° C. and PO$_2$ of 10$^{-6}$ Torr. Surface roughness was measured to be about 0.5 nm. Platinum was deposited as the second conductive layer/top electrode. The device shows a low initial resistance while switching to a high resistance state (write "1" state) at about 2 V and switching back to a low resistance at about −1 V. This device may be read at any intermediate voltage, for example 0.5 V.

Figure 16:
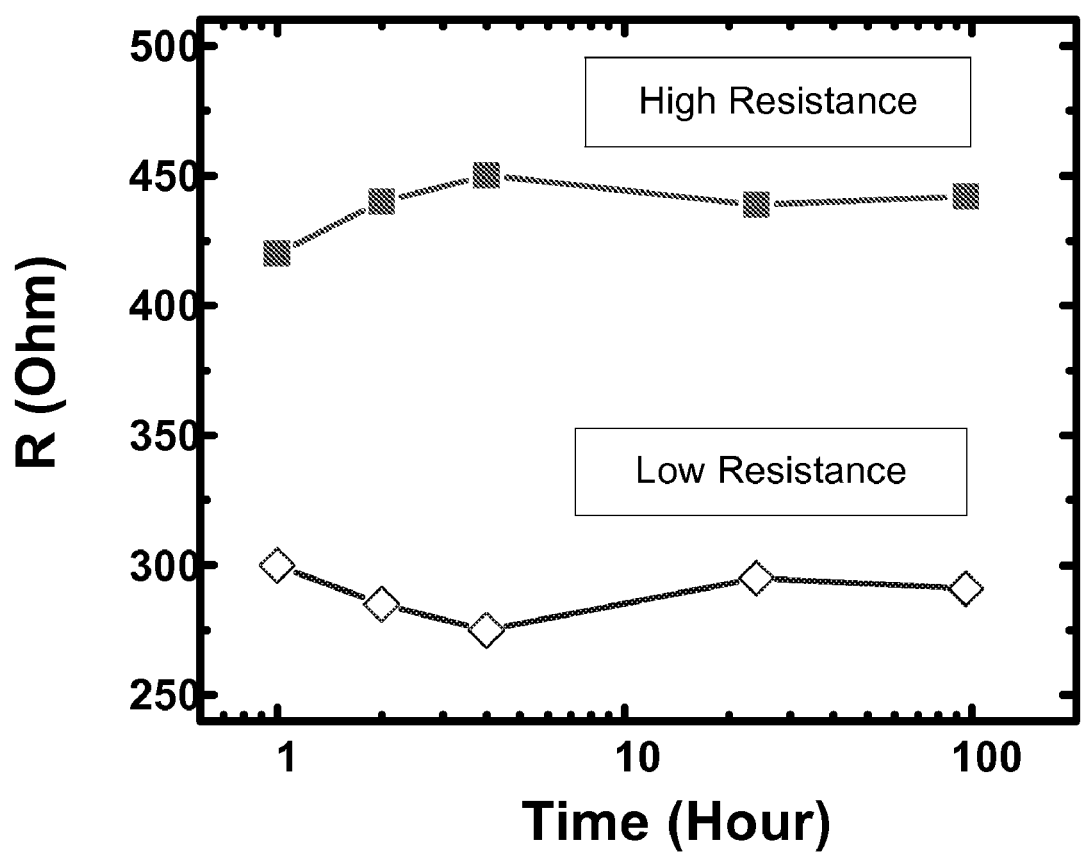
FIG. 16 shows the retention of low/high resistances obtained by preferred semiconductor device having a $LaAlO_3$:$SrRuO_3$ resistance-switching layer with about 10 atomic percent $SrRuO_3$.
Figure 17:
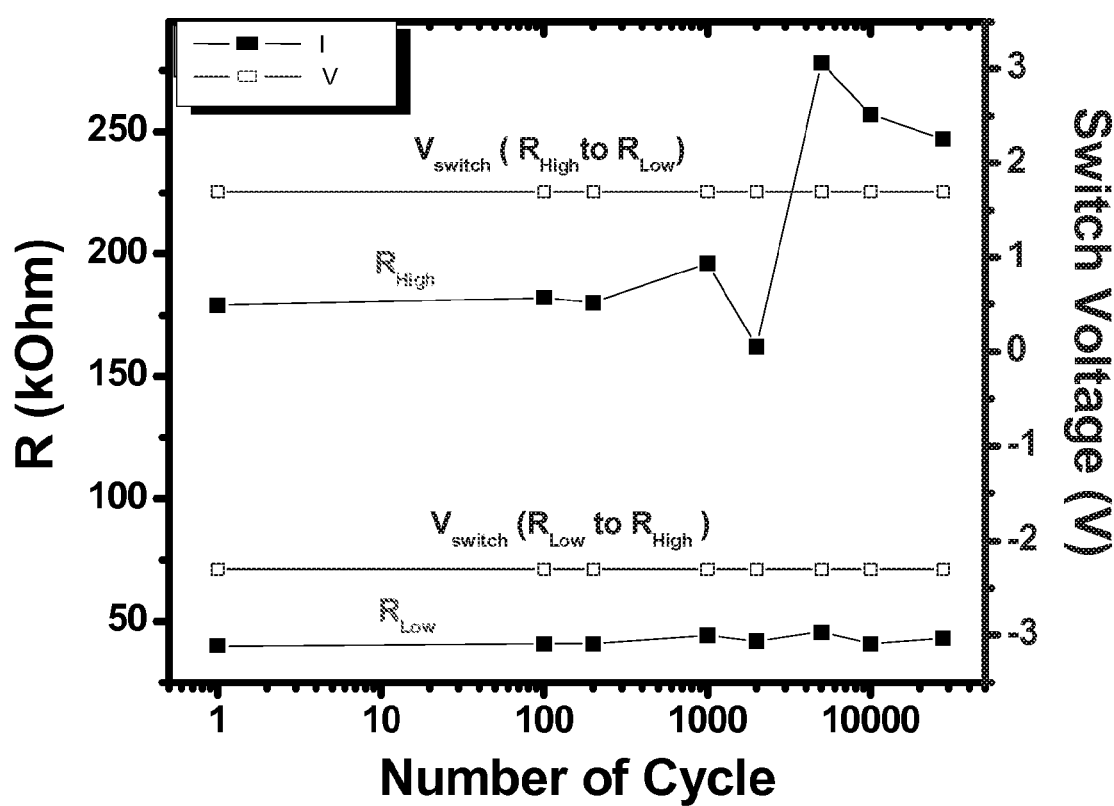
FIG. 17 illustrates the switching cycle performance of a semiconductor device having a $LaAlO_3$:$SrRuO_3$ resistance-switching layer with about 6 atomic percent $SrRuO_3$. The device showed little appreciable performance degradation over several thousand switching cycles.
Figure 18:
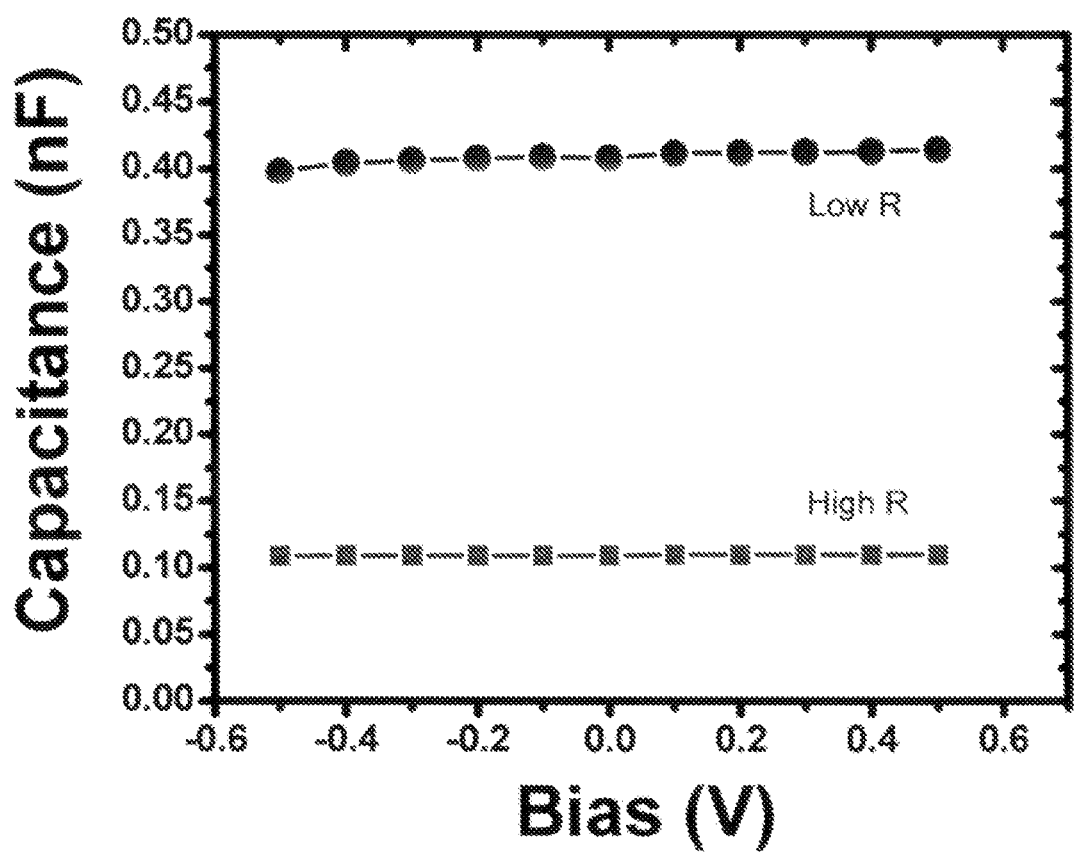
FIG. 18 shows the apparent capacitance performance, at 1 MHz, of a semiconductor device having a $LaAlO_3$:$SrRuO_3$ resistance-switching layer with about 6 atomic percent $SrRuO_3$.

FIG. 16 shows the retention of low/high resistances obtained by a preferred semiconductor device having a LaAlO$_3$:SrRuO$_3$ resistance-switching layer with about 10 atomic percent SrRuO$_3$. The resistance-switching layer was deposited on a SrRuO$_3$ first conductive layer/bottom electrode with Pt being the second conductive layer/top electrode. The resistance-switching layer was deposited at about 600° C. and PO$_2$ of about 100 mTorr using a PLD method. Surface roughness was measured to be about 0.37 nm, and the switching voltage was about 2V (−2V). Here, the device showed excellent retention of the low and high resistance states over the course of several days. FIG. 17 illustrates the switching cycle performance of a semiconductor device having a LaAlO$_3$:SrRuO$_3$ resistance-switching layer with about 6 atomic percent SrRuO$_3$. The resistance-switching layer was deposited at about 500° C. and PO$_2$ of about 1 mTorr. Sample surface roughness was measured to be about 0.34 nm, and the switching voltage was about 2 V (−2 V). Here, the device showed little appreciable switching performance degradation over several thousand switching cycles. FIG. 18 shows the capacitance variance at the high and low resistance states of a preferred device having a LaAlO$_3$:SrRuO$_3$ resistance-switching layer with about 11 atomic percent SrRuO$_3$. Here, the device was first set to either its high or resistance states by the appropriate voltage pulse, and the capacitance was measured at 1 MHz. The capacitance at the high resistance state is approximate to that expected for a device having an un-doped LaAlO$_3$ active layer. Thus, the high resistance states is effectively a capacitor having an undoped insulating layer. In the low resistance state, the apparent capacitance is higher due to the influence of the resistive element that conducts a substantial current. Although this apparent capacitance is not an intrinsic property of the device and may vary depending on the measurement condition, it allows the resistance states of the device to be easily distinguished using a capacitance measurement method.

If one or more isolation layers are present, then an initial non-zero voltage is needed to transfer current across the isolation and resistance-switching layers, hence a higher resistance would be expected at the zero-voltage state. The inclusion of an isolation layer may thus alter the zero-voltage resistance value, but is not expected to change the overall "shape" of the R-V response curve. Such a device, may also have improved leakage characteristics (i.e., reduced leakage) and may have further improved retention of the read:write states.

In regard to a presently preferred embodiment, and without being limited by theory, it is believed that the conducting dopant, for example SrRuO$_3$ in the LaAlO$_3$:SrRuO$_3$ resistance-switching layer, provides conductive electron states, centered at Ru and separated by LaAlO$_3$ insulating barriers in this example. These electron states are initially conductive along certain paths, forming the low resistance states. Under a certain external voltage bias, electrons may tunnel across a series of LaAlO$_3$ (insulating matrix) barriers between these conductive states and the nearby Ru states—those that are not connected to the main conductive paths, hence are not conductive and wherein the incoming electrons are trapped—thus raising the energy levels of the surrounding conductive path. This causes a switch to the high resistance states. When the voltage bias is reversed, the trapped electrons are released by tunneling back to the conductive paths, and the low resistance states are recovered.

The insulator oxide matrix of the resistance-switching layer should be a good insulator, having high breakdown field, and low conductivity in the desired temperature range of application. Still further, insulator oxide compositions in which cations may exist in more than one valence state, i.e., mixed valence compositions, should be avoided. These features prevent premature breakdown, and the formation of conducting paths due to "forming" or filamentary procedure wherein the application of a large voltage resulting in certain isolated preferred conducting paths in an initially highly electrically resistive material. See J. G. Simmons and R R Verdeber, *Proc. R. Soc. London, Ser. A* 301, 77 (1968). Here, preferred conducting oxide dopants typically contain cations that exist in more than one valence state. More generally, according to the present invention, dopant content is usually at a low enough concentration such that they provide relatively few conductive paths in addition to some isolated patches wherein electrons may be trapped once these states are accessed by electron tunneling under a certain applied voltage. At a much higher concentration, there are numerous conducting paths and few isolated patches that may trap electrons, thus it is not possible to switch to the high resistance state. At a much lower concentration, conducting paths are not available at low voltage, so the initial state always has a high resistance, until a high voltage is first applied such that "forming" or other conduction mechanisms may predominate by forming filaments. This appropriate range of concentration that provides an initial low resistance state and a voltage-switchable high resistance state may vary due to several factors including, but not limited to, layer thickness, spatial distribution of the conducting dopant, the charge state and wave function of the conducting dopant, the charge state and wave function of the insulating oxide, and the strain of the insulating oxide. Thus, for example, the optimal concentration for thick films may be greater than that for relatively thin films, and the optimal concentration of conducting $LaNiO_3$ in insulating $CaZrO_3$ may be greater than that for conducting $LaNiO_3$ in insulating $LaAlO_3$.

In this manner, conducting and tunneling electrons in an insulator matrix:conducting dopant system may effect beneficial resistance-switching characteristics. Certain embodiments of the present invention are particularly advantageous in that high voltage "forming" or filamentary conduction is avoided and resistance-switching may occur at relatively low voltages, typically about 2 V (or about −2 V). Thus, these devices have modest power consumption and would be particularly suited for micro-sized, or nano-sized, semiconductor devices. Low/high resistance states of certain preferred oxide layers, and devices therewith, are remarkably stable while further exhibiting excellent retention and cycle fatigue characteristics.

Suitable thin films that can be used include one or more oxide layers each comprising a conducting oxide dopant and an insulating oxide material. Suitable oxide layers can be characterized as being a solid solution of the insulating oxide material and the conducting oxide dopant. The total thickness of the one or more oxide layers is suitably at least about 6 nm, or at least about 8 nm, or at least about 10 nm, or at least about 12 nm, or at least about 14 nm, or at least about 16 nm, or at least about 20 nm. Suitable thin film thickness is up to about 40 nm, or up to about 35 nm, or up to about 30 nm, or up to about 25 nm, or up to about 20 nm, or up to about 15 nm. Particularly desirable oxide layers may be selected from the following table:

| Oxide Layer Type, Thickness (nm) | Conducting Oxide Dopant | Molar % Conducting Oxide Dopant | Insulating Oxide Material | Molar % Insulating Oxide Material |
|---|---|---|---|---|
| SRO-CZO, up to about 30 nm | $SrRuO_3$ | from about 3 to about 10 molar % | $CaZrO_3$ | from about 90 to about 97 molar % |
| LNO-CZO, up to about 40 nm | $LaNiO_3$ | from about 10 to about 40 molar % | $CaZrO_3$ | from about 60 to about 90 molar % |
| SRO-LAO, up to about 40 nm | $SrRuO_3$ | from about 6 to about 13 molar % | $LaAlO_3$ | from about 87 to about 94 molar % |
| LNO-LAO, up to about 40 nm. | $LaNiO_3$ | from about 6 to about 13 molar % | $LaAlO_3$ | from about 87 to about 94 molar %. |

Suitable thin films may further include one or more isolation layers surmounting at least a portion of the oxide layer. The isolation layers are suitably up to about 10 nm thick, or even up to about 8 nm thick, or even up to about 6 nm thick, or even up to about 5 nm thick. The isolation layers are suitably at least about 0.1 nm thick, or even at least about 0.2 nm thick, or even at least about 0.5 nm thick, or even at least about 1 nm thick, or even at least about 2 nm thick, or even at least about 4 nm thick, or even at least about 6 nm thick. Suitable isolation layers can be selected from the following table:

| Isolation Layer Type, Thickness (nm) | Conducting Oxide Dopant | Molar % Conducting Oxide Dopant | Insulating Oxide Material | Molar % Insulating Oxide Material |
|---|---|---|---|---|
| SRO-CZO, up to about 10 nm | $SrRuO_3$ | from 0 to about 7 molar % | $CaZrO_3$ | from about 93 to 100 molar % |
| LNO-CZO, | $LaNiO_3$ | from 0 to about | $CaZrO_3$ | from about 75 to |

-continued

| Isolation Layer Type, Thickness (nm) | Conducting Oxide Dopant | Molar % Conducting Oxide Dopant | Insulating Oxide Material | Molar % Insulating Oxide Material |
|---|---|---|---|---|
| up to about 10 nm | | 25 molar % | | 100 molar % |
| SRO-LAO, up to about 10 nm | SrRuO$_3$ | from 0 to about 10 molar % | LaAlO$_3$ | from about 90 to 100 molar % |
| LNO-LAO, up to about 10 nm | LaNiO$_3$ | from 0 to about 10 molar % | LaAlO$_3$ | from about 90 to 100 molar %. |

The molar % of the conducting oxide dopant in at least one of the isolation layers can suitably be less than the molar % of the conducting oxide dopant in the oxide layer. In some embodiments, the oxide layer can suitably be characterized as comprising metallic islands of SrRuO$_3$, LaNiO$_3$, or both.

Subjecting the thin films to a positive electrical bias, a negative electrical bias, or both, can give rise to the thin film being characterized as having a switchable resistance. Such films can be used in the NVRAM devices described herein.

Switchable-resistance thin film devices according to the present invention may comprise at least one first electrode, one or more resistance-switching oxide layers, and at least one second electrode situated adjacent to at least one of the resistance-switching oxide layers. Each of the resistance-switching oxide layers can suitably be characterized as being a solid solution of the insulating oxide material and the conducting oxide dopant. In these devices, at least a portion of each of the resistance-switching oxide layers can suitably be situated between at least a portion of the first electrode and at least a portion of the second electrode. The total thickness of the one or more resistance-switching oxide layers can be at least about 6 nm, or at least about 8 nm, or at least about 10 nm, or at least about 12 nm, or at least about 14 nm, or at least about 16 nm, or at least about 20 nm. Suitable thin film thickness is up to about 40 nm, or up to about 35 nm, or up to about 30 nm, or up to about 25 nm, or up to about 20 nm, or up to about 15 nm. Suitable devices incorporate at least one of the resistance-switching oxide layers situated adjacent to the first electrode. Each of the resistance switching oxide layers comprises a conducting oxide dopant and an insulating oxide material as described throughout this patent application. Particularly desirable oxide layers may be selected from the following table:

Os, Ru, Fe, Re, Mn, W, Mo, Cr, Ta, Nb, V, Hf, Zr, Ti, Al, doped Si, at least one conducting silicide, conducting metal nitride, conducting metal carbide, conducting metal boride, or any combination thereof. Among these, suitable conducting oxide materials include SrRuO$_3$, LaNiO$_3$, CaRuO$_3$, BaRuO$_3$, PrNiO$_3$, NdPrO$_3$, PmNiO$_3$, SmNiO$_3$, or any combination thereof. The first electrode, the second electrode, or both, can be suitably epitaxial with the resistance-switching oxide layer.

Any of a variety of insulating oxide materials can be used. Suitably, the insulating oxide material comprises CaZrO$_3$, SrZrO$_3$, BaZrO$_3$, CaHfO$_3$, SrHfO$_3$, BaHfO$_3$, LaAlO$_3$, PrAlO$_3$, NdAlO$_3$, PmAlO$_3$, SmAlO$_3$, EuAlO$_3$, GdAlO$_3$, TbAlO$_3$, DyAlO$_3$, HoAlO$_3$, ErAlO$_3$, TmAlO$_3$, YbAlO$_3$, LuAlO$_3$, YAlO$_3$, or any combination thereof.

The thin film electrodes can be suitably deposited on a substrate, and then the device is built up layer-by-layer. Accordingly, at least one thin film electrode can suitably be situated adjacent to a substrate. Any of a variety of substrate materials can be used. In particular, the substrate comprises SrTiO$_3$. As a result, the substrate and first electrode may be epitaxial or not.

Switchable-resistance thin film devices of the present invention can comprise one or more resistance-switching oxide layers, at least one isolation layer situated adjacent to at least a portion of one of the resistance-switching oxide layers, and at least one first electrode being situated adjacent to at least one isolation layer, and at least one second electrode being situated adjacent to at least one resistance-switching oxide layer, to a second isolation layer, or to both. The one or more resistance-switching oxide layers can each include a conducting oxide dopant and an insulating oxide material. Each of the resistance-switching oxide layers can suitably be

| Resistance- Switching Oxide Layer Type, Thickness (nm) | Conducting Oxide Dopant | Molar % Conducting Oxide Dopant | Insulating Oxide Material | Molar % Insulating Oxide Material |
|---|---|---|---|---|
| SRO-CZO up to about 30 nm | SrRuO$_3$ | from about 3 to about 10 molar % | CaZrO$_3$ | from about 90 to about 97 molar % |
| LNO-CZO up to about 40 nm | LaNiO$_3$ | from about 10 to about 40 molar % | CaZrO$_3$ | from about 60 to about 90 molar % |
| SRO-LAO up to about 40 nm | SrRuO$_3$ | from about 6 to about 13 molar % | LaAlO$_3$ | from about 87 to about 94 molar % |
| LNO-LAO up to about 40 nm. | LaNiO$_3$ | from about 6 to about 13 molar % | LaAlO$_3$ | from about 87 to about 94 molar % |

Any of a variety of electrode materials may be used. For example, at least one first electrode, at least one second electrode, or any combination thereof, can be characterized as being a thin film. Suitable electrodes comprise at least one conducting oxide material, Pt, Pd, Ni, Au, Ag, Cu, Ir, Rh, Co, characterized as being a solid solution of the insulating oxide material and the conducting oxide dopant.

The total thickness of the one or more resistance-switching oxide layers can be at least about 6 nm, or at least about 8 nm, or at least about 10 nm, or at least about 12 nm, or at least about 14 nm, or at least about 16 nm, or at least about 20 nm. Suitable thin film thickness is up to about 40 nm, or up to about 35 nm, or up to about 30 nm, or up to about 25 nm, or up to about 20 nm, or up to about 15 nm. Suitable devices incorporate at least one of the resistance-switching oxide layers situated adjacent to the first electrode. Each of the resistance switching oxide layers comprises a conducting oxide dopant and an insulating oxide material as described throughout this patent application. Particularly desirable oxide layers may be selected from the following table:

Suitable resistance-switching oxide layers can be selected from the following table:

| Resistance-Switching Oxide Layer Type, Thickness (nm) | Conducting Oxide Dopant | Molar % Conducting Oxide Dopant | Insulating Oxide Material | Molar % Insulating Oxide Material |
|---|---|---|---|---|
| SRO-CZO, up to about 30 nm | $SrRuO_3$ | from about 3 to about 10 molar % | $CaZrO_3$ | from about 90 to about 97 molar % |
| LNO-CZO, up to about 40 nm | $LaNiO_3$ | from about 10 to about 40 molar % | $CaZrO_3$ | from about 60 to about 90 molar % |
| SRO-LAO, up to about 40 nm | $SrRuO_3$ | from about 6 to about 13 molar % | $LaAlO_3$ | from about 87 to about 94 molar % |
| LNO-LAO, up to about 40 nm. | $LaNiO_3$ | from about 6 to about 13 molar % | $LaAlO_3$ | from about 87 to about 94 molar % |

The isolation layers are suitably up to about 10 nm thick, or even up to about 8 nm thick, or even up to about 6 nm thick, or even up to about 5 nm thick. The isolation layers are suitably at least about 0.1 nm thick, or even at least about 0.2 nm thick, or even at least about 0.5 nm thick, or even at least about 1 nm thick, or even at least about 2 nm thick, or even at least about 4 nm thick, or even at least about 6 nm thick. Suitable isolation layers can be selected from the following table:

| Isolation Layer Type, Thickness (nm) | Conducting Oxide Dopant | Molar % Conducting Oxide Dopant | Insulating Oxide Material | Molar % Insulating Oxide Material |
|---|---|---|---|---|
| SRO-CZO, up to about 10 nm | $SrRuO_3$ | from 0 to about 7 molar % | $CaZrO_3$ | from about 93 to 100 molar % |
| LNO-CZO, up to about 10 nm | $LaNiO_3$ | from 0 to about 25 molar % | $CaZrO_3$ | from about 75 to 100 molar % |
| SRO-LAO, up to about 10 nm | $SrRuO_3$ | from 0 to about 10 molar % | $LaAlO_3$ | from about 90 to 100 molar % |
| LNO-LAO, up to about 10 nm. | $LaNiO_3$ | from 0 to about 10 molar % | $LaAlO_3$ | from about 90 to 100 molar % |

In certain embodiments, one resistance-switching oxide layer can suitably be situated adjacent on one side to a first isolation layer and situated adjacent on a second side to a second isolation layer, wherein the first isolation layer can suitably be situated adjacent to a first electrode, and the second isolation layer can suitably be situated adjacent to a second electrode.

Any of the electrode materials described herein above can be suitably used to make the switchable-resistance thin film devices of the present invention. For example, at least one first electrode, at least one second electrode, or any combination thereof, can be characterized as being a thin film. Suitable electrodes comprise at least one conducting oxide material, Pt, Pd, Ni, Au, Ag, Cu, Ir, Rh, Co, Os, Ru, Fe, Re, Mn, W, Mo, Cr, Ta, Nb, V, Hf, Zr, Ti, Al, doped Si, at least one conducting silicide, conducting metal nitride, conducting metal carbide, conducting metal boride, or any combination thereof. Among these, suitable conducting oxide materials include $SrRuO_3$, $LaNiO_3$, $CaRuO_3$, $BaRuO_3$, $PrNiO_3$, $NdPrO_3$, $PmNiO_3$, $SmNiO_3$, or any combination thereof. The first electrode, the second electrode, or both, can be suitably epitaxial with the resistance-switching oxide layer.

Any of a variety of insulating oxide materials can be used. Suitably, the insulating oxide material comprises $CaZrO_3$, $SrZrO_3$, $BaZrO_3$, $CaHfO_3$, $SrHfO_3$, $BaHfO_3$, $LaAlO_3$, $PrAlO_3$, $NdAlO_3$, $PmAlO_3$, $SmAlO_3$, $EuAlO_3$, $GdAlO_3$, $TbAlO_3$, $DyAlO_3$, $HoAlO_3$, $ErAlO_3$, $TmAlO_3$, $YbAlO_3$, $LuAlO_3$, $YAlO_3$, or any combination thereof.

The switchable-resistance thin film devices of the present invention can also incorpoate at least one thin film electrode suitably situated adjacent to a substrate. The thin film electrodes can be suitably deposited on a substrate, and then the device is built up layer-by-layer. Accordingly, at least one thin film electrode can suitably be situated adjacent to a substrate. Any of a variety of substrate materials can be used. In particular, the substrate comprises $SrTiO_3$. As a result, the substrate and first electrode may be epitaxial or not.

EXAMPLES AND OTHER ILLUSTRATIVE EMBODIMENTS

Examples of four material systems for non-volatile resistance switching Random Access Memory (RRAM) applications are described. These materials systems are made of active switching layers which are solid solutions of two compounds, symbolically represented as Aa, Ba, Ab, and Bb, where A and B are perovskite insulating compounds, and a and b are perovskite conducting compounds. This section focuses on A=$CaZrO_3$, B=$LaAlO_3$, a=$SrRuO_3$ and b=$LaNiO_3$. Although the list of these compounds can be expanded as described herein above, this section describes detailed working examples for each of them. Also described in this section are examples with different top electrodes, made of Pt, Ag, and Au, on top of the active switching layers. They illustrate working switching devices that have different switching polarity. The bottom electrode used in these working examples is $SrRuO_3$. Additional characteristics of RRAM devices described herein include switching behavior under UV irradiation, long term stability at high temperature (150° C.), and AC impedance giving resistive and capacitive characteristics. These results provide insight and confirmation of the hypothesized mechanisms that operate in these novel devices.

Provided herein are non-volatile random access memory (NVRAM) devices that hold information without power and operates in the nanosecond range. These devices are a desirable addition to future computer and mobile communication units where it may replace volatile RAM and other slow secondary storage devices currently in use.

It would be desirable to have a RRAM system that does not require forming, has a resistance value with a definitive dependence on cell area, and switches at a voltage close to 1 V. In this section, four new material systems with the above characteristics are taught for non-volatile RRAM applications. They are designed with a concept of metal-insulator transition, and are made by mixing, in a thin film, an insulating oxide with a large band gap and a conducting oxide with a narrow bandwidth. This mixture film is sandwiched between two electrodes with different work functions, which serve to define the polarity of switching. Persons skilled in the art understand the concept of work function, and further reference may be made to *CRC Handbook of Chemistry and Physics*, 83$^{rd}$ ed. Lie, D. R. (ed). P. 12-130, *CRC Press* (2002), hereby incorporated by reference. Without being bound by any particular theory of operating the insulator part provides a tunneling barrier around the sites that store the trapped charge, which renders the non-volatile property; the conductor part provides both the conducing paths and additional isolated sites, which serve as floating gates and regulate the current on the conducting paths by accepting trapped charge that causes a drastic decrease of the current on the conducting paths. The device does not need forming and can be switched between low resistance ($R_L$) and high resistance ($R_H$) within a bipolar voltage of ±2.5 V, with good reproducibility and fast switching speed.

A precise process, structure and composition control throughout the thin film heterostructure including the substrate, bottom electrode, mixture film, and top electrode ensures switchability. The effort on this aspect will be described first emphasizing pulse laser deposition which is a suitable method of fabrication, although it is rarely used for mass production. This is followed by a summary of the device performance and a discussion of the possible switching mechanisms. Further experiments that elucidate the switching mechanism are outlined at the end.

1. Process Control

The material systems studied were (conductor a or b-insulator A or B) SRO-CZO, SRO-LAO, and LNO-CZO and LNO-LAO (SRO for $SrRuO_3$, CZO for $CaZrO_3$, LAO for $LaAlO_3$ and LNO for $LaNiO_3$). Unless otherwise specified, SRO was used as bottom electrode and Pt as top electrode, which have a work function of 5.0 eV and 5.6 eV respectively. They behave very similarly in terms of almost all the performance parameters. However, the optimal composition is different for different systems.

All the oxides above share the same perovskite structure, which facilitates good microstructure control throughout the heterostructure. The memory effect proved to be very sensitive to the film structures of both the bottom electrode and the mixture. Accordingly, control of film growth and strain relaxation was implemented at every stage of deposition. Atomically flat mixture films were achieved with controlled strain relaxation on highly conductive SRO bottom electrode, itself deposited on single-$TiO_2$-terminated $SrTiO_3$ (STO) (001) substrate. These heterostructure films showed excellent resistance switching between initial low resistance and set high resistance with set-/reset-voltages around 2-2.5/1-1.5 V in positive/negative directions. The effect of processing condition, doping level, film thickness and cell area has been clearly identified to determine the optimum parameters, when appropriate. A prototypical device of a cell area of 80 μm in diameter possesses fast switching speed (~50 ns) and long durability. The conduction property in low and high resistance states has been studied in detail over a broad range of temperature to shed light onto the possible switching mechanism. Several other top electrode materials of different work functions were also studied to illustrate their effect on the polarity of switching. In addition, UV irradiation effect and AC impedance characteristics were studied in the high and low resistance states.

1.1 Experimental Set-ups

Single crystal STO (001) was used as the substrate. Bottom electrode SRO and mixture layer SRO-LAO, LNO-LAO, SRO-CZO and LNO-CZO were deposited by pulse laser deposition (PLD) using a KrF laser ($\lambda$=248 nm) with a laser energy of 200 mJ at a repetition frequency of 1-10 Hz in an $O_2$ pressure of 0.01-100 mTorr. The film thickness, orientation and crystallinity were determined by a four-circle x-ray diffractometer (Bruker-AXS D8) using a Cu K$\alpha$ source, and the surface morphology was observed by atomic force microscopy (AFM).

RF-sputtering was used for top Pt electrode deposition through a shadow mask. Other electrodes were deposited using an evaporator. Electrical properties were measured using several meters (Keithley 237, Agilent 81104A pulse generator, HP 4192A impedance analyzer and Keithley 7001 switch system) on a Signatone S-160 probe station for RT measurement and on a Lakeshore TTP6 probe station and a PPMS for low temperature measurement.

1.2 Substrate Preparation $SrTiO_3$ (STO) is composed of SrO and $TiO_2$ planes alternating along the <001> direction. Commercially available single crystals came with a certain miscut angle and miscut direction. Their surfaces are terminated with both SrO and $TiO_2$ planes. They also have many near-surface defects, many due to the high energy silicon colloid polishing used in preparing the single crystals. In order to control the film nucleation and growth, a reconditioned substrate with a controlled single-termination is desirable.

Figure 19:
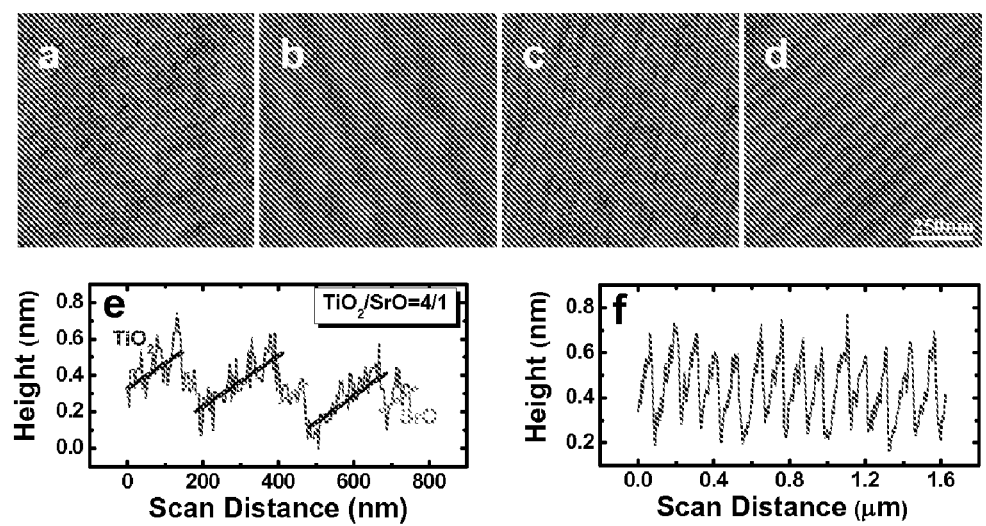
FIG. 19 STO (001) substrate morphology observed by AFM. (a) as received; (b) after 1100° C. annealing; (c) after BHF etching; (d) after final annealing at 1100° C.; (e) cross section analysis of (b); (f) cross section analysis of (d).

Single-$TiO_2$-terminated STO (001) substrates have been reported previously (M. Kawasaki, K. Takahashi, T. Maeda et al., "Atomic Control of the Srtio3 Crystal-Surface," Science 266 (5190), 1540-1542 (1994); G. Koster, B. L. Kropman, Gjhm Rijnders et al., "Quasi-ideal strontium titanate crystal surfaces through formation of strontium hydroxide," Applied Physics Letters 73 (20), 2920-2922 (1998)) and the preparation procedure was adopted here, with some modification, to better control the final quality. The as-received substrate (FIG. 19a) shows small height fluctuations (<0.6 nm) with short saw-tooth like step edges, on top of which some dimples and marks of mechanical polishing could be observed. Pre-etching annealing at 1100° C. for 1 hour was conducted firstly to remove these polishing defects and possible residual strain in the near surface layer. After that the substrate (FIG. 19b) shows clear step-terrace structures with step-height of 0.2 nm across the surface. These half-unit-cell-height steps indicate that the surface has mixed termination (with 20% SrO and 80% $TiO_2$ from the terrace width analysis), even though the $TiO_2$ plane has lower energy than the SrO one. The crystal was next ultrasonically agitated in H$_2$O for 30 min to activate the SrO layer before buffered HF acid (BHF) etching. After 15 sec etching in pH=5.9 BHF solution, the substrate was annealed again at 1100° C. for 1 hour to promote the crystal plane growth and straight step-edge formation. As shown in FIG. 19*d*, the annealed surface has evenly distributed straight step edges and atomically flat terraces with 0.4 nm height difference. This single-TiO$_2$ terminated, defect free STO (001) substrate was used for film deposition experiments.

1.3 Bottom Electrode Deposition

In order to achieve high crystallinity and maintain the stoichiometry of SRO thin film, relative high oxygen pressure was used during pulsed laser deposition (PLD). However, under high oxygen pressure certain defects, such as fissures, pin holes and step-bunching, will occur, which destroy the coherence between substrate and film. SRO deposition on STO (001) crystal by PLD was systematically studied to obtain defect-free films with atomically flat surfaces. These atomically flat SRO thin films have resistivity as low as 162 µΩ·cm at room temperature, which is comparable with single crystal.

Fissures and pin holes were frequently observed on TiO$_2$ terminated substrates with higher oxygen pressure (100 mTorr) and deposition temperature 600-800° C., as shown in FIG. 20*a-b*. With narrow terraces, the fissures and pin holes were along the initial steps. Randomly distributed pin holes were present on wider terraces. These fissures and pin holes could be eliminated by using lower oxygen pressure (1 mTorr). However, the films had very poor crystallinity and very high resistivity.

Figure 21:
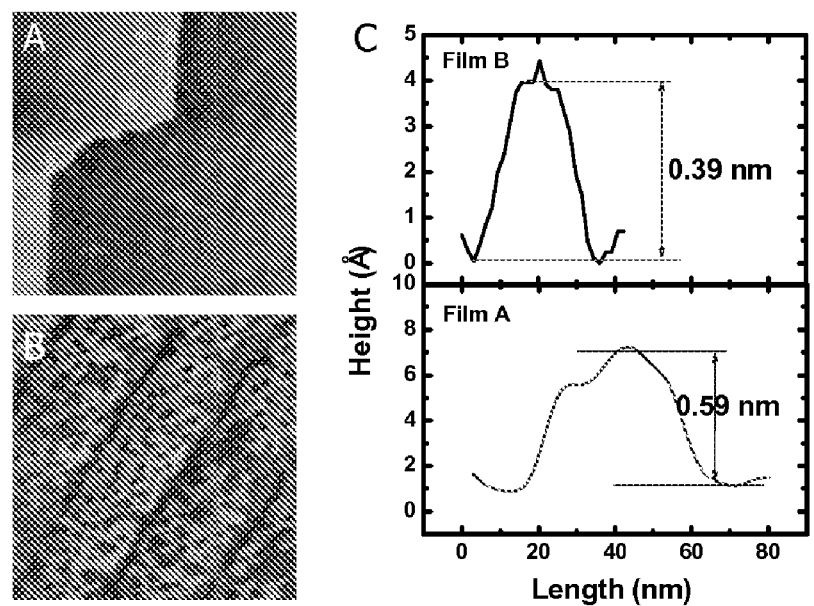
FIG. 21 AFM height images of $SrRuO_3$ films on $TiO_2$-terminated $SrTiO_3$ with thickness of (A) 0.3 ML, (B) 1.5 ML, and (C) cross section analyses of film A and B indicating island heights of 0.4 and 0.6 nm respectively.

To study the initial nucleation process of SRO on TiO$_2$ terminated STO, two films, one with less than 0.3 of a monolayer (0.3 ML) and the other a little more than a monolayer (1.5 ML) were made. On these two films, about 0.6 and about 0.4 nm high islands were observed, respectively (FIG. 21). SRO has a lattice parameter around 0.4 nm and there were two possible terminations along <001> direction, SrO or RuO$_2$, each with a layer height of 0.2 nm. The different island heights indicated that they had different compositions, 0.6 nm islands with 3 layers (SrO/RuO$_2$/SrO) and 0.4 nm islands with 2 layers (SrO/RuO$_2$), above the TiO$_2$ termination surface of the substrate. This termination conversion from RuO$_2$ to SrO was completed during the first monolayer growth. This conversion was due to the high volatility of RuO$_2$ at deposition conditions, as already reported.

Compared to 2-layer nucleation the 3-layer nucleation was a slower process and the nuclei had a lower mobility. These nuclei had a small probability to diffuse to the step-edge sites during the dwell time between laser pulses. With further film deposition, fissures were formed along the steps. Some of the fissures could be covered on the top when the film was thick enough. This will cause pin hole formation. This 3-layer nucleation happened when the substrate was TiO$_2$ terminated. On the other hand, fast 2-layer nucleation would occur with an SrO terminated substrate, since the nuclei are smaller and have a higher mobility allowing them to easily diffuse to the step sites and form smooth films.

Figure 20:
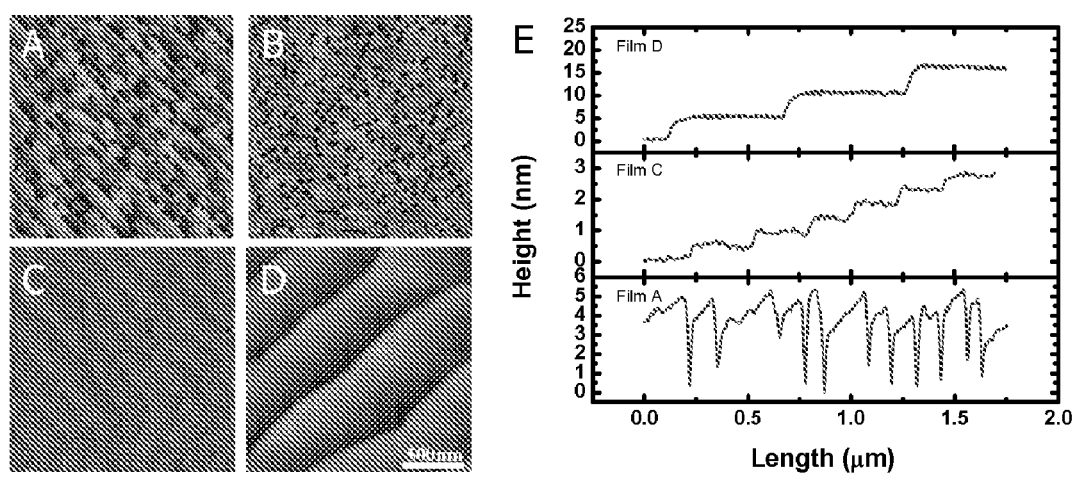
FIG. 20 AFM height images of SRO films on (A) $TiO_2$-terminated STO with miscut angle of 0.28°, (B) $TiO_2$-terminated STO (0.04°), (C) SrO-terminated STO (0.135°), (D) SrO-terminated STO (0.61°), and (E) cross section analyses of film A, C and D.

To avoid the 3-layer slow nucleation process, STO homoepitaxial nucleation was used to convert the TiO$_2$ termination to SrO termination. This could be achieved by a monolayer growth of STO in the step-flow growth mode. This SrO terminated substrate promoted 2-layer nucleation process and resulted in defect free SRO growth as indicated in FIG. 20(*c-d*). Films c and d were grown on a substrate with miscut angle of 0.135° and 0.61° respectively. The cross-section analysis clearly showed unit cell high steps on film c and super steps around 5 nm high on film d. This super step can cause strain relaxation near the step regime and form multi-domains.

Figure 22:
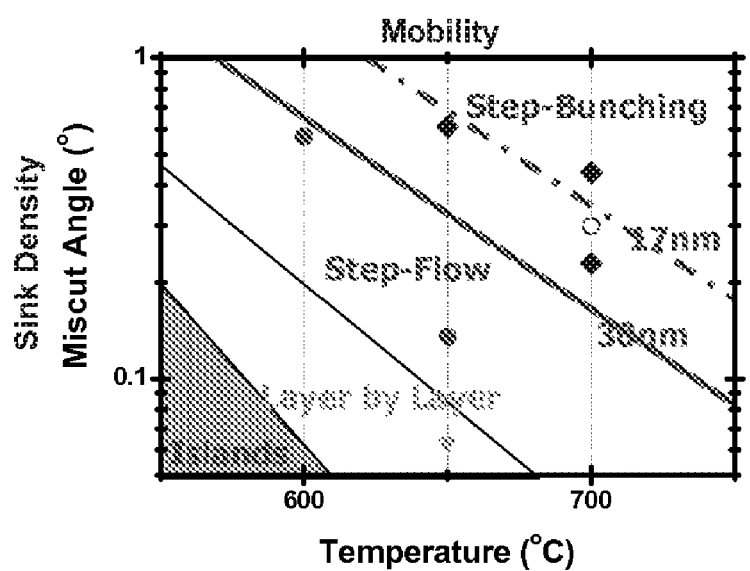
FIG. 22 Schematic diagram of film growth mode control by adatom mobility and sink density and scattered points indicating experimental results by adjusting deposition temperature, substrate miscut angle and film thickness, blue diamonds for step-bunching, red circles for step-flow and green triangular for layer-by-layer growth. Opened red circle was for film with 17 nm thick and all others were 30 nm thick. The blue solid line is the boundary between step-flow and step-bunching for 30 nm thick films and the dashed line for 17 nm thick films.

A map for film growth modes, shown in FIG. 22, could be constructed considering nucleation site density and adatom mobility. To avoid step-bunching, down-hill attachment of adatom rate should be suppressed. This could be achieved by lowering the kinetic energy through higher pressure and lower temperature, and by thermalizing the hot adatom through wider terrace. However, in order to keep the film grown in the step-flow mode, the kinetic energy should be high enough to allow the nuclei to diffuse over a terrace spacing. The experimental results with different miscut angles, deposition temperatures and thicknesses were plotted as dots in FIG. 22, which were consistent with the mobility and nucleation site density consideration.

With improved nucleation and stabilized step-flow grown, SRO films were atomically flat with a step structure of one unit cell height, as shown in FIG. 20*c*. High resolution X-ray analyses indicated the SRO film was almost fully pinned on STO (lattice parameters: out of plane 0.3958 nm, in plane 0.3905 nm) and highly crystallized (full width at half maximum of rocking curve 0.049°, similar to that of the single crystal substrate 0.03° around (002) diffraction). This film has excellent electrical property: the resistivity at room temperature was 162 µΩ·cm, which is much lower than the films with pin holes or step-bunching. Therefore, by eliminating porosity and surface super-step scattering, the thin film resistivity could be comparable with single crystal.

Figure 23:
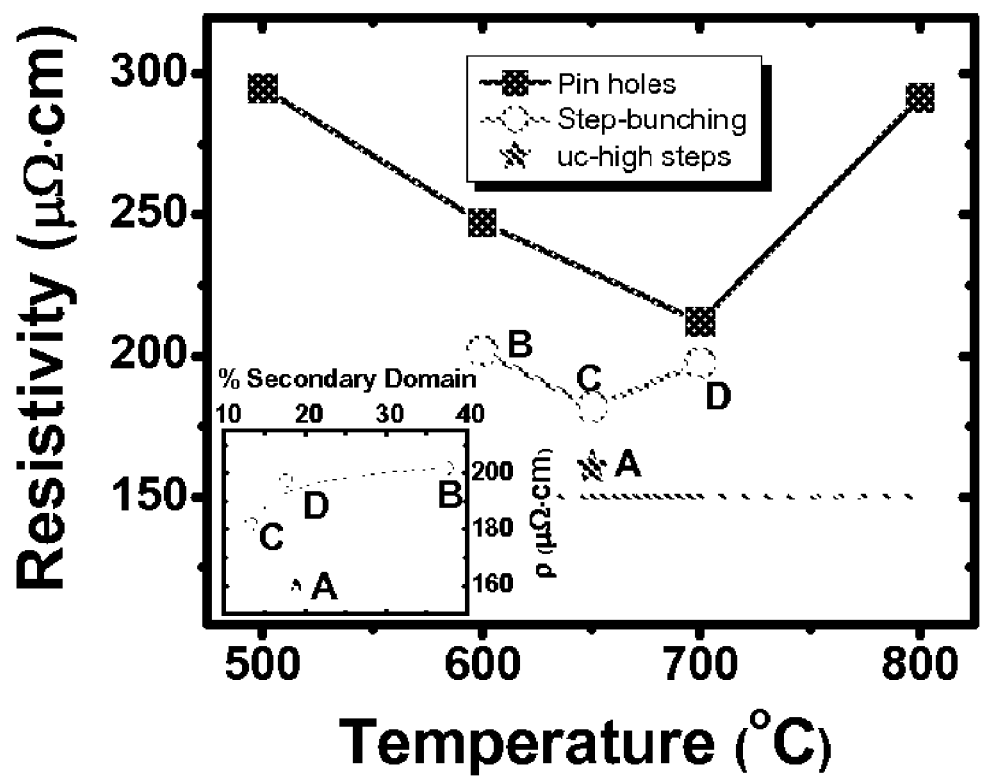
FIG. 23 Room temperature resistivity of SRO films, grown at various temperatures. Squares for films with fissures and pin holes, circles for films with step-bunching, star for film with steps of unit cell height, and dotted line for single crystal. Films deposited with low oxygen pressure (1 mTorr) have resistivity above 500 $\mu\Omega$·cm (not shown). The domain-structure dependence of resistivity is shown as inset for films A-D.

To further investigate the crystal quality of SRO thin films and its relation to resistivity, we studied the in-plane domain structure by off-axis azimuthal φ scan of a non-degenerate SRO reflection (221) of several films (marked as A-D in FIG. 23). As shown in the inset of FIG. 23, resistivity increases with secondary domain content, but the step-bunched films clearly have a higher resistivity overall. So carrier scattering by domain walls in the strain-relaxed region appears not to be as important as surface scattering. Therefore, although multi-domain nucleation is difficult to avoid with increasing film thickness, by suppressing step-bunching high quality conducting SRO films can still be achieved.

1.4 Mixture Layer Deposition

Mixture layers with a certain ratio of LAO and LNO were grown by PLD with various deposition conditions, oxygen pressure and substrate temperature, on the atomically smooth SRO bottom electrode.

For SRO on STO the misfit strain is 0.64% (SRO is pseudo-cubic, lattice constant=0.393 nm; likewise, lattice constant=0.3905 nm for STO), which implies a critical thickness around 18.4 nm before strain relaxation by misfit dislocations. In perovskite oxides, the dominant dislocation system is <110> {110}. However this critical thickness is obtained without accounting for the kinetic effect and there were several reports indicating that a SRO film with a thickness much larger than this critical value can still be free of misfit dislocation. This is consistent with the results reported herein. Even though there is no direct evidence for misfit dislocation formation in our SRO films, the misfit strain was still partially relaxed by the minor secondary domain formations.

Figure 24:
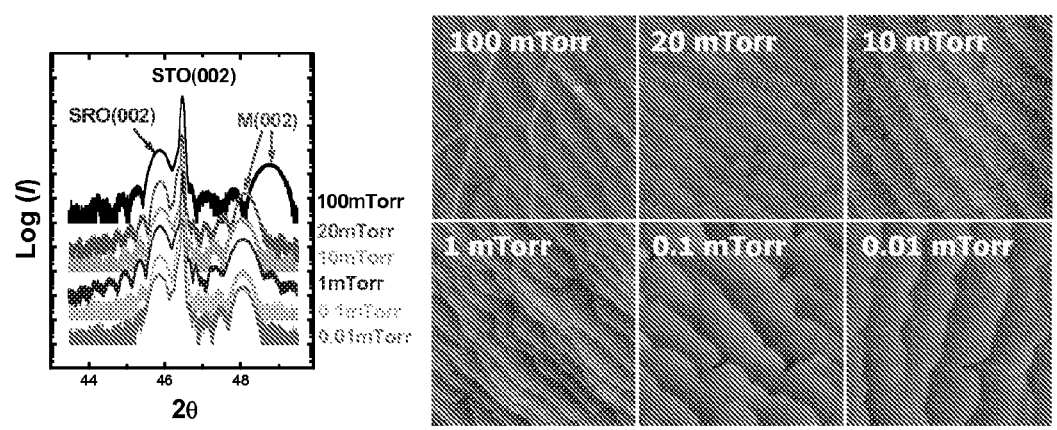
FIG. 24 AFM height images of LNO-LAO mixture films deposited at 600° C. with various oxygen pressures and the corresponding XRD patterns.

The mixtures have a much smaller lattice constant (0.380 nm for 10% LNO+LAO, between LAO (0.379 nm) and LNO (0.383 nm)) than STO, giving a tensile misfit strain of 2.7%. One set of films were prepared with 10% LNO doped LAO, deposited at 600° C. with various oxygen pressures from 0.01 to 100 mTorr (FIG. 24). All the films were grown in the layer-by-layer mode with smooth step-terrace structures similar to the original substrate. However, a large amount of cracks formed in the film deposited at 100 mTorr. Most of the cracks are along the <100> directions and some along the <110> directions. This film has the smallest out of plane lattice parameter (0.373 nm) among all the films, which typically have an out of plane lattice parameter around 0.378~0.379 nm. The FWHM of rocking curve (FIG. 26) is almost constant when the oxygen pressure is higher than 0.1 mTorr and rapidly increases when the oxygen pressure is lower. The FWHM increases slightly at 100 mTorr probably due to the high density of cracks which break the long range coherence.

Figure 25:
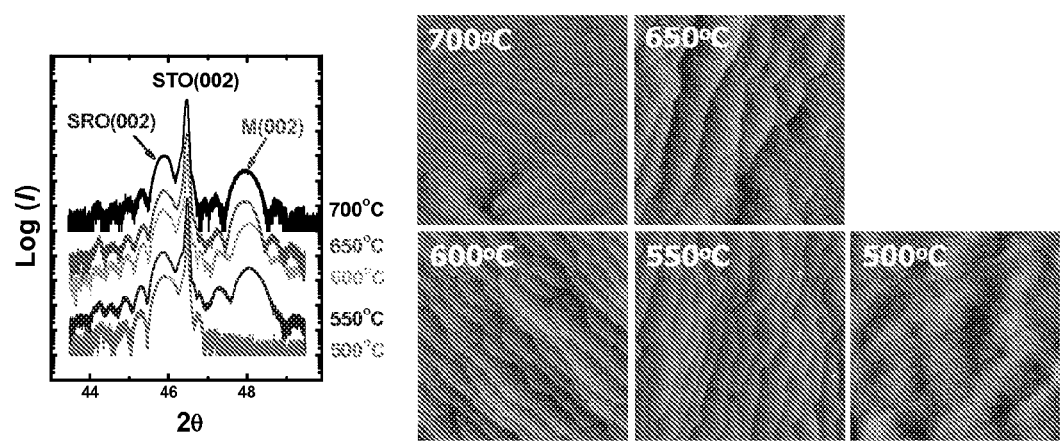
FIG. 25 AFM height images of LNO-LAO mixture films deposited with 1 mTorr oxygen at different temperature and the corresponding XRD patterns.
Figure 26:
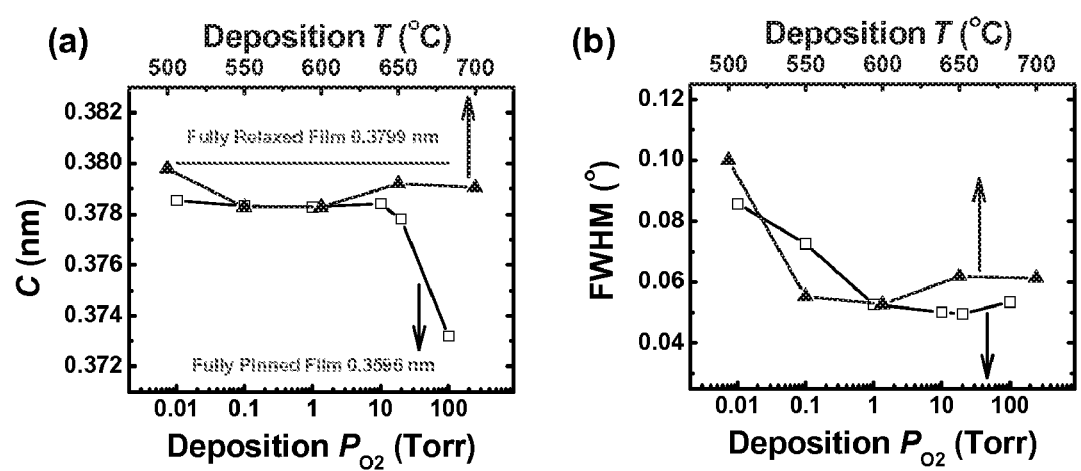
FIG. 26 Deposition pressure and temperature effects on the out of plane lattice parameter and FWHM of rocking curve around (002) diffraction.

Another set of films with 10% LNO doped LAO were deposited with oxygen pressure of 1 mTorr at various substrate temperature from 500 to 700° C. (FIG. 25). All the films have step-terrace structure due to the layer-by-layer growth mode, and they have no cracks. However further XRD analysis indicated that the film grown at 500° C. is not crystallized at all and the others have out of plane lattice parameter of 0.3782~0.3792 nm, which is close to the fully relaxed value. The films deposited between 550° C. and 600° C. have minimal FWHM (FIG. 26).

Without being bound by any theory of operation, the mixture of LNO-LAO is tightly pinned on the bottom electrode when the film was deposited with 100 mTorr oxygen. At this thickness the strain energy built up throughout the mixture layer is higher than the energy needed to form new surface; this elastic energy drives the formation of cracks along some of the lower energy crystal planes (001) and (011), which lowers the total energy of the mixture layer. The crack formation was evidenced by crack density increasing with time during ambient temperature storage, which was continuously monitored using AFM measurement after the film was removed from the deposition chamber. This post-deposition crack formation indicates that the difference in thermal expansion coefficients is also a source of the high strain energy. This source of strain energy could not be removed by slow cooling after deposition.

From a kinetic point of view, the high pressure condition in film growth appears to be equivalent to the low temperature condition. Unfortunately the film could not be crystallized at the equivalent low temperature of 100 mTorr. When the deposition temperature is high or oxygen pressure is low, the incoming atoms have a higher kinetic energy and multi-domain or very small nanograin structure was formed, which further releases the strain energy and causes the out of plane lattice parameter to approach the fully relaxed value. The larger FWHM at higher temperature and lower pressure clearly indicates a more pronounced multi-domain/nanograin structure.

In summary, to prevent crack formation and enhance the film crystallinity, medium temperature (550-600° C.) and oxygen pressure (0.1-20 mTorr) is desirably used for LNO-LAO mixture layer deposition.

Figure 27:
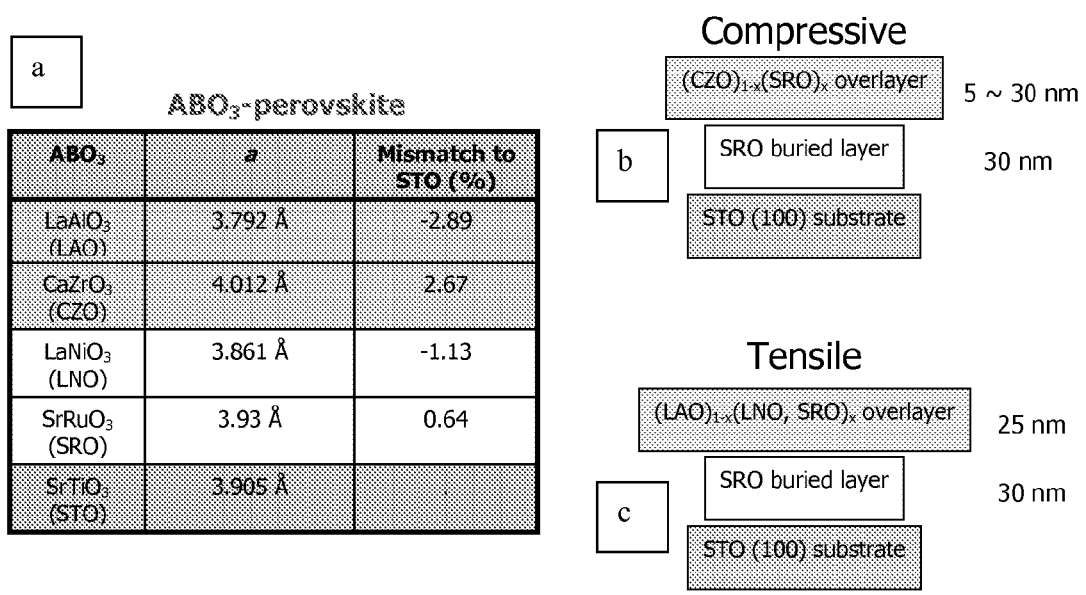
FIG. 27 Summary of the lattice constants and the strains in the mixture films.

The above description serves as an example of mixture layers. Other mixture layers, LNO-CZO, SRO-CZO, SRO-LAO were also prepared using laser ablation, and each was synthesized to achieve high crystallinity and smooth surfaces. These systems encompass several combinations of tension/compression strain in the mixture films. A summary of the lattice constants and the strains in the mixture films is provided in FIG. 27.

3. Resistance Switching

Figure 28:
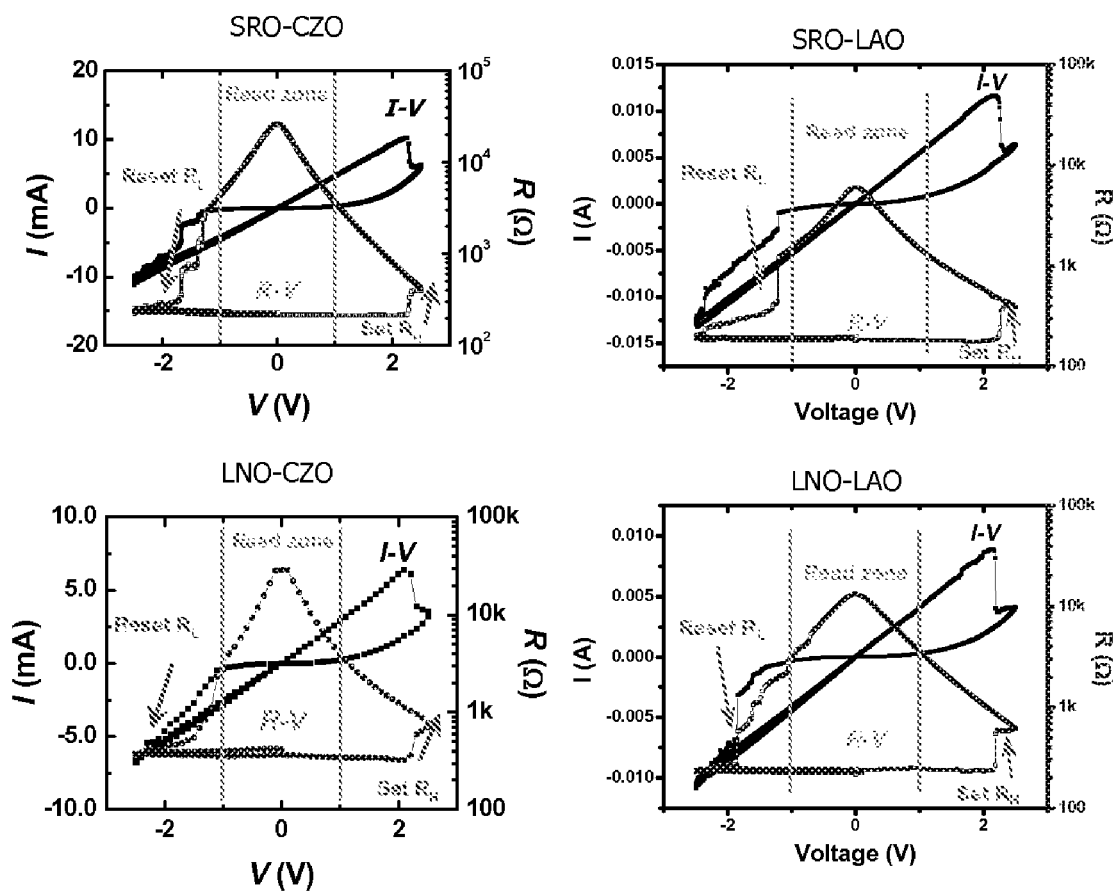
FIG. 28 I-V (R-V) curve of Pt/LNO-LAO/SRO, Pt/SRO-CZO/SRO, Pt/LNO-CZO/SRO and Pt/SRO-LAO/SRO heterostructure.

Current-voltage (I-V) curves were measured in both continuous and pulsed voltage-sweep modes. We define positive bias as the one causing current to flow from the Pt top electrode through the mixture film to the SRO bottom electrode. A typical room temperature (RT) I-V curve of a Pt/LNO-LAO/SRO heterostructure with a mixture thickness of 24 nm and a Pt electrode diameter of 80 μm is shown in FIG. 28 for the voltage sweep of 0 V→−2.5 V→0 →2.5 V→0→−2.5 V→0 V. (The behavior of SRO-CZO, SRO-LAO and LNO-CZO, also shown in FIG. 28, is nearly identical.) The I-V curve was recorded in the voltage-control mode and was the same for both the continuous and the pulsed mode. The mixture shows a low initial resistance ($R_L$=100-400Ω) and this low-resistance (LR) state is stable under negative bias. Under a positive bias, it is still stable below 2 V, but the resistance suddenly increases to a larger value ($R_H$=10-20 kΩ) when the bias exceeds 2 V. This high-resistance (HR) state is kept until a negative bias of 1-1.5 V is applied, which switches the resistance back to its initial low resistance. This switching behavior between the two stable resistance states demonstrates a pronounced memory effect, with a set-voltage of 2-2.5 V and the reset-voltage of −1V to −1.5 V. It also allows a read-voltage between −1 V and 1 V without disturbing the HR and LR state.

In the present device having a top-electrode cell diameter of 80 μm and a bottom (SRO) electrode thickness of 30 nm the bottom electrode has contributed to an estimated resistance (100-200Ω) close in magnitude to the $R_L$, which makes the low resistance value largely insensitive to the processing conditions, cell geometries and doping level.

The resistance states can be kept for a long time as verified by the following retention experiments. First, two different cells on the same substrate were switched to the HR/LR state, respectively. After that the sample was disconnected. The sample was reconnected after a certain time to probe the resistance state using a read voltage of 0.2 V that does not disturb the resistance state. We found no decay of $R_H$ and $R_L$ values for both resistance states after 5 days at room temperature. This indicates that there is no need for an electrical source to maintain the resistance state, i.e., the memory is nonvolatile.

Figure 29:
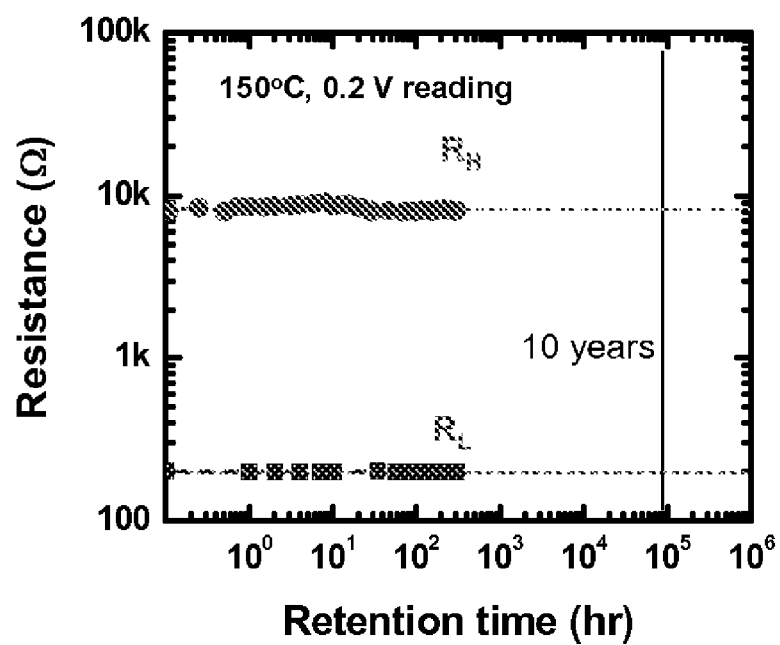
FIG. 29 Retention test of 4.5% SRO-CZO system at 150° C. for 300 hrs.

The above experiment was repeated by heating the sample to high temperature. The sample was first switched to either HR or LR state, then disconnected and placed in a heater heated to 150° C. The sample was removed from the heater from time to time to measure the resistance at a low voltage. As shown in FIG. 29, the resistance of the HR and LR state can be retained for a long time. In all cases, we found the LR to be particularly stable. The retention of HR is the best in the composition of 4.5% SRO-CZO. Other compositions can also be stabilized when the mixture layer is sandwiched between two isolation layers (for example, in the following three-layer arrangement: 5 nm 4.5% SRO-CZO/10 nm 5.5% SRO-CZO/5 nm 4.5% SRO-CZO), resulting in a significant improvement in the retention. As will be explained further below, and not intending to limit the scope of the invention, these results indicate that the degradation of the HR state is associated with charge leakage from the interior of the mixture layer and not from the interface between the mixture layer and the electrodes, and such leakage can be prevented by having isolation layers on outer sides with a composition of a lower conduction content than the center of the mixture layer.

Figure 30:
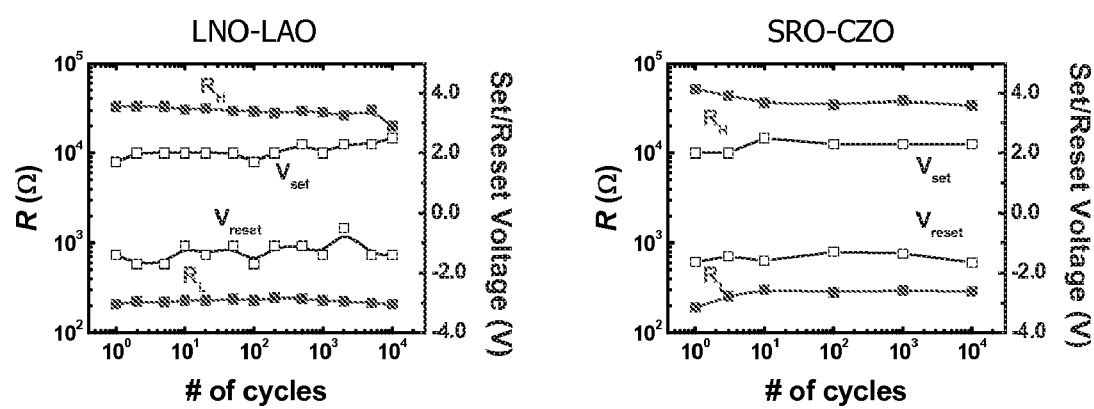
FIG. 30 $R_L$, $R_H$ and set/reset voltages as a function of write/erase cycles.

Excellent reliability of the devices has been assessed in several ways. First, the yield on a single substrate reached 90% (90% of all the cells manufactured on one STO substrate were functional.) Second, the devices stored in air for several months experienced no memory lapse. Third, after repeated switching the wear-off of the switching voltage and the resistance ratio was relatively minor, as shown in FIG. 30.

Figure 31A:
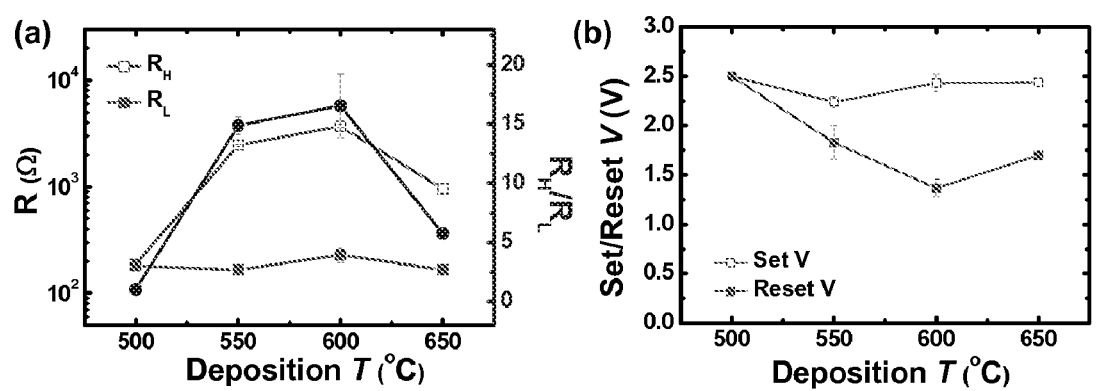
FIG. 31a Deposition temperature effect on switching properties in 12.5% LNO-LAO.
Figure 31B:
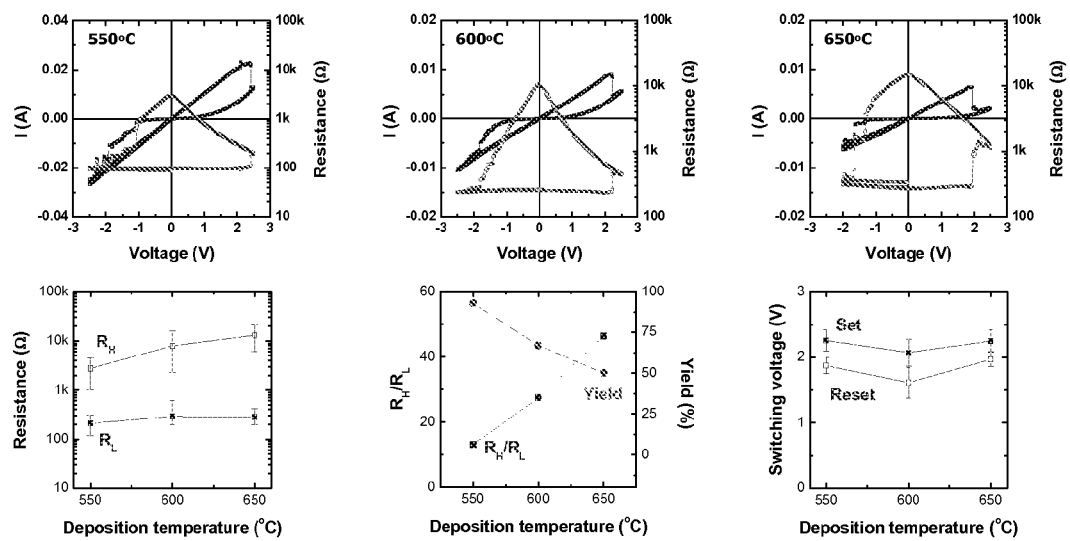
FIG. 31b Deposition temperature effect on switching properties in 5.5% SRO-CZO.

The mixture deposition conditions, especially the deposition temperature, have a dominant effect on some switching performance as shown in FIG. 31a. The switching ratio $R_H/R_L$ has a maximum around 550° C.-600° C. but the set/reset-voltages are not apparently sensitive to deposition temperature. Another example is shown in FIG. 31b. Generally, there is an optimal deposition temperature where the films show the highest yield or the best switching behavior.

Figure 32A:
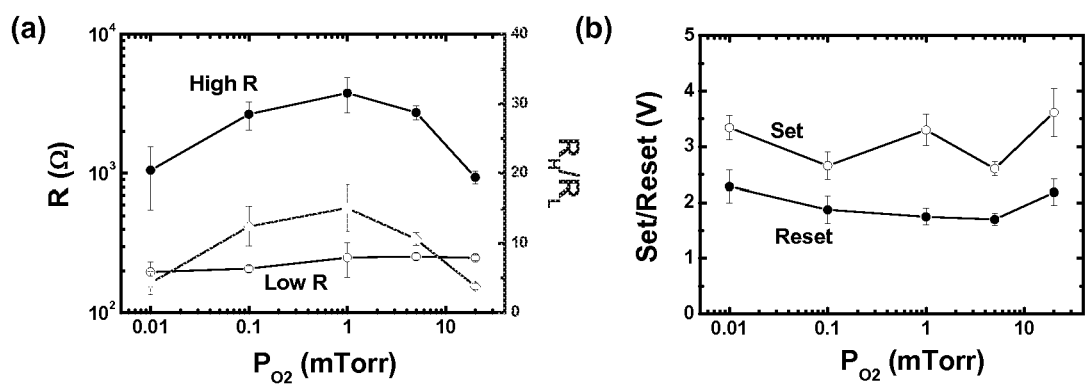
FIG. 32a Deposition pressure effect on switching properties in 12.5% LNO-LAO.
Figure 32B:
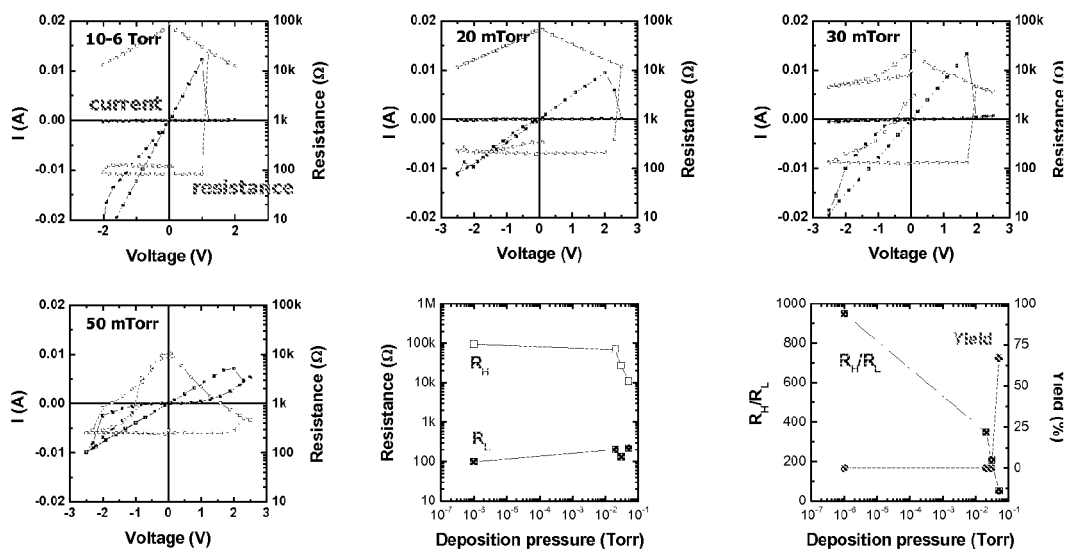
FIG. 32b Deposition pressure effect on switching properties in 5.5% SRO-CZO.

Deposition pressure also has some effect on the switching properties of the mixture. The switching ratio reaches a maximum and set/reset-voltages reach a minimum around 0.1-5 mTorr as shown in FIG. 32a. The films deposited with low pressure behave similarly to those deposited at high temperature. The film deposited at 100 mTorr that has many cracks shows a linear I-V curve, which is likely due to Pt ingress into the cracks during the deposition of top electrode. This possibility cannot be ruled out in films deposited with an oxygen pressure of 10-20 mTorr either; here cracks were not usually found under AFM examination although they were once found in a film deposited at 600° C. and 20 mTorr. Another example is shown in FIG. 32b. Generally, there is a preferred condition found at the intermediate pressure.

Figure 33A:
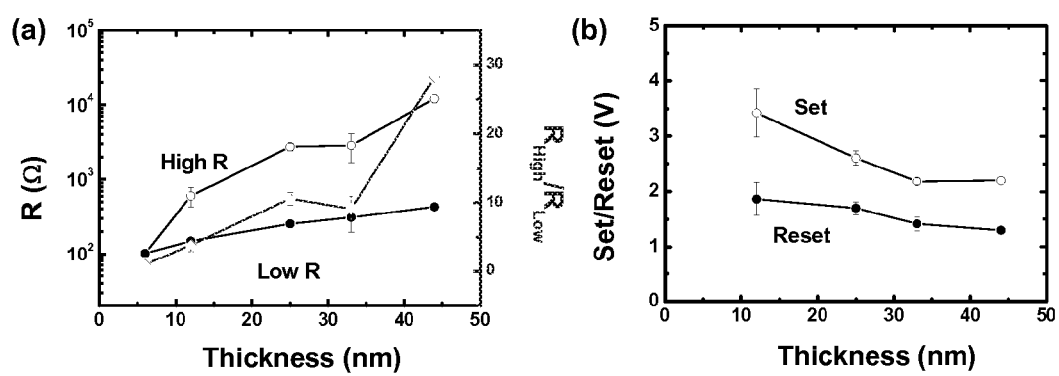
FIG. 33a Mixture film thickness effect on switching properties in 12.5% LNO-LAO.
Figure 33B:
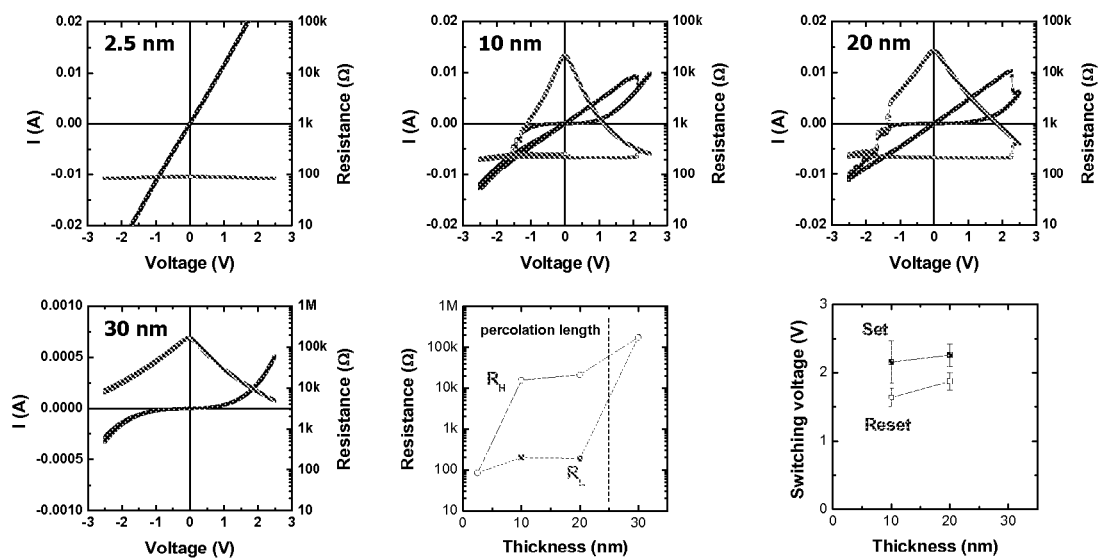
FIG. 33b Mixture film thickness effect on switching properties in 4.5% SRO-CZO.

The switching property is sensitive to the mixture thickness. When the film is thin (6 nm), the high resistance state could not be readily achieved even with a large voltage bias. On the other hand, in thick films (>44 nm) the low initial resistance is apparently lost and the film presents non-linear I-V behavior without switching. At the intermediate thickness resistance switching is obtained. The switching ratio increases and set/reset voltages decrease with increasing film thickness as shown in FIG. 33 for 12.5% LNO-LAO mixture films and 4.5 and 5.5% SRO-CZO mixture films. If the initial low resistance state is assigned to conductor and the initial high resistance state to insulator, then this conductor/insulator transition that occurs with increasing thickness may be explained by a percolation with a percolation length around 36-44 nm. At the same time, the thickness dependence of switching property rules out the interface effect as a possible mechanism. The set/reset-voltages are weakly dependent on film thickness which indicates that the switching is more related to the voltage bias.

Figure 34A:
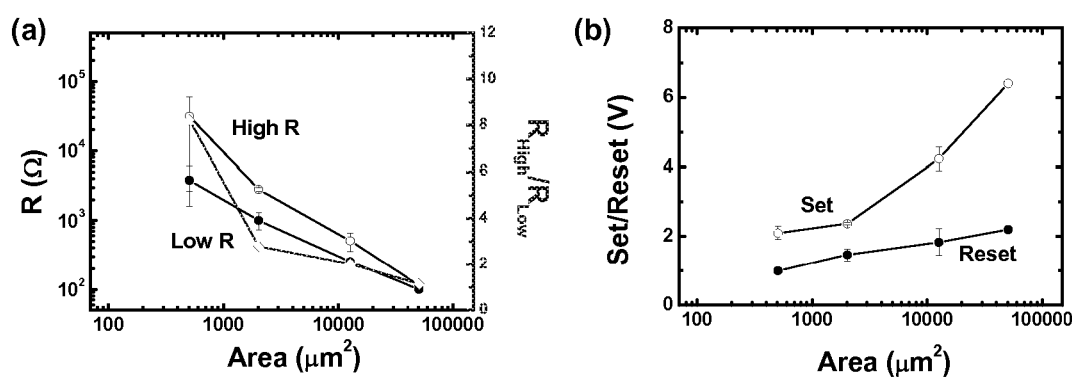
Figure 34B:
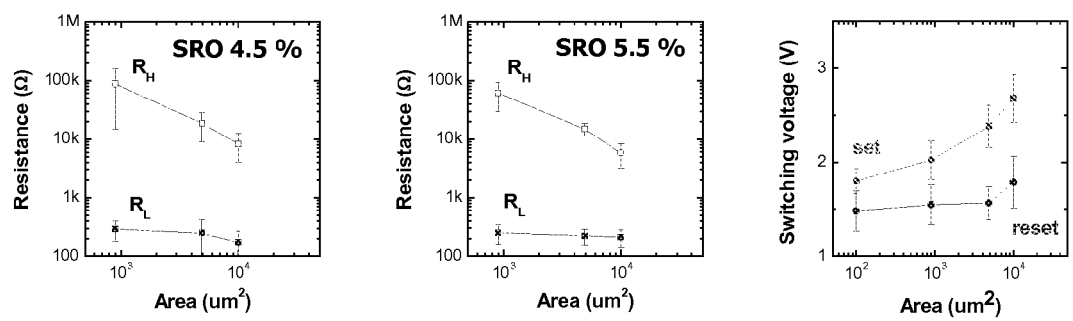

The cell area dependence of switching is shown in FIG. 34 with the top electrode diameter changing from 25 μm to 254 μm for LNO-LAO and from 30 μm to 100 μm for SRO-CZO. Both $R_L$ and $R_H$ are inversely proportional to the cell area but $R_H$ is more sensitive to the cell area than $R_L$. The set/reset voltages increase with the cell area.

Figure 35A:
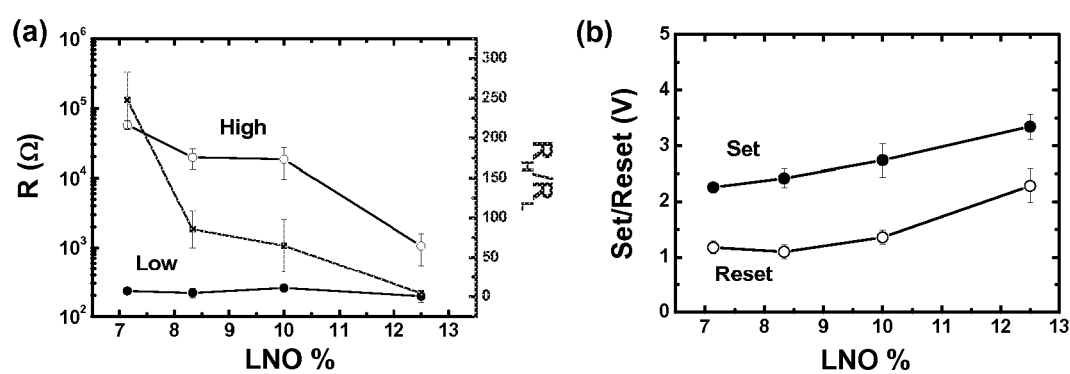
FIG. 35a LNO doping level effect on switching properties in LNO-LAO.
Figure 35B:
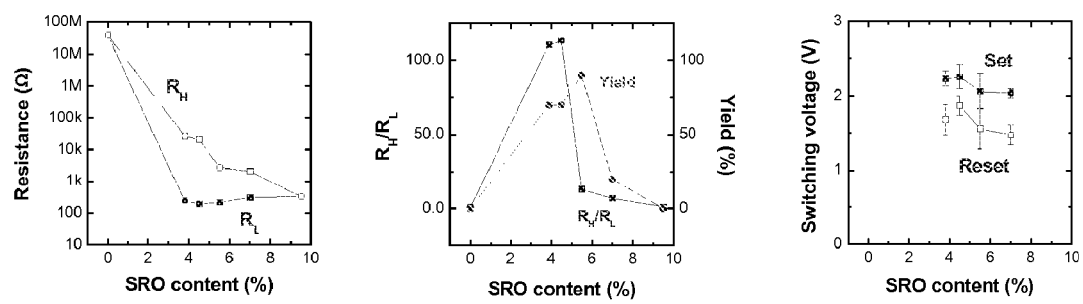
FIG. 35b SRO doping level effect on switching properties in SRO-CZO.

The doping level of SRO or LNO, which is the conducting component, has an important effect on the switching property. Insulating films without the switching property were found for a mixture of <3% of SRO or LNO. Conducting films without switching property were found for a mixture of a higher composition that depends on the type of mixture of insulating component and conducting component. Clear switching was consistently observed in the films with 6-13% LNO-LAO and 4-7% SRO-CZO as shown in FIG. 35a-b. The $R_H$ decreases with doping level, which results in a smaller switching ratio at high dopant concentration. At the same time, set/reset voltages increases with doping. The nearly two-fold difference in the optimal composition could be due to the different optimal deposition conditions used for the two systems, the optimal deposition temperature tends to be higher and the pressure lower in the LNO-LAO system than in the SRO-CZO system.

Figure 35C:
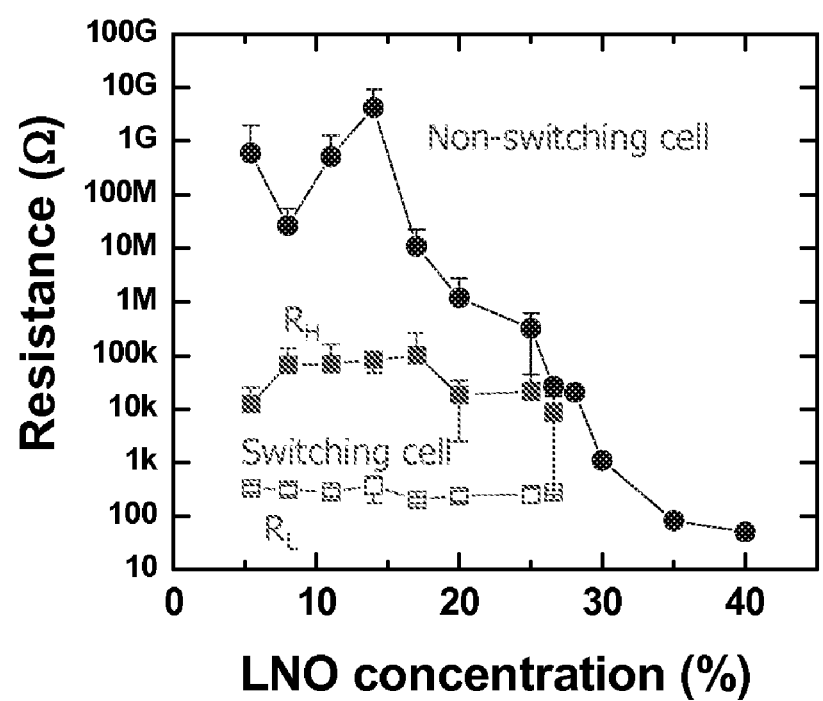
FIG. 35c LNO doping level effect on switching properties in LNO-CZO, with highest yield obtained near 25% LNO.

For the SRO-LAO and LNO-CZO systems, optimal contents of conduction components in the mixture layer were also found. For the SRO-LAO system, switching was found with 6-13% LAO, and the optimal composition was 9-12% SRO. For the LNO-CZO system, switching was found with 8-35% LNO and the optimal composition was 20-30% LNO as shown in FIG. 35c.

Without being bound by any theory of operation, the different optimal composition of the conducting component may reflect the different wave functions of the electrons in the conduction component and the charge disorder in the system. It is generally believed that the wave function of Ru electrons is more extended than that of Ni electrons. Thus it is easier to establish conducting paths for Ru electrons than Ni electrons. In the LNO-LAO system, the same La is shared in both the conducting and the insulating components, so there is no charge disorder, which may facilitate conduction so that a relatively low content of LNO is required for optimal switching. On the other hand, in the LNO-CZO system, the different charge states of La (3+) and Ca (2+) create charge disorder which may disturb conducting paths, so that a relatively high content of LNO is required for optimal switching.

Figure 36:
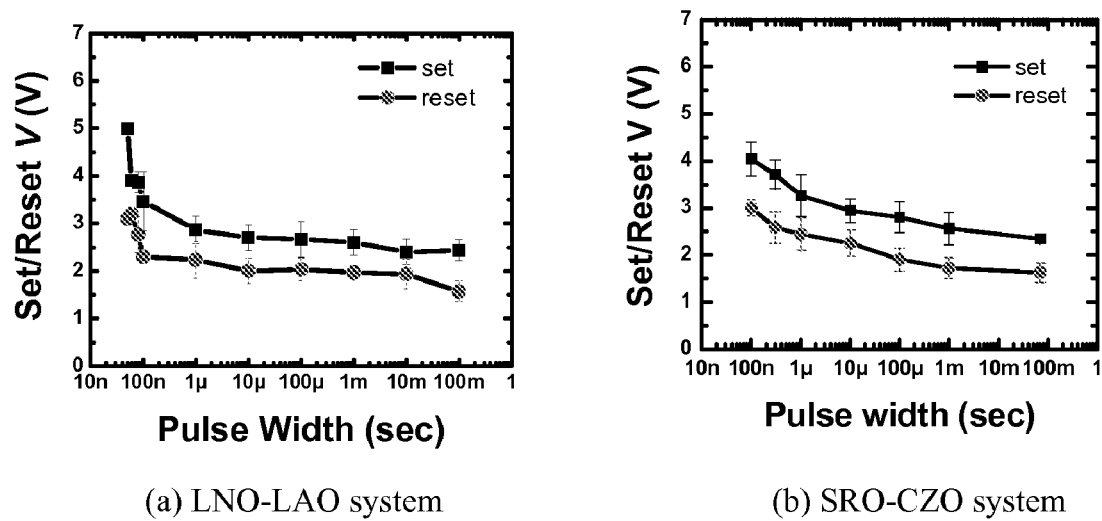
FIG. 36 Effect of pulse voltage width on switching time.

The switching speed of the memory effect was studied in the pulsed mode. A voltage pulse of a set amplitude but varied width in the positive (negative) polarity was applied to the cell to set (reset) the resistance state to $R_H$ ($R_L$), after that the resistance was read at 0.2 V. When the pulse width is longer than 1 μs, the switching voltage required is weakly dependant on the pulse width for both set and reset processes as shown in FIG. 36. However the set/reset voltages quickly increase when the voltage pulse width is shorter than 1 μs, with 50 ns being the shortest width required for the range of voltage tested. Without being bound by any particular theory of operation, this sharp increase of set/reset voltage is probably related with the $R_C$ time constant of the circuit. The capacitance of the cell was measured for both the low and high resistance states as mentioned later. In the high resistance state, the capacitance is 0.1 nF which is the same as the geometric value assuming the dielectric layer is pure LAO (0.08 nF). In the low resistance state the capacitance (0.12 nF) is slightly larger, possibly indicating the SRO/LNO dopants acting as a metallic internal electrode that increases the effective electrode area or decreases the interelectrode distance. The $R_C$ time of the circuit is around 36 ns (with $R_L$ of 300Ω and C=0.12 nF) and 400 ns (with $R_H$=4000Ω and C=0.1 nF) for low and high resistance states respectively, which is comparable to the pulse width where the set/reset voltages begin rising.

4. Resistance-switching: Temperature, Voltage, and Anisotropy

Figure 37:
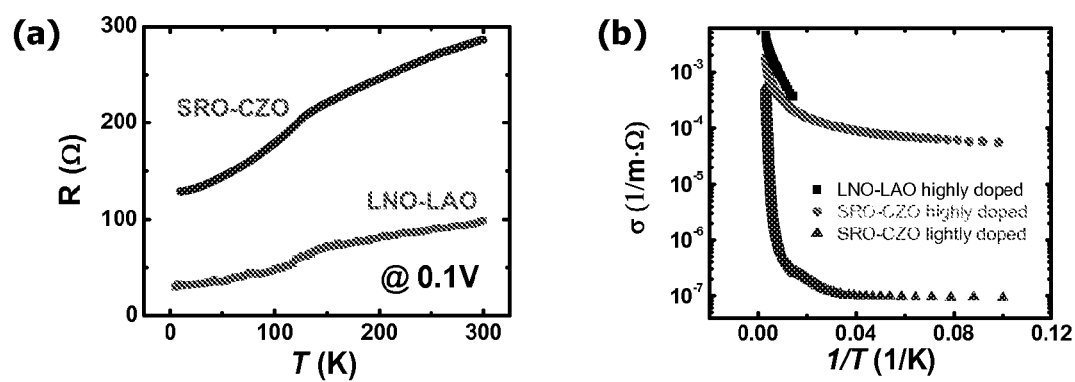
FIG. 37 Temperature dependent conductivity properties of (a) low and (b) high resistance states of SRO-CZO and LNO-LAO.

Temperature dependence of the resistance was measured for both LR and HR states from cryogenic temperatures to 300K (RT) as shown in FIGS. 37a and 37b, respectively. The decrease of the initial low resistance upon cooling indicates that a metallic path exists through the mixture in the as-fabricated device. There is a broad kink around 110-150 K resembling the ferromagnetic to paramagnetic transition of SRO itself. The resistance appears to have a linear/quadratic dependence on temperature above/below this transition. This $T^2$ dependence indicates that the electron-electron scattering dominates the electron-phonon scattering processes at lower temperature, similar to LNO below 50 K. The transition at the kink also indicates that the bottom electrode SRO makes a large contribution to the $R_L$.

On the contrary, the resistance increases with lowering temperature for the high resistance state as shown in FIG. 37b, which clearly reveals the insulating characteristics of the HR state. In the plot of log resistance versus 1/T, the slope is the activation energy in the Arrhenius relation. Therefore, the shape of FIG. 37b indicates that the resistance significantly deviates from a linear Arrhenius relation. The activation energy is 0.07 eV (0.2 eV) for highly (lightly) doped sample at 300 K and 0.01 eV for all the samples at 70K, all estimated using the data measured at 0.01 V. These activation energies are much smaller than the one expected for electron activation in LAO over a band gap of 5.6 eV. (P. W. Peacock and J. Robertson, "Band offsets and Schottky barrier heights of high dielectric constant oxides," Journal of Applied Physics 92 (8), 4712-4721 (2002)) The small activation energy indicates that the electronic processes that provide conduction in the high resistance state occur at energies close to the Fermi level. Data of SRO-CZO share the same characteristics.

At lower temperature (<26 K) the conductivity is not temperature dependent in the lightly doped SRO-CZO mixture film. Without being bound by any theory of operation, this behavior indicates that direct tunneling (DT), trap assisted tunneling (TAT), or fluctuation induced tunneling (FIT) is the dominant conduction mechanism. The current, however, is very sensitive to the doping level at lower temperature (a nearly 3 orders of magnitude decrease from a highly doped mixture to a lightly doped mixture). Since the tunneling current in the TAT process is proportional to the trap (doping)

concentration, these data are consistent with the TAT mechanism at lower temperature. Without being bound by any theory of operation, at higher temperature, the data that do not obey Arrhenius relation show $\log(\sigma) \propto T^{-1/4}$ relation. This dependence is predicted by the variable range hopping (VRH) model introduced by Mott to describe the charge transport in disordered solids. In this process, hopping of charge carriers within the band (width kT) of localized states (traps) at the Fermi level is envisioned. As the temperature decreases, the distance between available localized states within an energy difference of <kT increases, and the VRH conduction becomes difficult. At a sufficiently low temperature, the conduction mechanism switches from VRH dominance to TAT dominance. Our data indicate this switch increases from 177 K for lightly doped SRO-CZO mixture to 280 K for highly doped SRO-CZO mixture, suggesting that the trap concentration has a decisive effect on the dominant conduction mechanism.

Figure 38:
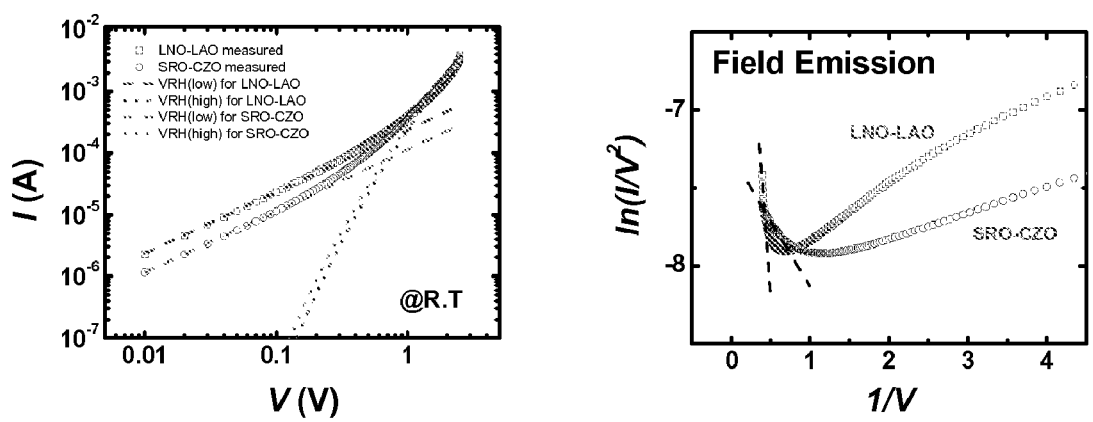
FIG. 38 I-V curve fitting by (a) VRH and (b) Field emission at low and high bias.

Without being bound by any theory of operation, the RT I-V curves at lower voltage could be fitted with the VRH model, modified to account for the field effect (FIG. 38a). (J. J. van Hapert, "Hopping conduction and chemical structure: a study on silicon suboxides," dissertation, University of Utrecht, 89-93 (2002). At voltage greater than 2 V, they deviate from the VRH fitting and a linear relation between $\ln(I/V^2)$ and 1/V was found as shown in FIG. 38b. This transition from VRH dominance to field emission (Fowler-Nordheim tunneling) dominance may occur when the voltage bias becomes larger than the barrier height, changing the barrier from a rectangular shape to a triangular shape, which facilitates the field emission process. A similar behavior was also observed at low temperature in the TAT regime in the SRO-CZO sample.

Without being bound by any theory of operation this metal-insulator transition under a bipolar voltage bias apparently happens in a small thickness and doping level window as already discussed in the previous section. The low-resistance, initially conducting metallic state is lost when the film is thicker than the percolation length. This length is dependent on the doping level: the higher the doping level, the larger the percolation length (in LNO-LAO, it is 44 nm with 13%, 33 nm with 10%, and 25 nm with 4.5%, all with 80 μm top electrode). The VRH conducting mechanism for $R_H$ at room temperature and metallic state for $R_L$ indicate that the conduction is through the SRO/LNO paths inside the insulating LAO/CZO matrix. Such conducting path does not exist across the surface, since we measured a very high resistance between two nearby top electrode pads when the mixture film (both LNO-LAO and SRO-CZO) was deposited on STO without a bottom electrode SRO. Therefore the film has anisotropic transport properties along the thickness direction and the surface direction, which is a great advantage for making high density devices.

The descriptions of the new devices provided herein is not intended to be restricted by the following statement, which offers a tentative switching mechanism in these thin films. Initially, in the as-fabricated state, some of connected conducting paths of SRO/LNO go through the film thickness and provide the metallic conduction. At this point the energy levels of SRO/LNO sites are more or less aligned around the Fermi level of SRO/LNO with a narrow bandwidth (B). This is the LR state. When a high enough positive bias is applied, a few electrons are trapped at some sites outside these paths by tunneling which may be assisted by electron-lattice/electron-electron interaction. These sites have isolated electron states that do not directly contribute to conductivity, but the trapped electrons on such sites will increase the energy of the nearby SRO/LNO sites due to the electrostatic interaction energy, i.e., as if they act as an isolated floating gate that prevents the electron passing through the nearby region (channel). As a result, the originally aligned energy levels of the SRO/LNO sites become spread out, now with a characteristic distribution width (W). If W is larger than B, the electron wave function at each site becomes localized as in the case of Anderson localization in amorphous solids. The electron then need to hop from the localized state on one site to the localized state on another and the metallic conduction is changed to VRH, which is characteristic of the HR state. Under a large enough negative bias these trapped electrons could be released from the trapping sites, which lowers the energy level dispersion W and recovers the metallic property when W<B.

Without being bound by any theory of operation, for trapping, electrons have to overcome an energy barrier on the way to tunnel or hop into some isolated sites. In our system, this energy barrier could be set by the energy level difference between the conducting band of La 5d in LAO (5.6 eV above the O 2p valence band) and Zr 4d in CZO (5.5 eV above the O 2p valence band) and Ru/Ni 4d/3d band in SRO/LNO, which is around 3 eV above the O 2p valence band. This barrier height (~2.6 eV) determines the switching voltage. Once the electrons overcome this barrier, they are trapped at the broken paths isolated from both the top and bottom electrodes. These isolated paths with trapped electrons work like a floating gate that regulates the conduction on the (surrounding) remaining metallic paths. Meanwhile, the trapped electrons are isolated from the electrodes by the LAO/CZO insulator barriers (2.6 eV), which makes it difficult for them to leak out, thus providing the non-volatile character of the memory effect.

5. Further Experiments to Verify the Switching Mechanism

The following experiments were carried out to further understand the switching mechanism of the memory effect.

Figure 39:
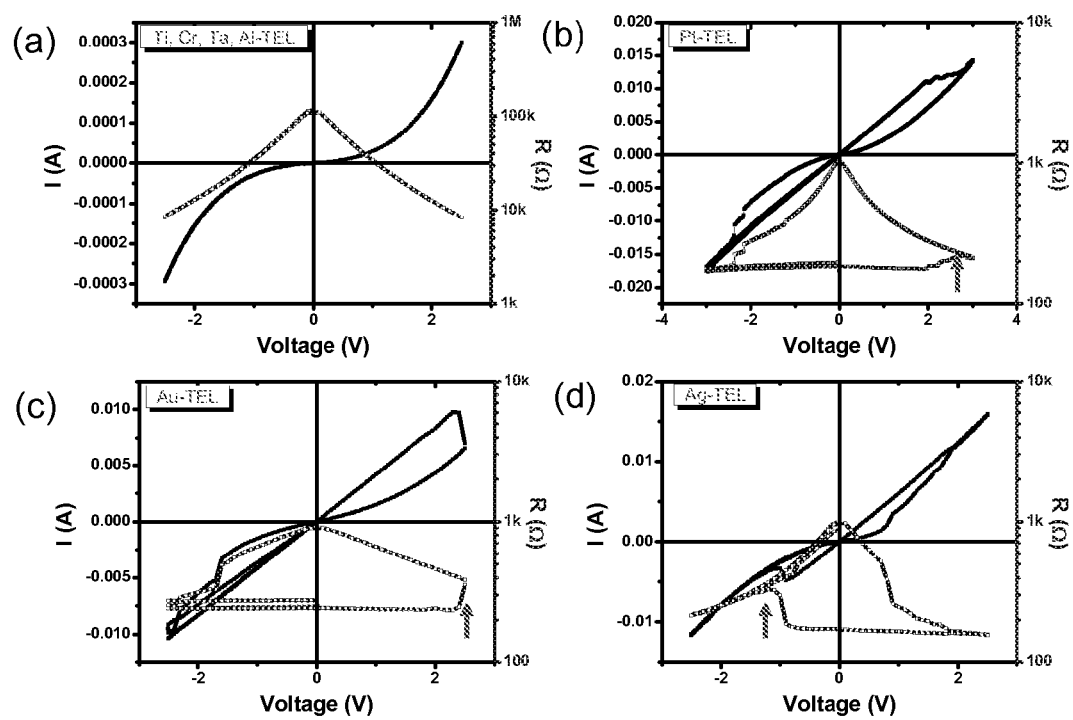
FIG. 39 I-V (R-V) curves of LNO-LAO/SRO heterostructure with different top electrodes, (a) Ti, Cr, Ta and Al, all nonlinear and nonswitching; (b) Pt; (c) Au and (d) Ag. Arrow indicates set-position.

5.1 Electronic Structure Study of the Mixture Film, and the Effect of Top Electrode Ohmic contacts were formed between mixture layers and Pt/SRO top/bottom electrode. This enables us to study the intrinsic mixture properties without considering the contact issues. Various top electrodes were used in an attempt to understand the effect of the work function of the top electrode. If a one-side Schottky contact is to form between the mixture layer and a metal with a different work function it could indicate a space charge layer at such electrode. This was not found to be the case. Some top electrodes, notably ones that are easy to oxidize, caused the I-V curve to become nonlinear (FIG. 39a), but the curve was still symmetric indicating that the non-linearity was due to a thin insulating layer across which tunneling is required for electrical conduction. In other cases, linear I-V curves were obtained in the as-fabricated state, which is of the LR character. This LR state can be subsequently switched to the HR state, as shown in FIG. 39b-d. As with Pt top electrode, the voltage bias was positive when the LR-to-HR switching occurred, and negative when the HR-to-LR switching occurred, if the top electrode is Au (which, like Pt, has a work function—5.1 eV—that is higher than that of the bottom electrode SRO, 5.0 eV). On the other hand, the polarity of switching was reversed in the case of Ag top electrode, which has a work function of 4.26 eV, lower than that of SRO. These results suggest that there is no interfacial depletion layer in these devices, the switching phenomenon occurs inside the mixture layer and not at the interface, and that the polarity of the switching voltage can be controlled by the work function of the electrodes.

To improve the adhesion between noble metal top electrodes and oxide films, a transitional "layer" of Cr that formed islands and anchors on the oxide surface was used. Because it does not fully cover the oxide surface, the noble metal top electrode could still contact the oxide, and this transitional "layer" had no effect on the resistance switching behavior of the oxide films. This was evidenced by the same switching characteristics when Pt was used as the top electrode, no matter whether this transitional Cr "layer" was used or not. When the Cr layer was sufficiently thick to fully cover the oxide surface, a nonlinear I-V curve was observed indicating that an insulating oxide (of Cr) layer had formed.

5.2 UV Irradiation

Without being bound by any theory of operation, the proposed switching mechanism envisions a conductor with its local energy level regulated by electron trapping and release. When the electrons are trapped at some localized sites nearby which raise the surrounding energy levels, the film is switched to a higher resistance state. Another possible switching mechanism is electrical-field-induced ion migration, which forms locally conducting filaments. In the literature, other highly resistive oxides have been known to form these filaments. However, all such reports found the as-fabricated material/device to be in the initially insulating state, and the filaments formed as a result of dielectric breakdown. The filament may later undergo soft breakdown/reform repeatedly with voltage cycles, which could induce ion migration. This switching mechanism is ionic in nature and it should be a relatively slow process. Such a scenario seems unlikely in our case since the initial state of our device is already of very low resistance. However, it is also desirable to eliminate ion migration as a switching mechanism in the devices described herein.

Figure 40:
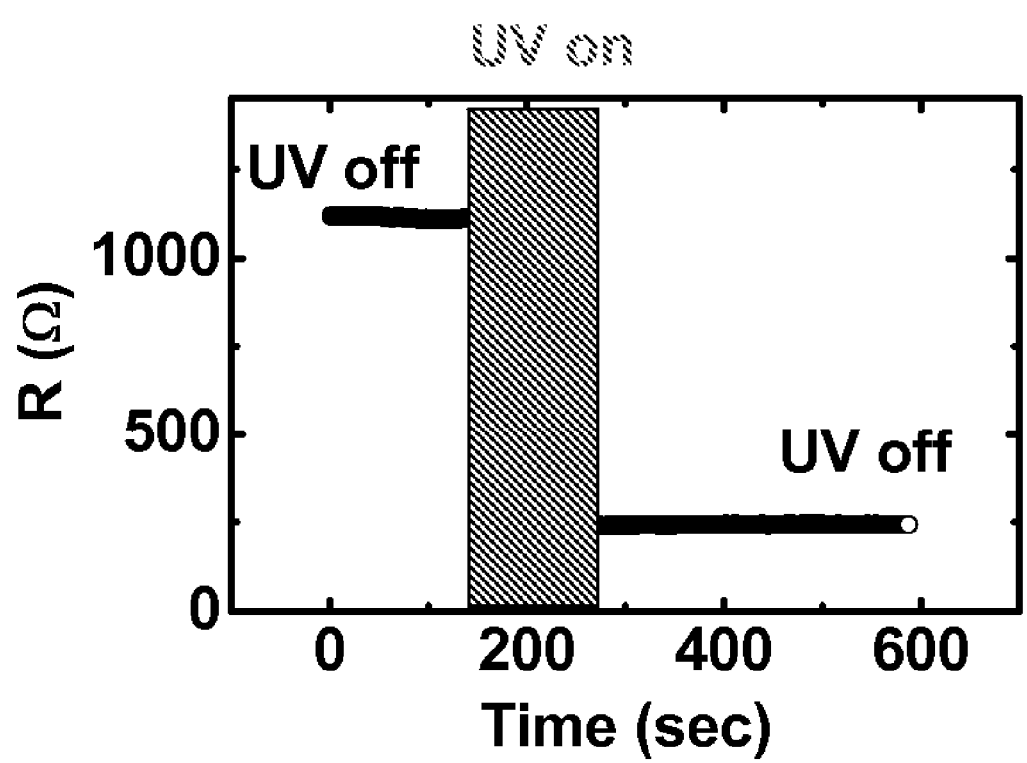
FIG. 40 UV irradiation effect on $R_H$ state.

The trapped electrons could be removed by other means than the electric field used in the switching measurements. UV light with a sufficient energy could release electrons from the trapped state, or cause a flood of electrons and holes (a photoelectric effect) so that the trapped electrons recombine with the holes. To test this possibility, we used a UV light with an energy range from 2.5 to 3.5 eV to irradiate the cells that have been preset to either HR or LR state. In all cases, we found the LR state to be always stable. In the case of HR state, it is stable if the cell is not connected through a short circuit or a low resistance measurement circuit between the top and bottom electrode. But once such a circuit is provided, the high resistance decreases shortly after UV irradiation regardless of whether a very small bias of either positive or negative nature is applied or not (FIG. 40). This indicates that when the excess photoelectrons are allowed to be redistributed between the top and bottom electrodes, the excess holes remaining in the mixture layer are able to recombine with the trapped electrons. It also ruled out ionic migration as a possible switching mechanism.

In the above experiment, the UV was irradiated from the bottom side through the transparent (single crystal $SrTiO_3$) substrate to penetrate the relatively thin, and less absorbing bottom electrode SRO.

5.3 Effect of Film Orientation and Strain

Figure 41:
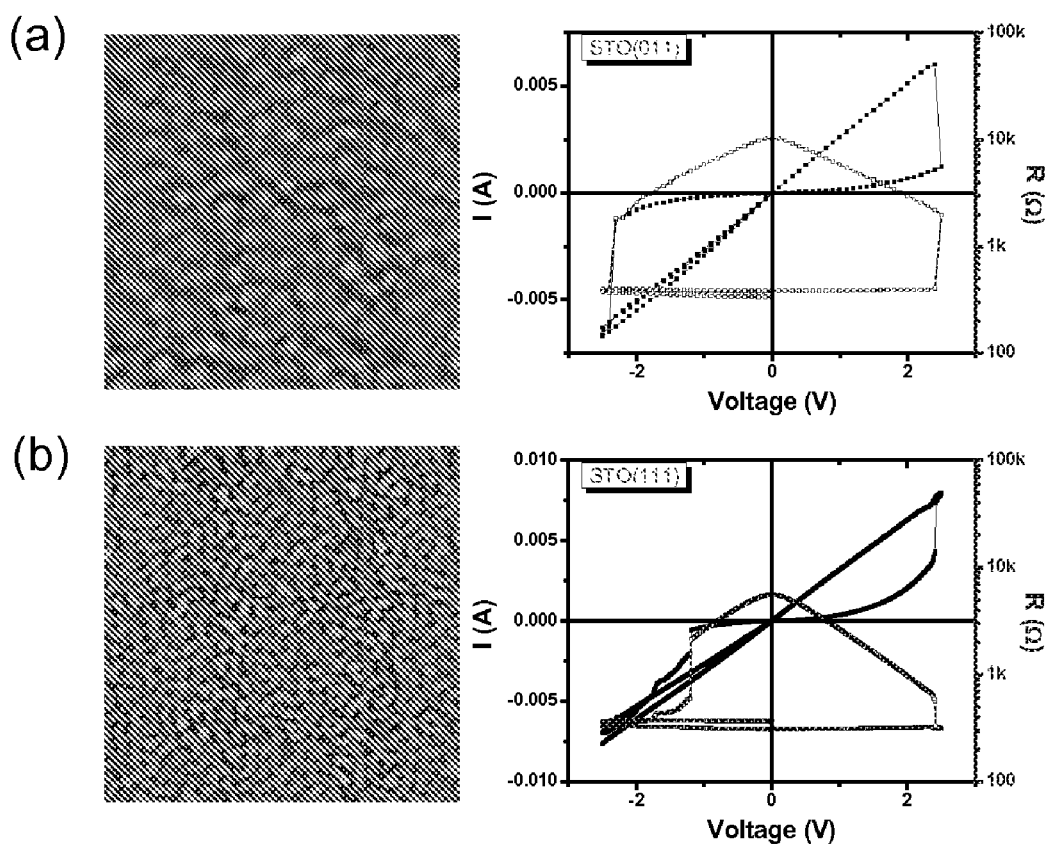
FIG. 41 AFM images and I-V (R-V) curves of LNO-LAO/SRO heterostructure with different STO substrate orientation, (a) STO (011); (b) STO (111).

To ascertain that the observed switching behavior is an intrinsic material phenomenon sensitive to the material pair and not to other artifacts such as film strain and film orientation, we have investigated films deposited on (STO) substrates of different orientations so that the epitaxial films consisting of the SRO bottom electrode and the mixture layer may also assume different orientations. In these studies, Pt top electrode was again used. It is known that different orientations will incur different misfit strain, and it is even possible that STO crystal in certain orientations that have a higher surface energy, such as (110) and (111), may cause the (bottom electrode and the mixture layer) film to grow in island mode with almost fully relaxed structure and little strain. As shown in FIG. 41, in both cases, we have found that the switching characteristics, including the linear I-V curve of the LR state, the as-fabricated state being the LR state, the positive bias required to switch from LR to HR state, and the magnitude of the switching voltage and switching ratio, to be rather similar to that of "standard" films grown on the (100) substrate with the SRO bottom electrode and Pt top electrode. This indicates that the film orientations and possibly film strain have no effect on the switching behavior. It also provides further evidence that switching is an electronic phenomenon that occurs in the inside of the mixture layer biased by the electrode's work function, and is not sensitive to the interface between the mixture layer and the electrode.

5.4 AC Impedance

Figure 42:
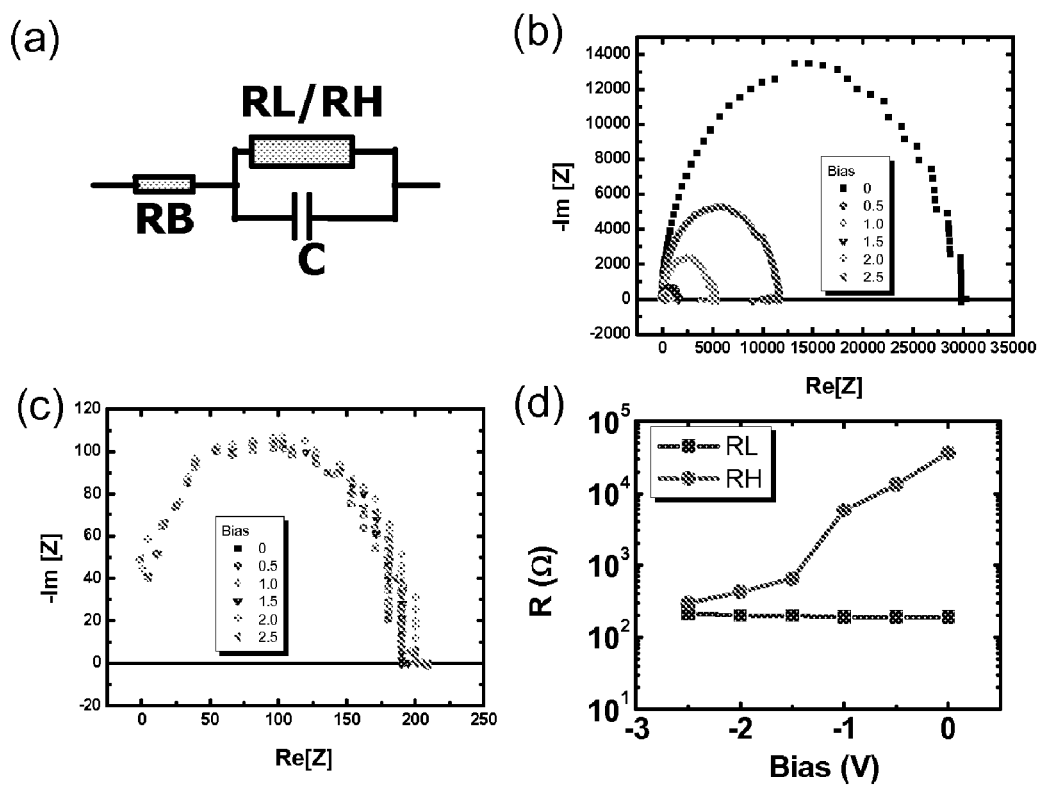
FIG. 42 (a) Equivalent circuit of memory cell, RB represents impedance from the bottom electrode; Cole-Cole plots of high resistance (b) and low resistance (c) states, (d) Resistance change as a function of bias of LNO-LAO/SRO heterostructure.

To further characterize the electronic states of the device, AC impedance measurements were performed that may lead to estimates of resistance and capacitance. The measured AC impedance, after subtracting the line and bottom electrode impedance which have an inductive component, can be fit with the model of a resistance and a capacitor connected in parallel, see FIG. 42. This resistance indeed undergoes switching, as shown for the negative bias in FIG. 42(d), from HR to LR, but the capacitance remains relatively little changed, having a value of about 0.1 nF. This capacitance can be interpreted as due to a parallel plate capacitor filled with an insulating material of a dielectric constant of 45, which is reasonable for the insulator material (LAO) used in the mixture layer in the experiment. Therefore, at a device level, the device may be approximately modeled as a parallel arrangement of a variable (switchable) resistance and a constant capacitance.

Certain aspects of the present invention having been disclosed in connection with the foregoing variations and examples, additional variations will now be apparent to persons skilled in the art. The invention is not intended to be limited to the variations and examples specifically mentioned or presently preferred, and accordingly reference should be made to the appended claims to assess the spirit and scope of the invention in which exclusive rights are claimed.

What is claimed:

1. A thin film, comprising one or more oxide layers each comprising a conducting oxide dopant and an insulating oxide material, the total thickness of the one or more oxide layers being at least about 6 nm, the one or more oxide layers being selected from the following table:

| Oxide Layer Type, Thickness (nm) | Conducting Oxide Dopant | Molar % Conducting Oxide Dopant | Insulating Oxide Material | Molar % Insulating Oxide Material |
|---|---|---|---|---|
| SRO-CZO, up to about 30 nm | $SrRuO_3$ | from about 3 to about 10 molar % | $CaZrO_3$ | from about 90 to about 97 molar % |
| LNO-CZO, up to about 40 nm | $LaNiO_3$ | from about 10 to about 40 molar % | $CaZrO_3$ | from about 60 to about 90 molar % |
| SRO-LAO, up to about 40 nm | $SrRuO_3$ | from about 6 to about 13 molar % | $LaAlO_3$ | from about 87 to about 94 molar % |
| LNO-LAO, up to about 40 nm. | $LaNiO_3$ | from about 6 to about 13 molar % | $LaAlO_3$ | from about 87 to about 94 molar %. |

2. The thin film of claim 1, wherein each of the oxide layers is characterized as being a solid solution of the insulating oxide material and the conducting oxide dopant.

3. The thin film of claim 1, further comprising one or more isolation layers surmounting at least a portion of the oxide layer, the one or more isolation layers being selected from the following table:

| Isolation Layer Type, Thickness (nm) | Conducting Oxide Dopant | Molar % Conducting Oxide Dopant | Insulating Oxide Material | Molar % Insulating Oxide Material |
|---|---|---|---|---|
| SRO-CZO, up to about 10 nm | SrRuO$_3$ | from 0 to about 7 molar % | CaZrO$_3$ | from about 93 to 100 molar % |
| LNO-CZO, up to about 10 nm | LaNiO$_3$ | from 0 to about 25 molar % | CaZrO$_3$ | from about 75 to 100 molar % |
| SRO-LAO, up to about 10 nm | SrRuO$_3$ | from 0 to about 10 molar % | LaAlO$_3$ | from about 90 to 100 molar % |
| LNO-LAO, up to about 10 nm | LaNiO$_3$ | from 0 to about 10 molar % | LaAlO$_3$ | from about 90 to 100 molar %. |

4. The thin film of claim 3, wherein the molar % of the conducting oxide dopant in at least one of the isolation layers is less than the molar % of the conducting oxide dopant in the oxide layer.

5. The thin film of claim 1, wherein the oxide layer is characterized as comprising metallic islands of SrRuO$_3$, LaNiO$_3$, or both.

6. The thin film of claim 1, whereupon subjecting the thin film to a positive electrical bias, a negative electrical bias, or both, gives rise to the thin film being characterized as having a switchable resistance.

7. A switchable-resistance thin film device, comprising:
at least one first electrode;
one or more resistance-switching oxide layers, the total thickness of the one or more resistance-switching oxide layers being at least about 6 nm, at least one of the resistance-switching oxide layers situated adjacent to the first electrode, wherein each of the resistance switching oxide layers comprises a conducting oxide dopant and an insulating oxide material selected from the following table:

10. The switchable-resistance thin film device of claim 7, wherein the electrodes comprise at least one conducting oxide material, Pt, Pd, Ni, Au, Ag, Cu, Ir, Rh, Co, Os, Ru, Fe, Re, Mn, W, Mo, Cr, Ta, Nb, V, Hf, Zr, Ti, Al, doped Si, at least one conducting silicide, conducting metal nitride, conducting metal carbide, conducting metal boride, or any combination thereof.

11. The switchable-resistance thin film device of claim 10, wherein the conducting oxide material comprises SrRuO$_3$, LaNiO$_3$, CaRuO$_3$, BaRuO$_3$, PrNiO$_3$, NdPrO$_3$, PmNiO$_3$, SmNiO$_3$, or any combination thereof.

12. The switchable-resistance thin film device of claim 10, wherein the insulating oxide material comprises CaZrO$_3$, SrZrO$_3$, BaZrO$_3$, CaHfO$_3$, SrHfO$_3$, BaHfO$_3$, LaAlO$_3$, PrAlO$_3$, NdAlO$_3$, PmAlO$_3$, SmAlO$_3$, EuAlO$_3$, GdAlO$_3$, TbAlO$_3$, DyAlO$_3$, HoAlO$_3$, ErAlO$_3$, TmAlO$_3$, YbAlO$_3$, LuAlO$_3$, YAlO$_3$, or any combination thereof.

13. The switchable-resistance thin film device of claim 7, wherein the first electrode, the second electrode, or both, are epitaxial with the resistance-switching oxide layer.

| Resistance-Switching Oxide Layer Type, Thickness (nm) | Conducting Oxide Dopant | Molar % Conducting Oxide Dopant | Insulating Oxide Material | Molar % Insulating Oxide Material |
|---|---|---|---|---|
| SRO-CZO up to about 30 nm | SrRuO$_3$ | from about 3 to about 10 molar % | CaZrO$_3$ | from about 90 to about 97 molar % |
| LNO-CZO up to about 40 nm | LaNiO$_3$ | from about 10 to about 40 molar % | CaZrO$_3$ | from about 60 to about 90 molar % |
| SRO-LAO up to about 40 nm | SrRuO$_3$ | from about 6 to about 13 molar % | LaAlO$_3$ | from about 87 to about 94 molar % |
| LNO-LAO up to about 40 nm. | LaNiO$_3$ | from about 6 to about 13 molar % | LaAlO$_3$ | from about 87 to about 94 molar % | and at least one second electrode situated adjacent to at least one of the resistance-switching oxide layers, wherein at least a portion of each of the resistance-switching oxide layers is situated between at least a portion of the first electrode and at least a portion of the second electrode.

8. The switchable-resistance thin film device of claim 7, wherein each of the resistance-switching oxide layers is characterized as being a solid solution of the insulating oxide material and the conducting oxide dopant.

9. The switchable-resistance thin film device of claim 7, wherein at least one first electrode, at least one second electrode, or any combination thereof, are characterized as being a thin film.

14. The switchable-resistance thin film device of claim 9, wherein at least one thin film electrode is situated adjacent to a substrate.

15. The switchable-resistance thin film device of claim 14, wherein the substrate comprises SrTiO$_3$.

16. The switchable-resistance thin film device of claim 7, wherein the substrate and first electrode are epitaxial.

17. A switchable-resistance thin film device, comprising:
one or more resistance-switching oxide layers each comprising a conducting oxide dopant and an insulating oxide material, the total thickness of the one or more resistance-switching oxide layers being at least about 6 nm, wherein each of the resistance-switching oxide layers is selected from the following table:

| Resistance-Switching Oxide Layer Type, Thickness (nm) | Conducting Oxide Dopant | Molar % Conducting Oxide Dopant | Insulating Oxide Material | Molar % Insulating Oxide Material |
|---|---|---|---|---|
| SRO-CZO, up to about 30 nm | $SrRuO_3$ | from about 3 to about 10 molar % | $CaZrO_3$ | from about 90 to about 97 molar % |
| LNO-CZO, up to about 40 nm | $LaNiO_3$ | from about 10 to about 40 molar % | $CaZrO_3$ | from about 60 to about 90 molar % |
| SRO-LAO, up to about 40 nm | $SrRuO_3$ | from about 6 to about 13 molar % | $LaAlO_3$ | from about 87 to about 94 molar % |
| LNO-LAO, up to about 40 nm. | $LaNiO_3$ | from about 6 to about 13 molar % | $LaAlO_3$ | from about 87 to about 94 molar % | at least one isolation layer situated adjacent to at least a portion of one of the resistance-switching oxide layers, the at least one isolation layer being selected from the following table:

| Isolation Layer Type, Thickness (nm) | Conducting Oxide Dopant | Molar % Conducting Oxide Dopant | Insulating Oxide Material | Molar % Insulating Oxide Material |
|---|---|---|---|---|
| SRO-CZO, up to about 10 nm | $SrRuO_3$ | from 0 to about 7 molar % | $CaZrO_3$ | from about 93 to 100 molar % |
| LNO-CZO, up to about 10 nm | $LaNiO_3$ | from 0 to about 25 molar % | $CaZrO_3$ | from about 75 to 100 molar % |
| SRO-LAO, up to about 10 nm | $SrRuO_3$ | from 0 to about 10 molar % | $LaAlO_3$ | from about 90 to 100 molar % |
| LNO-LAO, up to about 10 nm. | $LaNiO_3$ | from 0 to about 10 molar % | $LaAlO_3$ | from about 90 to 100 molar % |

; and
at least one first electrode being situated adjacent to at least one isolation layer, and at least one second electrode being situated adjacent to at least one resistance-switching oxide layer, to a second isolation layer, or both.

18. The switchable-resistance thin film device of claim 17, wherein each of the switchable-resistance oxide layers is characterized as being a solid solution of the insulating oxide material and the conducting oxide dopant.

19. The switchable-resistance thin film device of claim 17, wherein one resistance-switching oxide layer is situated adjacent on one side to a first isolation layer and situated adjacent on a second side to a second isolation layer, wherein the first isolation layer is situated adjacent to a first electrode, and the second isolation layer is situated adjacent to a second electrode.

20. The switchable-resistance thin film device of claim 17, wherein the at least one first electrode, the at least one second electrode, or any combination thereof, are characterized as being a thin film.

21. The switchable-resistance thin film device of claim 17, wherein at least one of the electrodes comprise at least one conducting oxide material, Pt, Pd, Ni, Au, Ag, Cu, Ir, Rh, Co, Os, Ru, Fe, Re, Mn, W, Mo, Cr, Ta, Nb, V, Hf, Zr, Ti, Al, doped Si, at least one conducting silicide, conducting metal nitride, conducting metal carbide, conducting metal boride, or any combination thereof.

22. The switchable-resistance thin film device of claim 21, wherein the conducting oxide material comprises $SrRuO_3$, $LaNiO_3$, $CaRuO_3$, $BaRuO_3$, $PrNiO_3$, $NdPrO_3$, $PmNiO_3$, $SmNiO_3$, or any combination thereof.

23. The switchable-resistance thin film device of claim 10, wherein the insulating oxide material comprises $CaZrO_3$, $SrZrO_3$, $BaZrO_3$, $CaHfO_3$, $SrHfO_3$, $BaHfO_3$, $LaAlO_3$, $PrAlO_3$, $NdAlO_3$, $PmAlO_3$, $SmAlO_3$, $EuAlO_3$, $GdAlO_3$, $TbAlO_3$, $DyAlO_3$, $HoAlO_3$, $ErAlO_3$, $TmAlO_3$, $YbAlO_3$, $LuAlO_3$, $YAlO_3$, or any combination thereof.

24. The switchable-resistance thin film device of claim 17, wherein the at least one first electrode, the at least one second electrode, or any combination thereof, are epitaxial with the resistance-switching oxide layer.

25. The switchable-resistance thin film device of claim 20, wherein at least one thin film electrode is situated adjacent to a substrate.

26. The switchable-resistance thin film device of claim 25, wherein the substrate comprises $SrTiO_3$.

27. The switchable-resistance thin film device of claim 25, wherein the substrate and first electrode are substantially epitaxial.

* * * * *